(12) United States Patent
Brisebois

(10) Patent No.: US 10,969,144 B2
(45) Date of Patent: Apr. 6, 2021

(54) THIN MULTI-CHANNEL HEAT EXCHANGER

(71) Applicant: Art Brisebois, Cumming, GA (US)

(72) Inventor: Art Brisebois, Cumming, GA (US)

(*) Notice: Subject to any disclaimer, the term of this patent is extended or adjusted under 35 U.S.C. 154(b) by 91 days.

(21) Appl. No.: 15/914,636

(22) Filed: Mar. 7, 2018

(65) Prior Publication Data
US 2019/0056147 A1 Feb. 21, 2019

Related U.S. Application Data

(60) Provisional application No. 62/546,286, filed on Aug. 16, 2017.

(51) Int. Cl.
*F24S 10/50* (2018.01)
*B23P 15/26* (2006.01)
(Continued)

(52) U.S. Cl.
CPC ............. *F24S 10/502* (2018.05); *B23P 15/26* (2013.01); *F24S 10/30* (2018.05); *F24S 10/80* (2018.05); *F24S 20/02* (2018.05); *F24S 20/20* (2018.05); *F24S 20/64* (2018.05); *F24S 20/66* (2018.05); *F24S 20/67* (2018.05); *F24S 40/60* (2018.05); *F24S 50/00* (2018.05); *F24S 70/30* (2018.05); *F24S 80/10* (2018.05); *F24S 80/30* (2018.05); *F24S 80/453* (2018.05); *F24S 90/00* (2018.05); *F25B 39/04* (2013.01); *F28D 20/0034* (2013.01); *F28D 21/0001* (2013.01); *F28D 21/0003* (2013.01); *F28D 21/0005* (2013.01); *F28F 3/12* (2013.01); *G06F 1/20* (2013.01); *H01L 35/30* (2013.01); *H02S 40/44* (2014.12); *F25B 2339/047* (2013.01); *F28D 2020/006* (2013.01); *F28D 2021/0043* (2013.01);
(Continued)

(58) Field of Classification Search
CPC .......... F24S 10/502; F24S 20/02; F24S 20/67; H01L 35/30; F28F 3/12; G06F 1/20; G06F 2200/201; F25B 39/04; F25B 2239/047; B23P 15/26
See application file for complete search history.

(56) References Cited

U.S. PATENT DOCUMENTS

| 4,203,421 A * | 5/1980 | Bencic ................. F24S 10/504 126/646 |
| 4,426,999 A * | 1/1984 | Evans .................... F24S 80/30 126/669 |

(Continued)

*Primary Examiner* — David J Laux
(74) *Attorney, Agent, or Firm* — Lee & Hayes, P.C.

(57) ABSTRACT

Technologies are disclosed herein for a thin heat exchanger through which coolant may be pumped. The heat exchanger may include an envelope and a heat conduction layer provided over the envelope. The envelope may include one or more channels formed therein. The channels formed between the envelope and the conduction layer may extend the length of the heat exchange layer and be configured to carry coolant therethrough. The heat exchange layer may include an inlet manifold on a first end and an outlet manifold on another end opposing the first end. The inlet manifold may allow the flow of coolant into the heat exchange layer and the outlet manifold may allow the removal of the coolant from the heat exchange layer. Coolant flow may be controlled by a suction pump operating under computer control based at least in part on sensor data.

20 Claims, 66 Drawing Sheets

(51) Int. Cl.
    *F24S 80/453*     (2018.01)
    *F24S 70/30*     (2018.01)
    *F28D 21/00*     (2006.01)
    *H01L 35/30*     (2006.01)
    *F24S 90/00*     (2018.01)
    *F28F 3/12*     (2006.01)
    *F24S 20/66*     (2018.01)
    *G06F 1/20*     (2006.01)
    *F24S 40/60*     (2018.01)
    *F28D 20/00*     (2006.01)
    *F24S 10/30*     (2018.01)
    *F25B 39/04*     (2006.01)
    *F24S 20/64*     (2018.01)
    *F24S 20/00*     (2018.01)
    *F24S 20/67*     (2018.01)
    *F24S 80/30*     (2018.01)
    *F24S 20/20*     (2018.01)
    *F24S 50/00*     (2018.01)
    *H02S 40/44*     (2014.01)
    *F24S 80/10*     (2018.01)
    *F24S 10/80*     (2018.01)
    *H01M 10/6554*     (2014.01)
    *H01M 10/613*     (2014.01)
    *H01M 10/6557*     (2014.01)
    *H01M 10/6556*     (2014.01)
    *H01M 10/625*     (2014.01)
    *H01M 10/6555*     (2014.01)
    *H01M 10/643*     (2014.01)
    *H01M 10/6567*     (2014.01)

(52) U.S. Cl.
    CPC ...... *G06F 2200/201* (2013.01); *H01M 10/613* (2015.04); *H01M 10/625* (2015.04); *H01M 10/643* (2015.04); *H01M 10/6554* (2015.04); *H01M 10/6555* (2015.04); *H01M 10/6556* (2015.04); *H01M 10/6557* (2015.04); *H01M 10/6567* (2015.04); *H01M 2220/20* (2013.01)

(56) References Cited

U.S. PATENT DOCUMENTS

| | | | | |
|---|---|---|---|---|
| 4,483,325 | A * | 11/1984 | Siemiller | F24S 10/60 |
| | | | | 126/652 |
| 5,522,944 | A * | 6/1996 | Elazari | H02S 20/23 |
| | | | | 136/248 |
| 7,610,911 | B2 * | 11/2009 | Neumann | F24S 70/12 |
| | | | | 126/622 |
| 9,647,300 | B2 * | 5/2017 | Thramann | B60L 53/63 |
| 9,683,756 | B2 * | 6/2017 | Barmore | F24D 3/125 |
| 2010/0180885 | A1 * | 7/2010 | Lee | F24S 90/00 |
| | | | | 126/587 |
| 2012/0060898 | A1 * | 3/2012 | Ahlgren | H01L 31/042 |
| | | | | 136/248 |
| 2012/0175094 | A1 * | 7/2012 | Rice | F28D 1/03 |
| | | | | 165/170 |
| 2015/0280040 | A1 * | 10/2015 | Siddiqui | H02S 40/425 |
| | | | | 136/246 |
| 2015/0377515 | A1 * | 12/2015 | Russell | F24S 80/30 |
| | | | | 126/646 |
| 2016/0161152 | A1 * | 6/2016 | Solomon | F24S 10/50 |
| | | | | 126/643 |
| 2017/0130969 | A1 * | 5/2017 | Lester | F28F 1/022 |

* cited by examiner

Prototype collection statistics sample

Collected ~1 BTU per hour / square inch over 104 minutes interval

Solar radiation is ~2.2 BTU per hour / square inch

Efficiency estimate ~45%

FIG. 23

THIN MULTI-CHANNEL HEAT EXCHANGER

CROSS-REFERENCE TO RELATED CASES

This application claims priority to U.S. provisional patent application No. 62/546,286 filed Aug. 16, 2017 titled "Thin Multi-Channel Heat Exchanger," the contents of which is incorporated herein by reference in its entirety.

BACKGROUND

Thermal energy is a needed and available, yet typically wasted, form of energy. For example, space and water heating account for >70% of home energy costs and cooling (e.g., air conditioning) accounts for >40% of industrial data center energy costs.

In some cases, such as refrigeration, energy is expended removing heat from one area, while at the same time, energy is expended to add heat to a nearby area, such as within a hot water tank. In other cases, waste heat from one surface of a building (e.g., roof exterior) is vented to the atmosphere, while fossil fuels are burned to add heat to the interior of the same building. In still other cases, energy is expended to cool a home in the afternoon while even more energy is used to heat the home and hot water tank the next morning.

These traditional heat transfer methods have limited efficiency and use for a number of reasons. Efficiency is limited because heat transfer efficiency (e.g., electricity flow) is inversely proportional to the distance heat will travel to get from the source (e.g., warm place) to the destination (e.g., cold place). In traditional radiator and collector cases, the heat will travel over many inches of metal to get to or from the water. This may lead to significant heat transfer losses that limit collection or radiation efficiency. Additionally, these traditional heat transfer methods require relatively heavy and expensive materials, such as metals, to collect heat and contain relatively large volumes of coolant (e.g., water) under pressure. To compensate for the aforementioned heat transfer inefficiency of metal fins and pipes, traditional systems need to maximize convection heat transfer. For water systems, such as systems where heat is transferred to or from water, this may be accomplished by pumping relatively large volumes of water at higher pressures through the system, and thus requiring bulkier systems with robust construction.

Higher pumping pressures and volumes require heavier pipes to withstand the greater pressures and more electrical power to operate the pumps, thereby increasing cost, weight, and size, while reducing efficiency. Additionally, any defects in traditional heat transfer apparatus may result in coolant leaks. For air systems, including systems where water-borne heat is transferred to air, convection is enabled by fans blowing air over heated metal fins and pipes. The associated fans and ducting result in greater electrical power demand, higher cost, greater weight and size, increased noise, and reduced efficiency.

Another side effect of relatively low heat transfer efficiency is heat loss to destinations other than the intended one. Heat typically travels in multiple directions at a rate directly proportional to temperature difference and heat transfer efficiency (i.e., conductivity) of each potential path. More heat will travel to the coldest destination with the highest heat conductivity path. For traditional solar hot water collectors, some solar heat will travel over the collector fins to collector pipes and water, and some heat will be dissipated to the surrounding air. The ratio of useful heat transferred to the water versus wasted heat dissipated to the surrounded air may be directly proportional to the heat conductivity of the solar collector to water, volume of water flow (i.e., convection) and ambient temperature of the surrounding air.

The ratio of useful heat transferred to coolant, such as water, versus wasted heat dissipated to the surrounded air may be inversely proportional to the heat conductivity of the solar collector to outside air, volume of air flow (i.e., wind speed) and temperature of the water circulated in the panel. On cold winter days, when heat collection is needed most, more solar heat is dissipated to the surrounding air versus collected by the circulating water. To offset this effect, traditional solar hot water collector panels add insulation between the collector elements and the outside air, thus reducing the heat conductivity of the collector to ambient air path.

It is with respect to these considerations and others that the disclosure made herein is provided.

SUMMARY

The technologies disclosed herein provide a thin heat exchanger for extracting thermal energy from various environments. In example embodiments, the thin heat exchanger uses suction, rather than pressurization to transport coolant, such as water through a heat collector or radiator envelope. In contrast to conventional heat exchangers, the pressure inside the thin heat exchanger envelope may be less than outside air or water pressure (e.g., ambient pressure). Since the heat exchanger, due to suction-based transport of coolant, does not need to contain a pressurized coolant, relatively lighter weight and thinner heat exchangers may be utilized. In some cases, the relatively thin and lightweight materials of the heat exchanger may conform with curved or non-flat surfaces from which heat may be extracted.

According to example embodiments, the thin heat exchanger may include a heat exchange layer. The heat exchange layer may include an envelope and a heat conduction layer provided over the envelope. The envelope may include one or more channels formed therein by the formation of one or more ridges in the envelope. The channels formed between the envelope and the conduction layer may extend the length of the heat exchange layer and be configured to carry coolant, such as water, therethrough. The heat exchange layer may include an inlet manifold on a first end and an outlet manifold on another end opposing the first end. The inlet manifold may allow the flow of coolant into the heat exchange layer and the outlet manifold may allow the removal of the coolant from the heat exchange layer.

According to example embodiments, the heat exchange layer may be constructed of a relatively high thermal conductivity material, such as a metal or ceramic material. The envelope may be constructed of flexible and/or relatively lower thermal conductivity materials, such as rubber.

In some example embodiments, the envelope may have mesh material, such as metal and/or wire mesh, disposed within the one or more channels and/or cavity formed between the heat conduction layer and the envelope layer of the heat exchange layer. In one example embodiment, the envelope may include ridges or walls on two edges, thereby forming a cavity between the envelope and the heat exchange layer over substantially the entirety of the surface area of the envelope. Within this single cavity of the heat exchange layer may be disposed mesh material, such as metal and/or wire mesh.

In some example embodiments, the flow of coolant through the heat exchange layer may be driven by a suction pump attached to the outlet manifold of the heat exchanger. According to example embodiments, the flow of coolant, and therefore the pump used to drive that flow, may be controlled using a computer having one or more processors. The computer may control the flow of coolant based at least in part on measurements from one or more sensors, such as thermometers, flow sensors, pressure sensors, or the like.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 23 is a chart of sensor read-outs for the prototype of the thin heat exchanger, according to example embodiments of the disclosure.

DETAILED DESCRIPTION

Figure 1:
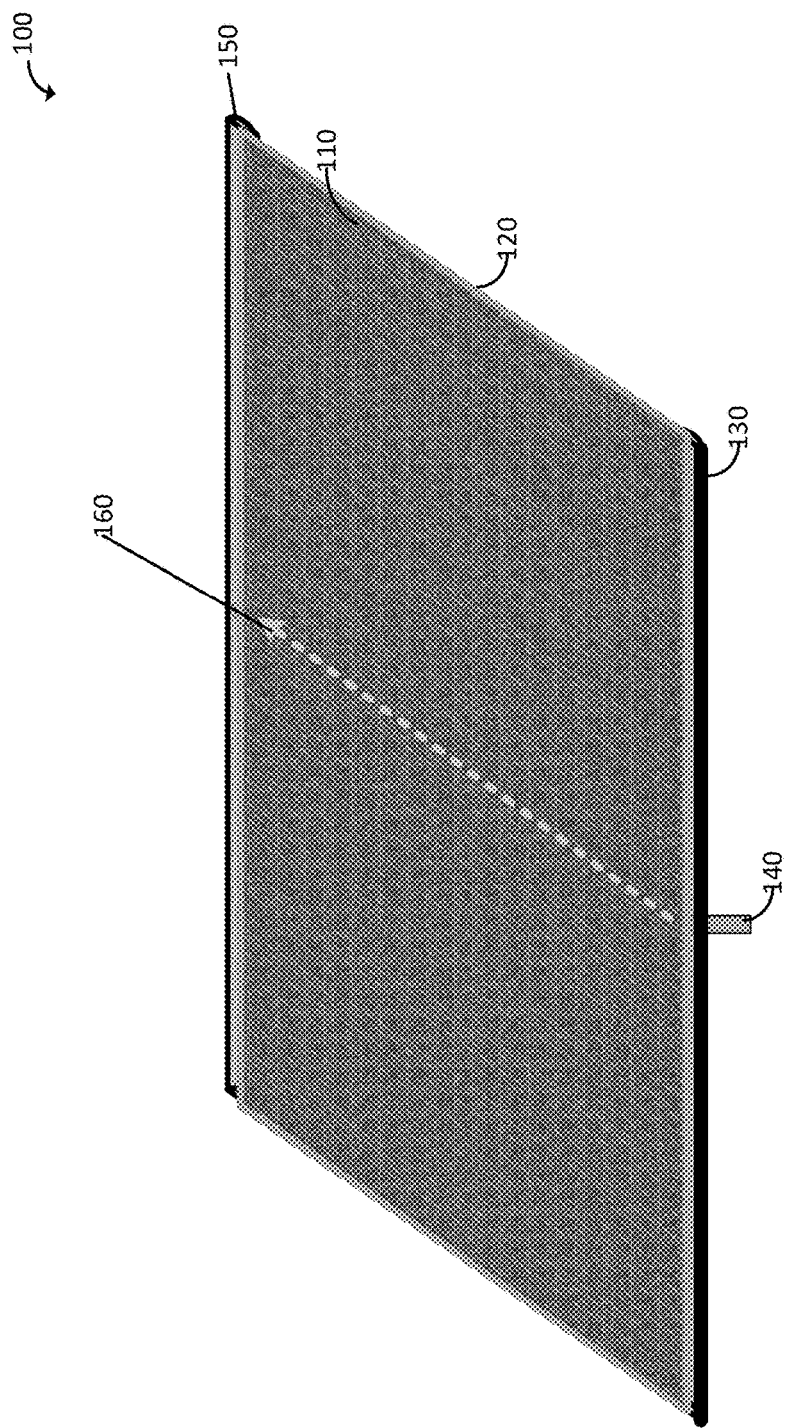
FIG. 1 is a schematic diagram showing a profile view of a thin multi-channel heat exchanger, according to example embodiments of the disclosure.

The following detailed description is directed to thermal energy collection using a coolant fluid (e.g., water) passed through a thin heat exchanger. In some example embodiments, the thermal energy harvesting, as described herein, may be combined with other mechanism for energy harvesting, such as, for example, solar photovoltaic energy harvesting. In some further example embodiments, the thermal energy harvesting may be from a variety of every-day appliances, structures, and/or scenarios from which heat would otherwise be wasted and/or not collected with the efficiencies as described herein. In still further example embodiments, the operations of the heat exchanger, as described herein, may be controlled by a computer, and based at least in part on various sensor readings.

According to example embodiments, a heat exchanger may include a heat exchange layer with an inlet manifold on one side, and an outlet manifold on another side. The inlet manifold may allow coolant, such as water to flow into the heat exchange layer. The coolant may flow through the heat exchange layer, and out through the outlet manifold. The coolant may be supplied from and returned to a coolant reservoir or tank. The coolant may be pumped through the heat exchanger using a pump, such as a suction pump. Suction pumping may provide a benefit of allowing the use of more economical materials for the construct of the heat exchanger. Additionally, if there are any defects and/or small leaks in the heat exchanger, suction pumping, rather than pressurized pumping, may reduce and/or prevent coolant from leaking from the thin heat exchangers, as disclosed herein.

In some example embodiments, the heat exchanger may include an envelope and a top heat conduction layer. The envelope may include a plurality of ridges defining a plurality of channels between the ridges through which coolant may be transported, such as by suction pumping. The top heat conduction layer may be provided in contact with the ridges to fluidically isolate each of the channels from each other. In some cases, suction pumping, and the top heat conduction layer pull in resulting therefrom, may cause the top heat conduction layer to make a tighter and/or more conformal abutment with the ridges of the envelope. The envelope may also include end protrusions, or edge ridges that prevent coolant leaking from edges of the heat exchange layer.

The heat exchange layer may be relatively thin, resulting in relatively short heat conduction distances from the source of the heat to the coolant flow within the heat exchanger. With such short heat conduction distances, a larger portion of collected heat may be transferred to the water, resulting in greater heat collection efficiency, and less heat may be dissipated to the surrounding air, resulting in reduced heat loss. This combination of high heat collection efficiency and low heat loss may reduce and/or eliminate the need for insulated enclosures, transparent covers and their associated bulk, light attenuation, cost, and aesthetic impact. The use of thin heat exchange and envelope materials also allows for application on non-flat surfaces. Thin heat exchangers are, therefore, able to collect and radiate more heat per unit area, from a variety of shaped surfaces, over a larger area with much less bulk, cost, and aesthetic impact.

Thin heat exchanger has four primary components including heat exchange layer, envelope layer, inlet manifold and outlet manifold. Thin heat exchangers may also be connected to external components including pumps, valves, collection storage, sensor and control circuitry. These components and their functions will be described below.

Figure 2:
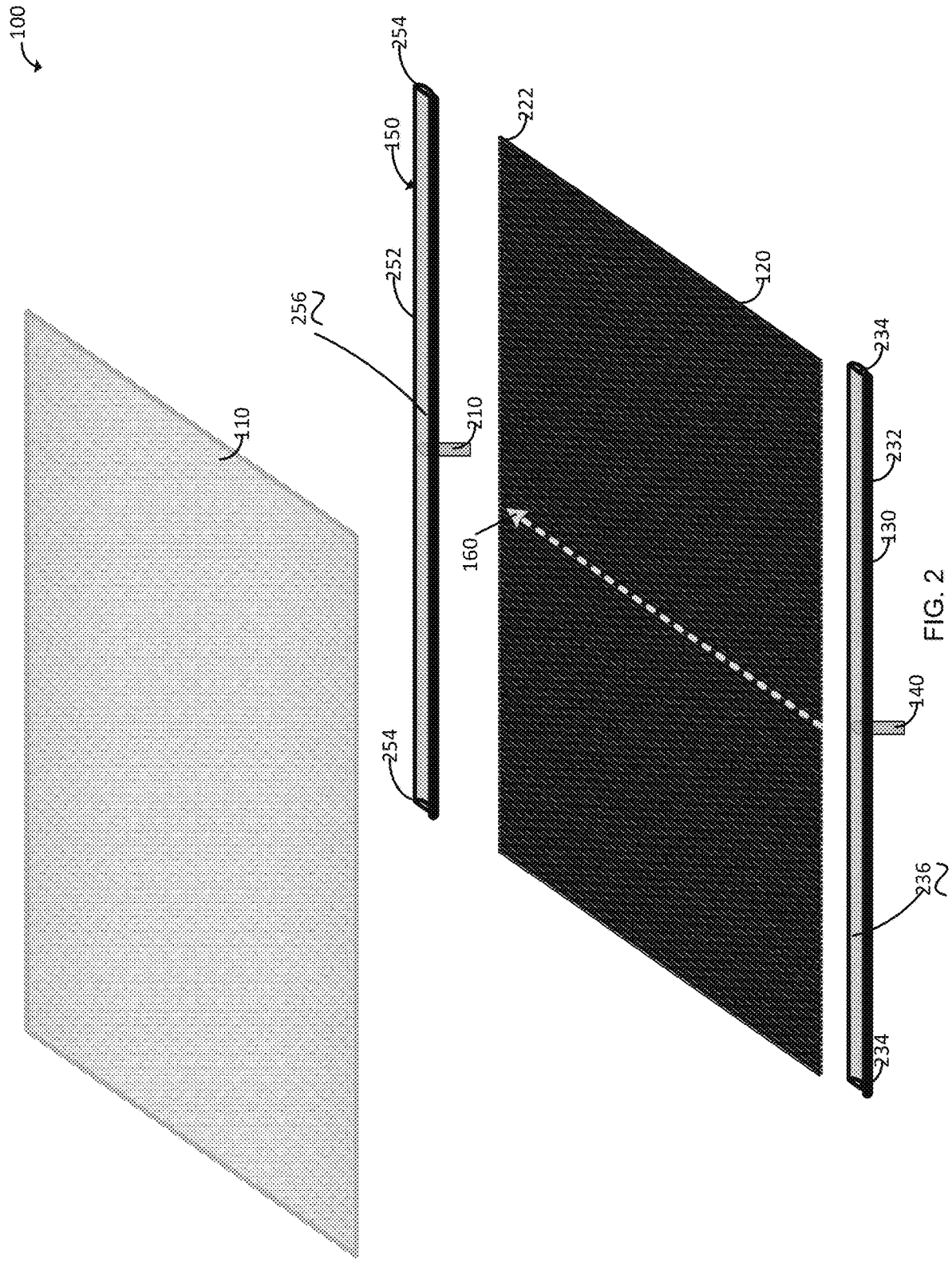
FIG. 2 is a schematic diagram showing an exploded view of the thin multi-channel heat exchanger, according to example embodiments of the disclosure.
Figure 3:
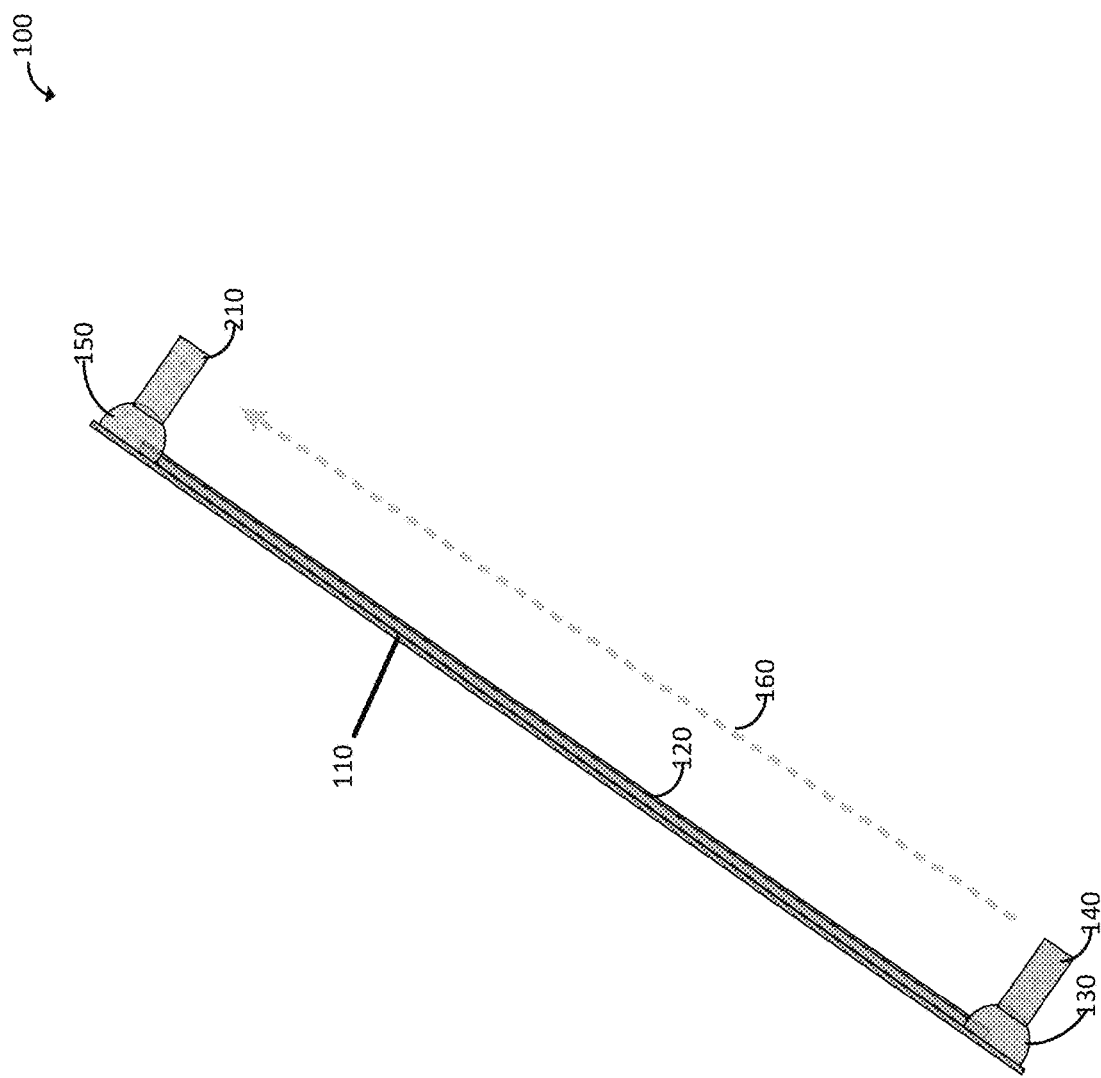
FIG. 3 a schematic diagram showing a side view of the thin multi-channel heat exchanger, according to example embodiments of the disclosure.

FIG. 1 is a schematic diagram showing a profile view of a thin multi-channel heat exchanger 100, according to example embodiments of the disclosure. FIG. 2 is a schematic diagram showing an exploded view of the thin multi-channel heat exchanger 100, according to example embodiments of the disclosure. FIG. 3 a schematic diagram showing a side view of the thin multi-channel heat exchanger 100, according to example embodiments of the disclosure.

The heat exchanger 100 may include an envelope 120, a heat conduction layer 110, an inlet tube 140, an inlet manifold 130, an outlet manifold 150, and an outlet tube 210. The heat conduction layer 110 may be in contact with portions of the envelope 120 to form conduits therebetween to allow the flow of coolant therethrough. The inlet manifold 130 may be fluidically coupled to the envelope 120, the heat conduction layer 110, and conduits therebetween. Similarly, the outlet manifold 130 may be fluidically coupled to the envelope 120, the heat conduction layer 110, and conduits therebetween. It will be appreciated that in some embodiments of the disclosure, the inlet manifold 130 and outlet manifold 150 may be reversed.

The envelope 120 may include a plurality of ridges 222 thereon that contact, and at least partially seal with the heat conduction layer 110 when the heat conduction layer 110 is assembled thereon. In other words, the protrusions 222 may extend to allow them to abut against a surface of the heat conduction layer 110. In example embodiments, the inlet manifold 130 may include outer walls 232 and end walls 234, to form a trough 236 therein. The trough 236 may allow for coolant fluid to flow from the inlet tube 140 spread substantially across the inlet manifold 130, and flow along a width of the envelope 120 and into conduits formed between the envelope 120 and the heat conduction layer 110.

In example embodiments, the outlet manifold 150 may include outer walls 252 and end walls 254, to form a trough 256 therein. The trough 256 may allow for coolant fluid to flow from the conduits formed between the envelope 120 and the heat conduction layer 110, and concentrate and/or drain into the outlet tube 210.

During operation, coolant, such as water may be drawn in the direction 160. In other words, according to example embodiments, water may be drawn in a direction 160 opposing gravity. Thus, a suction pump may be provided on the outlet tube 210 to draw coolant through the heat exchanger 100.

Figure 4:
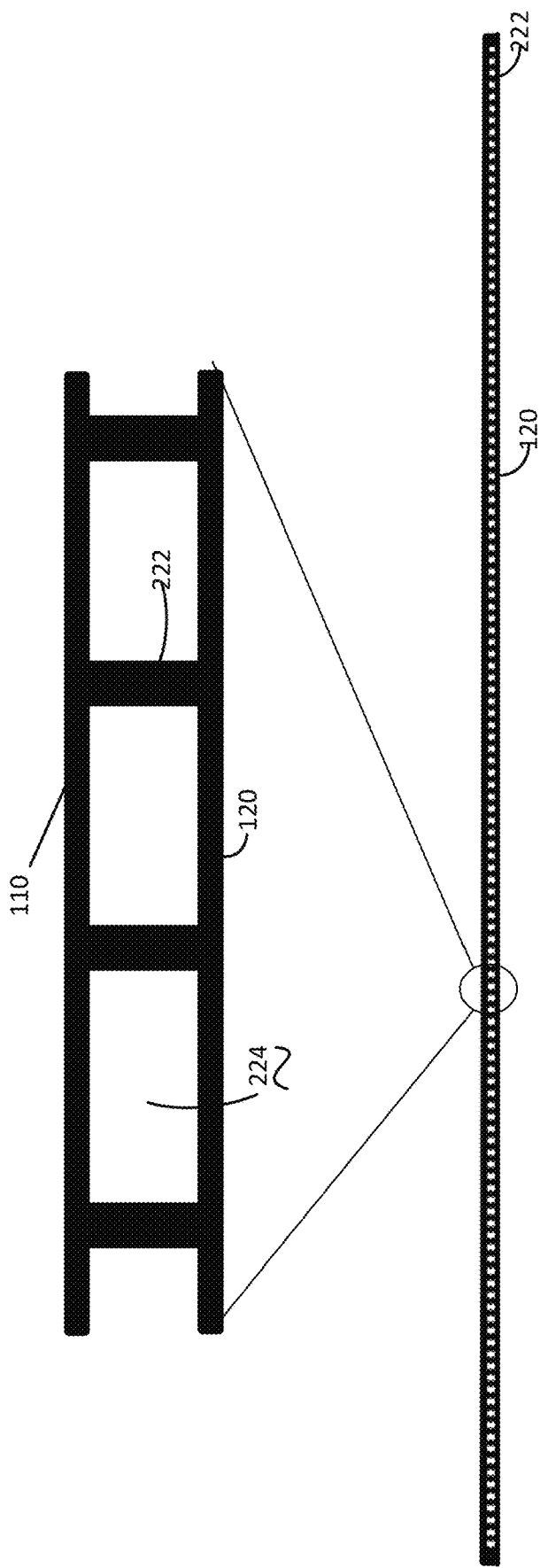
FIG. 4 a schematic diagram showing a sectional view of the thin multi-channel heat exchanger, according to example embodiments of the disclosure.

FIG. 4 a schematic diagram showing a sectional view of the thin multi-channel heat exchanger 100, according to example embodiments of the disclosure. The protrusions 222 of the envelope 120 abut the heat conduction layer 110 when the heat conduction layer is assembled thereon, resulting in the formation of coolant channels 224. In some cases, during operation, when coolant flows through the heat exchanger under suction, the heat conduction layer 110 may make a relatively more intimate and/or tighter contact and/or seal with the ridges 222 of the envelope 120, resulting in greater fluidic isolation of each of the coolant channels 224.

Although not shown in FIG. 4, in some embodiments, the surfaces of the coolant channels 224 may be coated, such as on an inner surface of the envelope 120. For example, and depending on the application for which the heat exchanger is to be used, the envelope 120 and/or the protrusions 222 thereon may be coated with metal, or other high thermal conductivity materials to enhance the thermal conduction pathways and/or efficiency of transporting heat to the coolant flowing through the channels 224. In other words, by providing greater thermal conductivity on all sides of the channels 224, more efficient conduction of heat to the coolant may be realized.

In some additional example embodiments, the envelope 120 and/or the protrusions 222 thereon may be coated with hydrophobic materials, such as polytetrafluoroethylene (PTFE), to reduce the Van der Waals forces between the ridges 222 and the coolant flowing through the channels 224. By coating the channels 224 with hydrophobic materials, the pumping of the coolant through the channels 224 may be more efficient, as resistance due to surface interaction forces may be reduced.

In some other example embodiments, the envelope 120 and/or the protrusions 222 thereon may be coated with hydrophilic materials, such as spin-on glass or glass-like materials, to increase the Van der Waals forces between the channels 224 and the coolant flowing therethrough. By coating the channels 224 with hydrophilic materials, the average residence time of the coolant through the channels 224 may be increased for any given pump speed, as resistance due to surface interaction forces may be increased. In some cases, increasing coolant residence time may allow for a greater thermal uptake by the coolant for a given volume of coolant passing through the heat exchanger 100.

Figure 5:
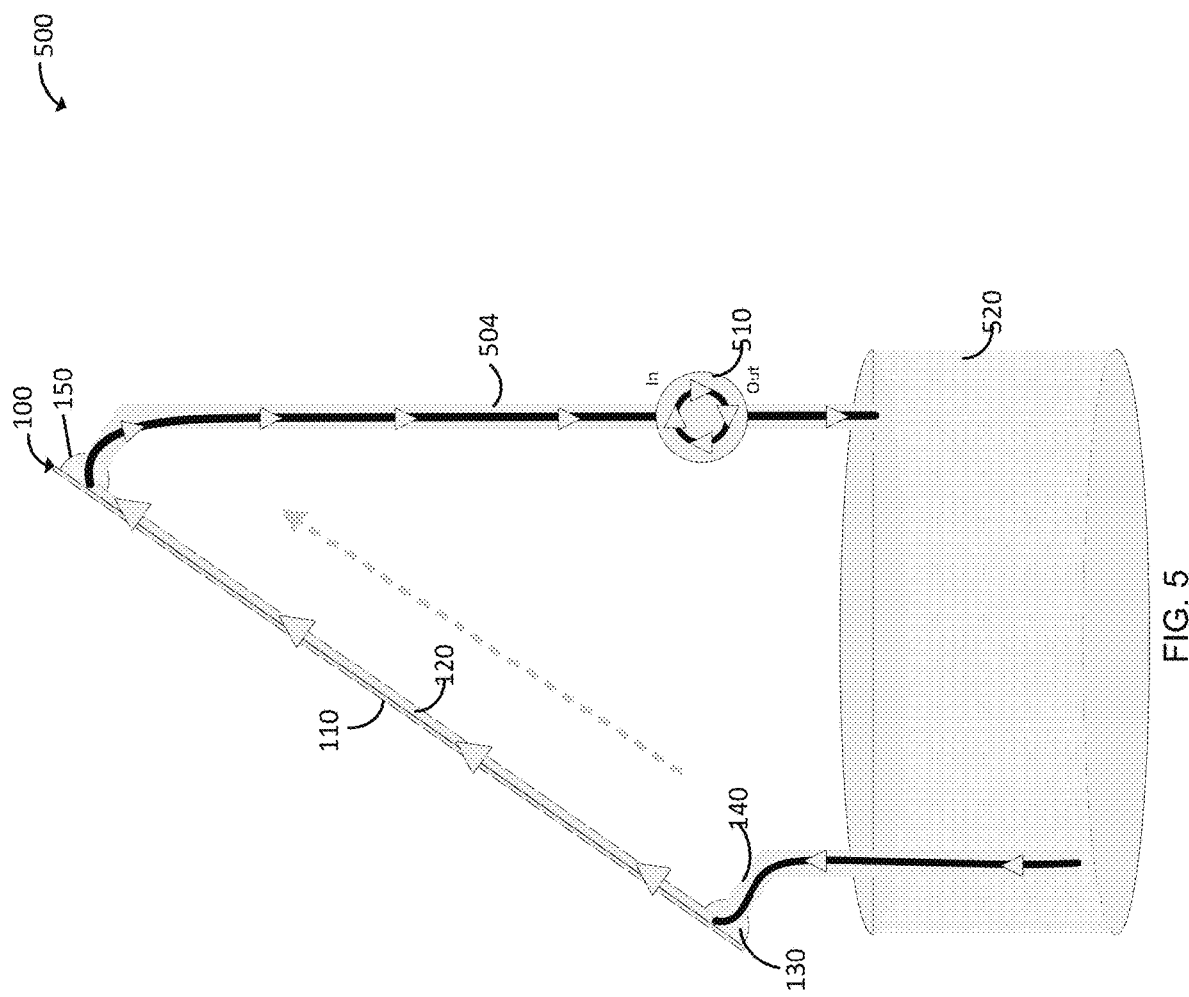
FIG. 5 is a schematic diagram that shows an environment with the thin multi-channel heat exchanger attached to a pump with coolant flowing therethrough, according to example embodiments of the disclosure.

FIG. 5 is a schematic diagram that shows an environment 500 with the thin multi-channel heat exchanger 100 attached to a pump 510 with coolant flowing 504 therethrough, according to example embodiments of the disclosure. The pump 510 may be a suction pump that pulls coolant out of the heat exchanger 100 via the outlet manifold 150 to return the coolant to a coolant reservoir 520.

It will be appreciated that by using downstream suction, rather than upstream pressurization, the coolant pressure within the heat exchanger 100 may be at a relatively low pressure with respect to atmospheric pressure. As a result, a thinner and less durable material may be needed for the construct of the envelope 120 and/or the heat conduction layer 110 of the heat exchanger 100. In some cases, the thin, lightweight, and inexpensive construction of the envelope 120 and the heat exchange layer 110 may allow for the heat exchanger 100 to be manufactured by relatively simple manufacturing processes, using widely available materials, and/or made flexible to accommodate various applications where the heat exchanger 100 may bend along its length.

It will be appreciated that alternatively, a pressurized pump may be used at the inlet manifold 130 to push coolant through the heat exchanger 100 in tandem with a suction pump at the outlet manifold according to example embodiments of the disclosure. In other words, the pump 510, in an alternate configuration, may pump coolant from the reservoir 520 into the heat exchanger 100 via the inlet manifold 130.

Figure 6:
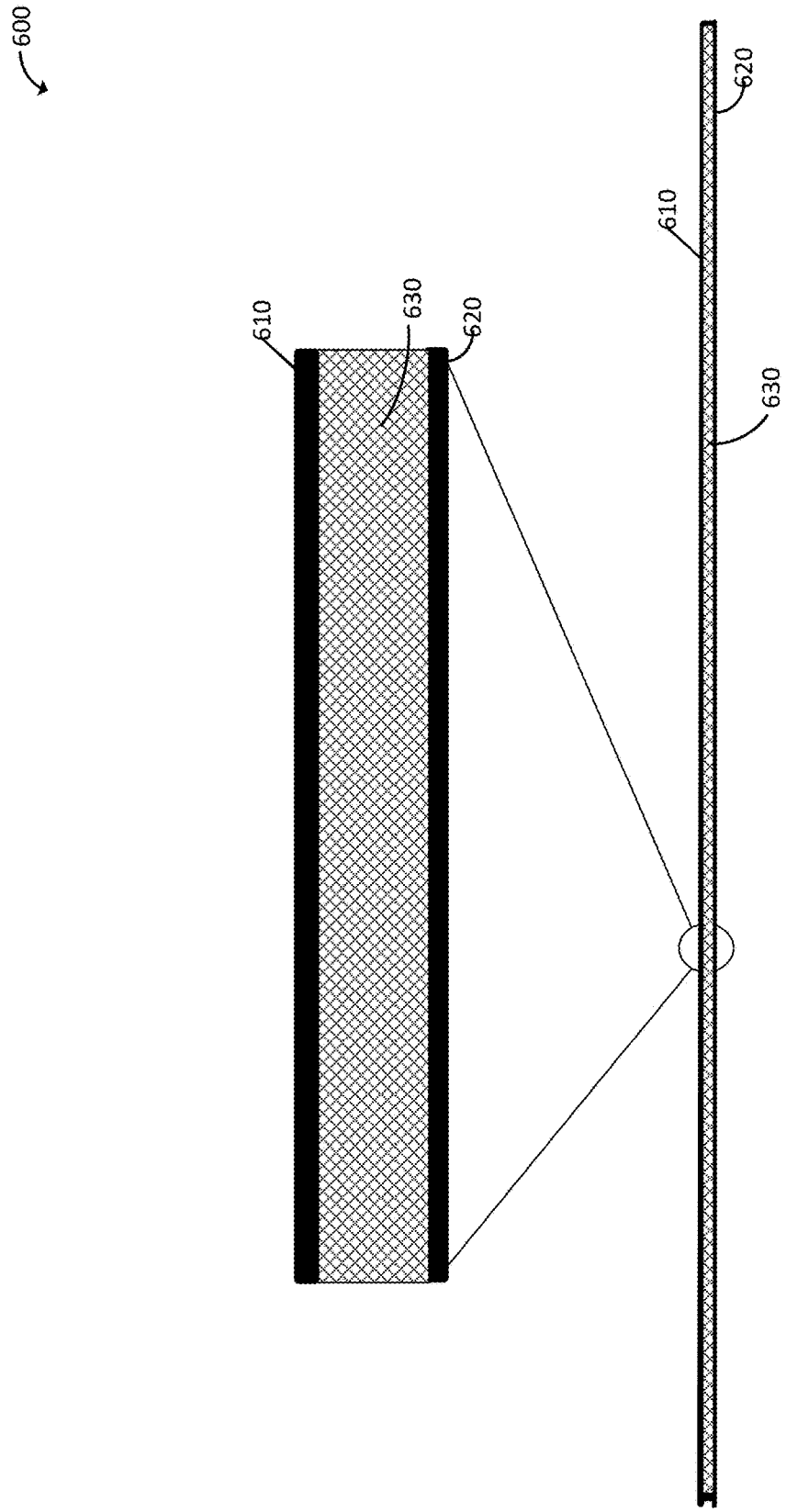
FIG. 6 is a schematic diagram that shows a sectional view of a thin mesh heat exchanger, according to example embodiments of the disclosure.

FIG. 6 is a schematic diagram that shows a sectional view of a thin mesh heat exchanger 600, according to example embodiments of the disclosure. The heat exchanger 600 may include an envelope 620 and a heat conduction layer 610 disposed thereon. In a cavity formed between the envelope 620 and the heat exchange layer 610, wire mesh 630 may be disposed therein. This wire mesh 630 may be of any suitable material and/or any suitable porosity. In some cases, wires of the wire mesh 630 may have fineness of chicken wire. In other cases, the wire mesh 630 may be similar to steel wool.

It will be appreciated that the thin heat exchangers 100, 600 as described herein may be manufactured in any suitable fashion, using any suitable materials. In example embodiments, the envelope 120, 620 may be fabricated from rubber or plastic materials. For example, a rubber mat may be used to fabricate the envelope. The heat exchange layer may be formed from metal, ceramics, or other suitable materials that may allow relatively efficient conduction of heat therethrough. The inlet and outlet manifolds may be constructed of plastic, rubber, ceramic, or metallic materials, and/or composites thereof.

In example embodiments, a rubber mat may be provided. Ridges 222 may be formed thereon, where the ridges include side walls of the envelope 120, 620. The ridges 222 may be formed by any suitable mechanism, including removal processes, such as embossing, cutting, grinding, chiseling, combination thereof, or the like, or by additive processing, such as attaching ridges by epoxy, glue, or stenciled deposition and cure of epoxy. In some cases, the envelope 120, 620 may be formed in an integrated fashion, such as by an extrusion process, molding process, combination thereof, or the like. After the envelope is formed, the heat exchange layer 110, 610 may be aligned and attached thereon to contact with and/or seal with the ridges 222. This attachment may be performed by any suitable mechanism, including, but not limited to epoxy, glue, adhesive tape, welding, thermosonic welding, glass-frit, combinations thereof, or the like. Next the inlet and outlet manifolds may be attached using similar attachment mechanisms as discussed herein.

Figure 7:
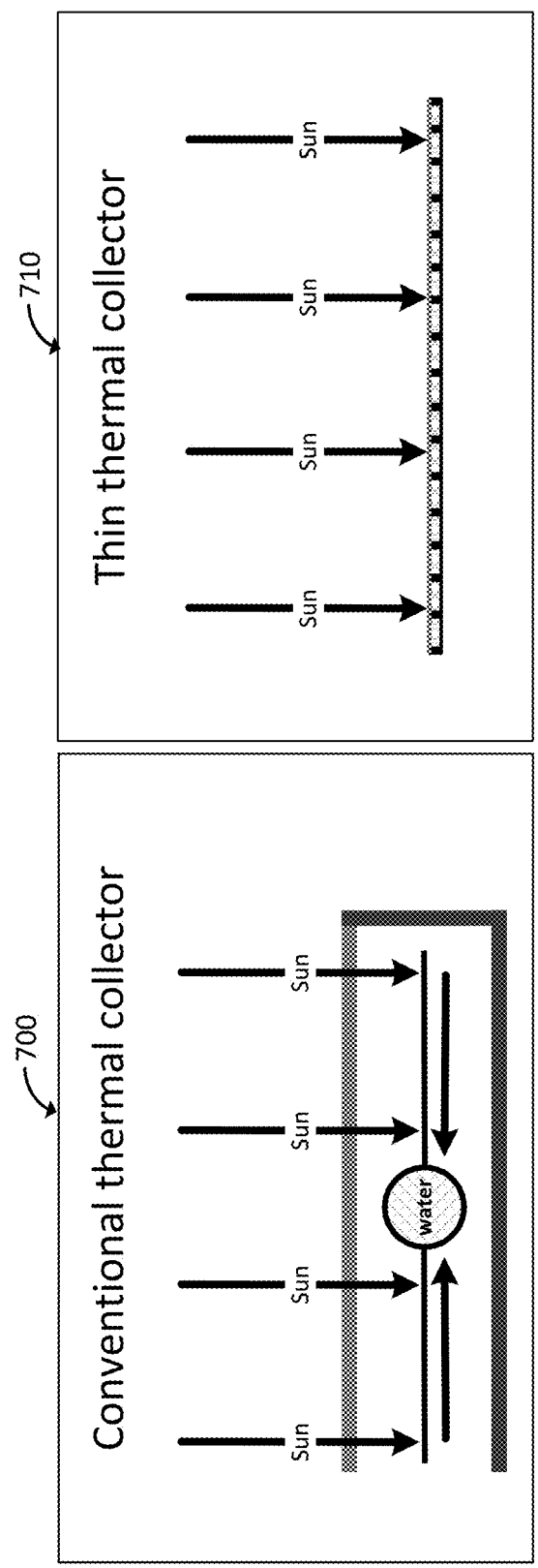
FIG. 7 is a schematic diagram that shows a comparison of conventional thermal collectors to the thin multi-channel heat exchanger, according to example embodiments of the disclosure.

FIG. 7 is a schematic diagram that shows a comparison of conventional thermal collectors 700 to the thin multi-channel heat exchanger 710, according to example embodiments of the disclosure. Compared to conventional thermal collectors 700, the heat exchanger 710, as described herein, may be relatively thinner, resulting in a short conduction path between the heat conduction layer and the coolant. This may result in greater thermal collection efficiency of the heat exchanger 710, such a heat exchangers 100, 600, as described herein.

Figure 8:
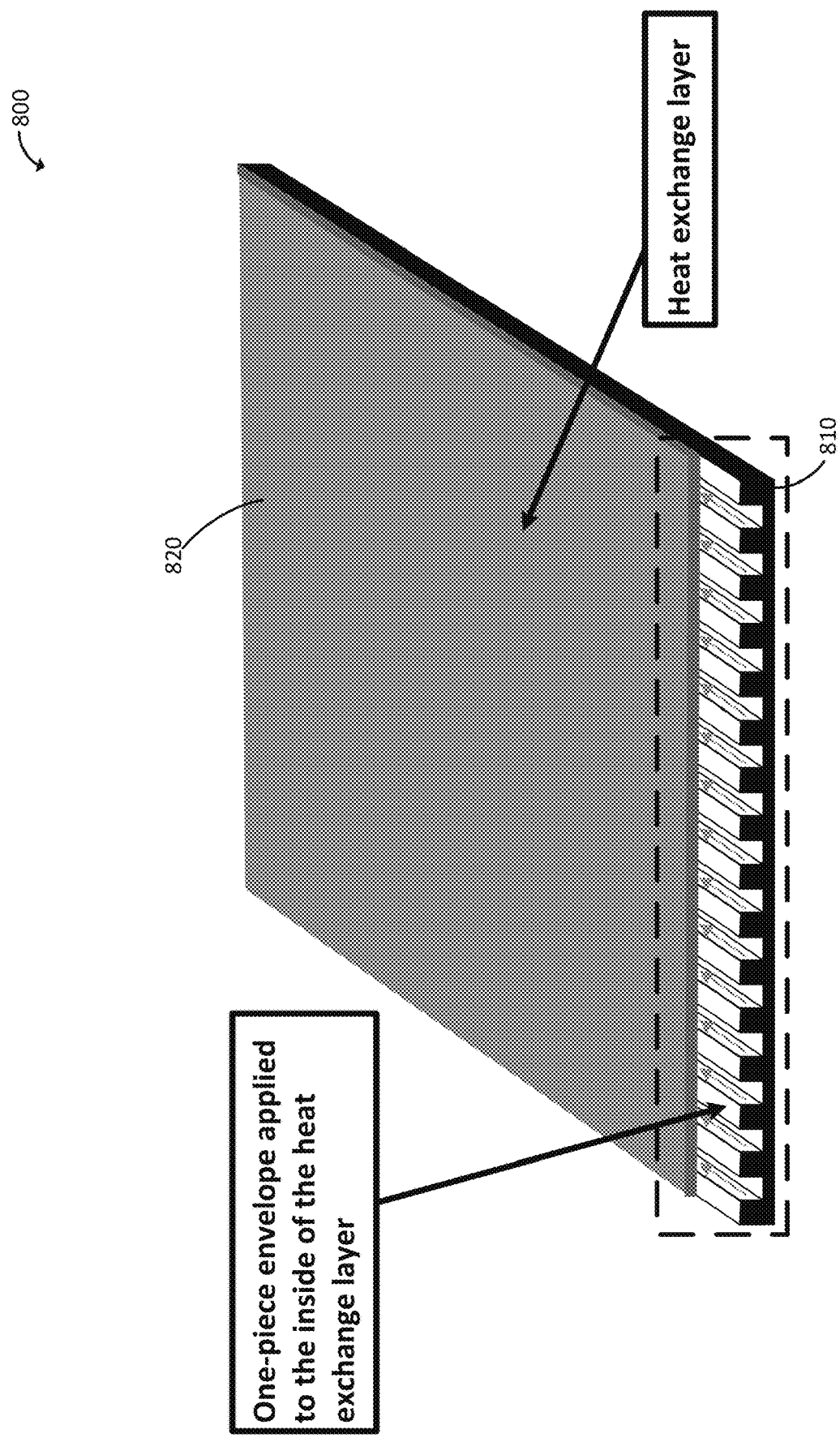
FIG. 8 is a schematic diagram that shows a cut-away view of the thin multi-channel heat exchanger, according to example embodiments of the disclosure.

FIG. 8 is a schematic diagram that shows a cut-away view of the thin multi-channel heat exchanger 800, according to example embodiments of the disclosure. An envelope layer 810 provides a thin, enclosed path for the coolant to flow along the inside surface of the heat exchange layer. The envelope edges are attached to a heat exchange layer 820 with flexible water and airtight adhesive, such as rubberized polyurethane adhesive. The top and bottom envelope layer edges may open to manifolds to be described later. One-piece, two-piece and double-isolated envelopes may have similar function with different construction.

Figure 9:
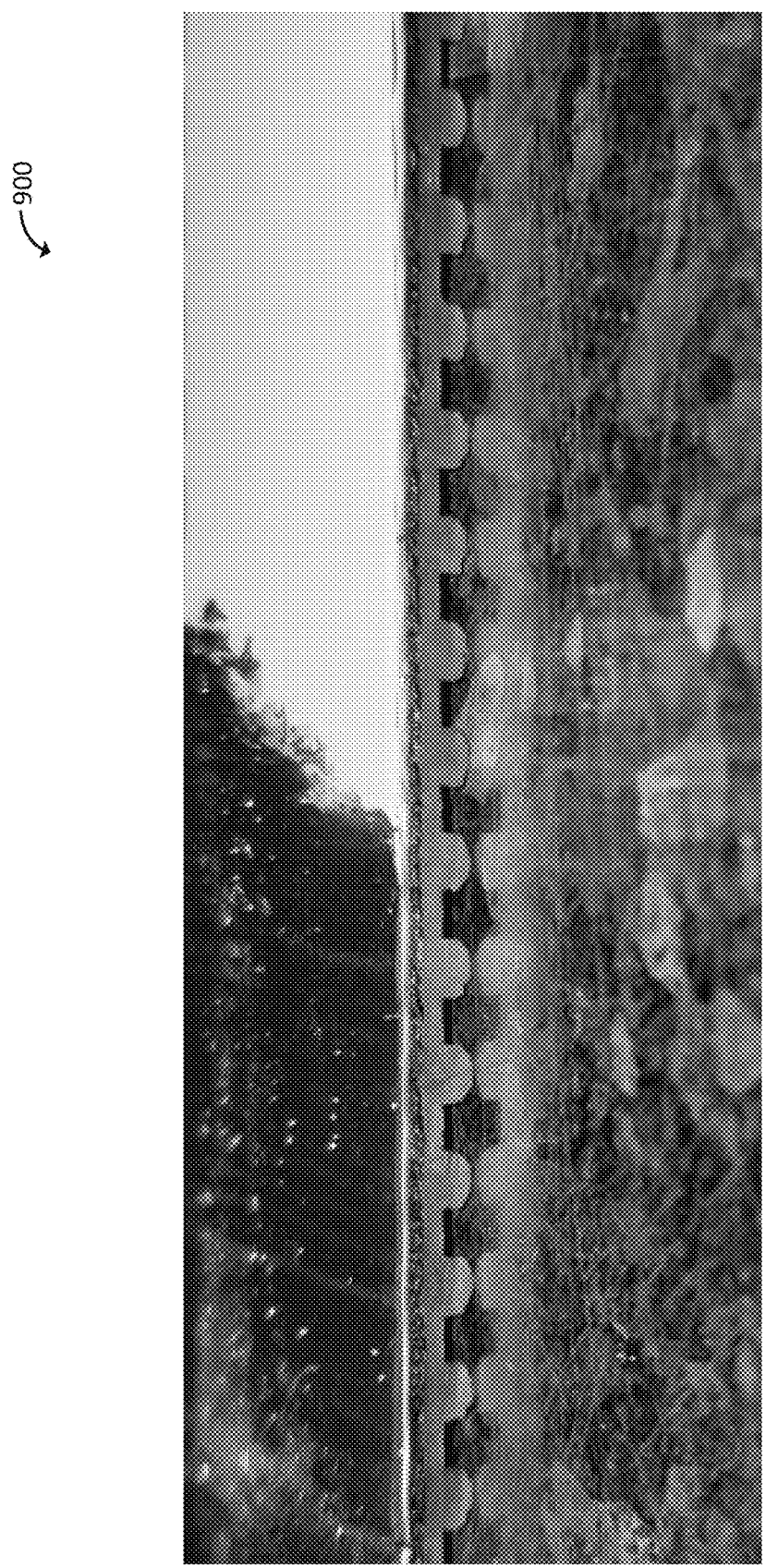
FIG. 9 is a photograph that shows a sectional view of the thin multi-channel heat exchanger, according to example embodiments of the disclosure.

FIG. 9 is a photograph that shows a sectional view of the thin multi-channel heat exchanger 900, according to example embodiments of the disclosure. A one-piece envelope is typically a sheet of impermeable material, such as plastic or rubber, with hundreds of thin and shallow lengthwise grooves or serrations through which the water or other coolant will flow. As mentioned previously, the pressure within the envelope is less than the pressure outside the envelope. For this reason, the outside air pressure will force the envelope and heat exchange layers firmly together, which would typically seal the space between them. The envelope serrations provide channels for the water to flow between heat exchange and envelope layers which are firmly pressed together by outside air pressure. In operation, the one-piece envelope behaves like hundreds of thin and closely spaced pipes through which the coolant may flow under suction.

Figure 10:
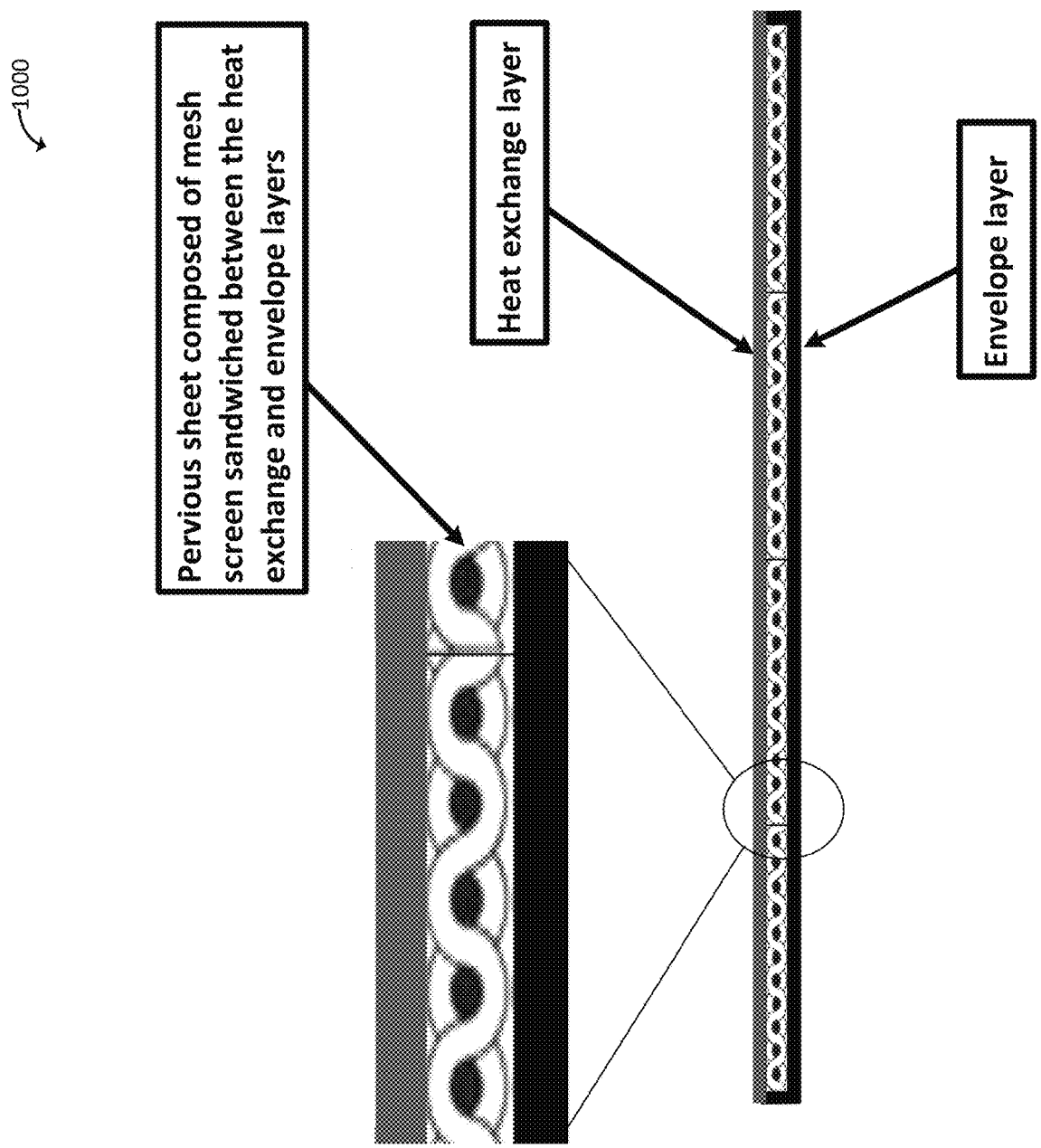
FIG. 10 is a schematic diagram that shows a sectional view of a two-piece envelope heat exchanger, according to example embodiments of the disclosure.

FIG. 10 is a schematic diagram that shows a sectional view of a two-piece envelope heat exchanger 1000, according to example embodiments of the disclosure. A two-piece envelope may be a thin, permeable sheet, such as metal or plastic screen, sandwiched between a thin sheet of impermeable to coolant material, such as plastic, rubber, or metal, and the heat exchange surface. The permeable sheet maintains a thin gap between heat exchange and envelope surfaces that are otherwise pressed together and/or sealed by outside air pressure. This permeable sheet provides a path for water flowing against the inside of the heat exchange layer, regardless of the pressure applied by the outside air. In operation, the two-piece envelope with permeable layer may provide wicking action, providing hundreds of thin, closely spaced, and winding pipes through which the coolant may flow.

Figure 11:
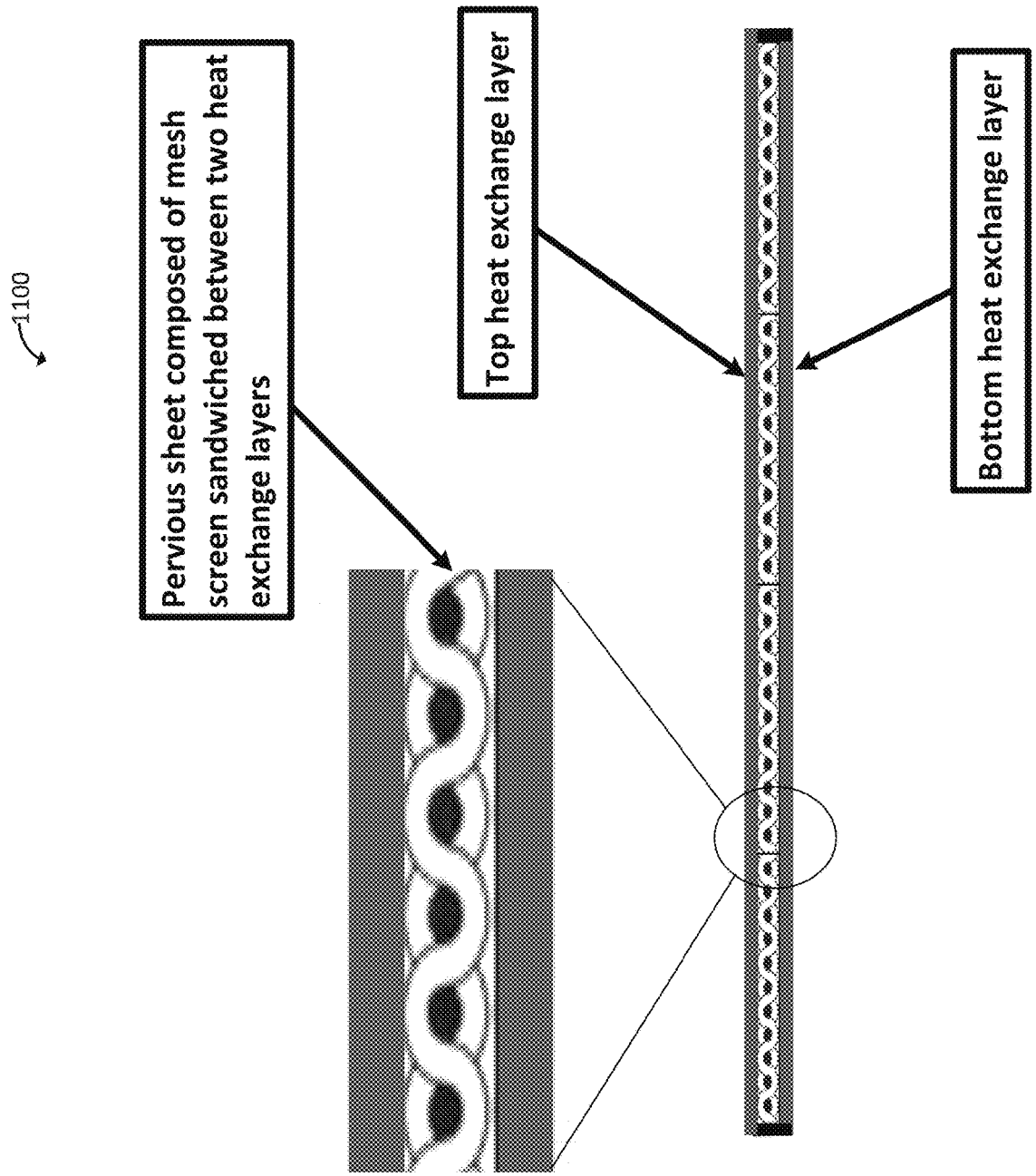
FIG. 11 is a schematic diagram that shows a sectional view of a two-sided heat exchanger, according to example embodiments of the disclosure.

FIG. 11 is a schematic diagram that shows a sectional view of a two-sided heat exchanger 1100, according to example embodiments of the disclosure. Depending upon the application, both sides of the thin heat exchanger can serve as heat exchange surfaces. In this case, there may be two heat exchange surfaces, such as two layers of thin sheet metal with a permeable sheet sandwiched between them.

Figure 12:
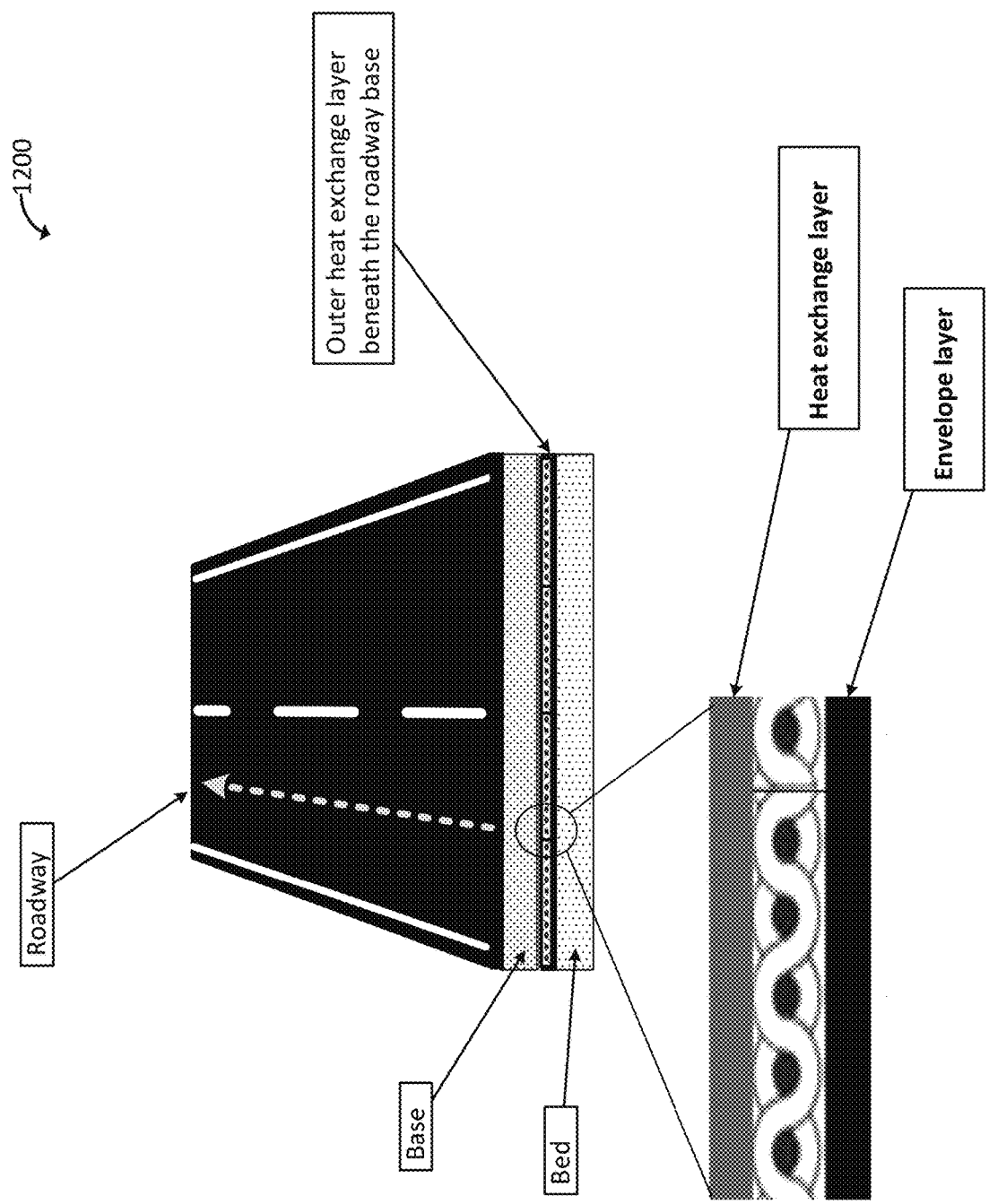
FIG. 12 is a schematic diagram that shows a sectional view of an example heat exchanger provided to collect thermal energy from a roadway, according to example embodiments of the disclosure.

FIG. 12 is a schematic diagram that shows an environment 1200 with a sectional view of an example heat exchanger provided to collect thermal energy from a roadway, according to example embodiments of the disclosure. Examples include application of thin heat exchangers between road or driveway surfaces and the ground below. These applications may have an additional purpose because the thin heat exchanger can also be used to heat and melt snow from the road surface during winter. In other words, the thin heat exchangers, as described herein may been used as a radiator in some applications, and a heat collector in other applications. In these examples liquid convection heat exchange with the ground may be more efficient, and in some cases, significantly more efficient, than traditional air convection heat exchange with fans.

Figure 13:
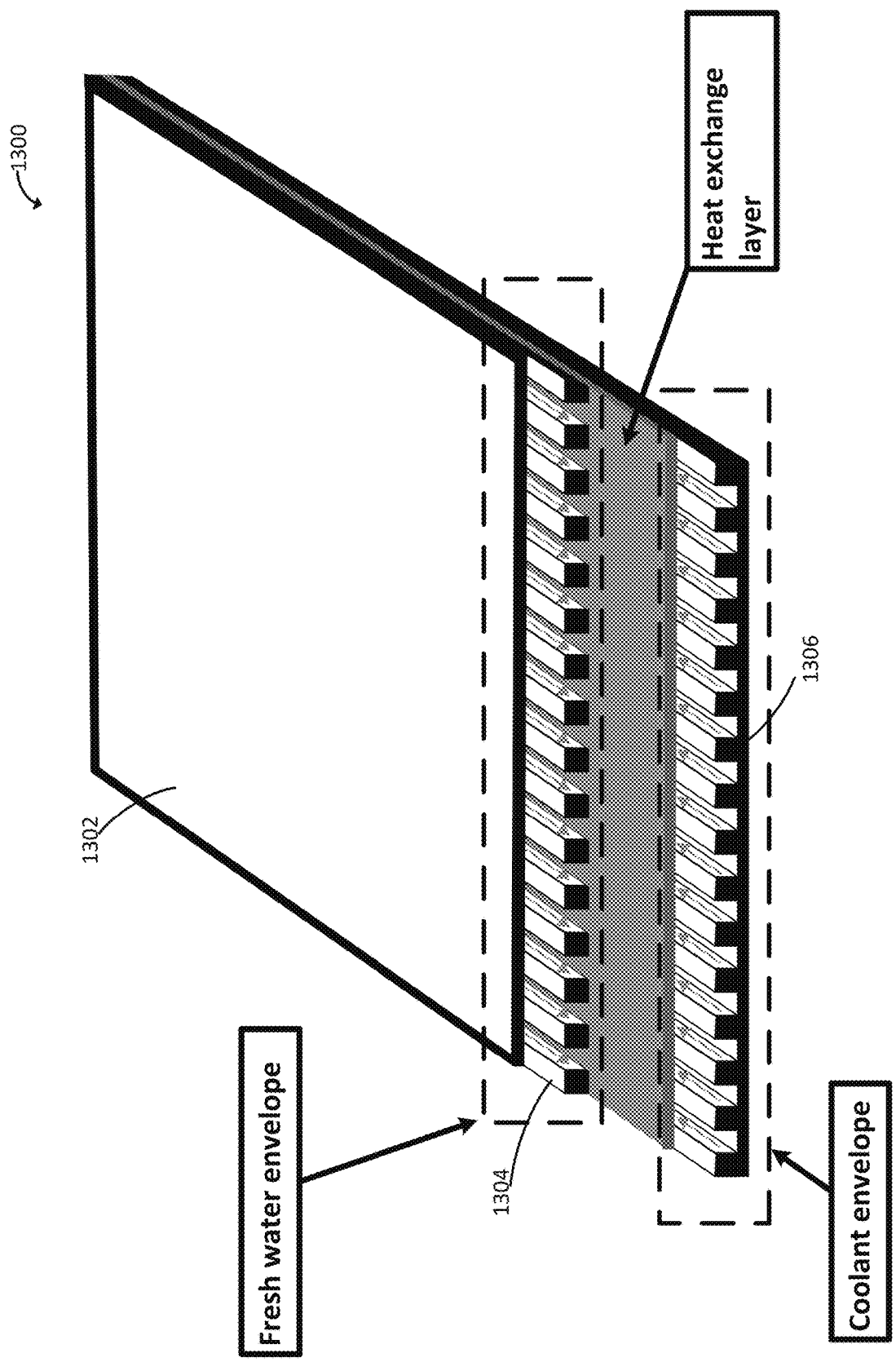
FIG. 13 is a schematic diagram that shows an example multi-layer multi-channel heat exchanger, according to example embodiments of the disclosure.

FIG. 13 is a schematic diagram that shows an example multi-layer multi-channel heat exchanger 1300, according to example embodiments of the disclosure. In another application, it may be necessary to transfer heat between two isolated liquids that will not mix. For example, heat may be collected from an anti-freeze mixture, or oil, flowing through a metal roof or photoelectric solar panel envelope and exchanged with fresh and/or potable water to be used for showers, washing machines, or other hot water appliances.

In this case a thin double-isolated heat exchanger may be used. Two envelopes may be applied to opposite sides of a thin heat exchange layer, for example a thin sheet of aluminum. Coolant and fresh water may be drawn, such as under suction, through envelope channels on opposite sides of the heat exchange layer. Coolant heat may be transferred to the fresh water over the relatively large heat exchange layer surface area, thereby transferring heat efficiently without mixing liquids.

Figure 14:
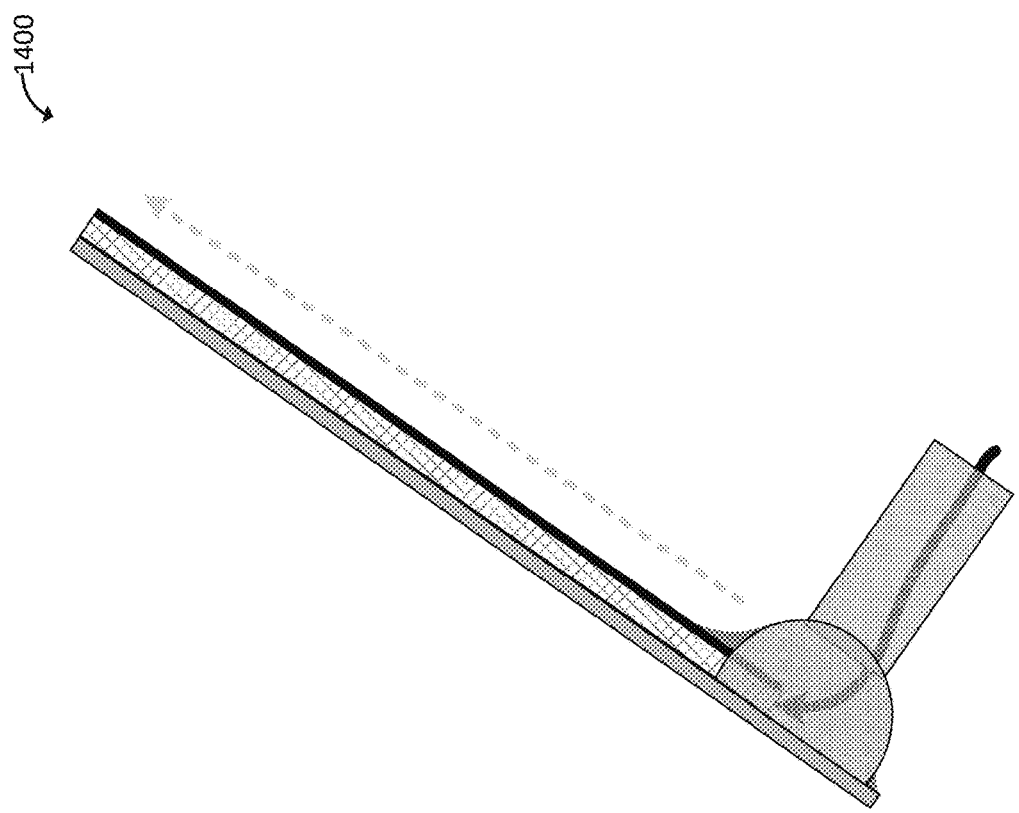
FIG. 14 is a schematic diagram that shows an example inlet manifold of the multi-channel heat exchanger, according to example embodiments of the disclosure.

FIG. 14 is a schematic diagram that shows an example inlet manifold 1400 of the multi-channel heat exchanger, according to example embodiments of the disclosure. The inlet manifold may provide a low-resistance path for the coolant to flow from the storage tank to the entire lower edge of the envelope. This manifold may be under suction and will therefore have adequate shape and thickness to prevent collapse due to outside air pressure. For example, the inlet manifold 1400 can be a section of PVC pipe cut in half and capped at both ends, thus forming an arch bridging the lower edges of the envelope and heat exchange layers.

The horizontal manifold assembly will span the entire width of the heat exchange and manifold layers, which are sealed at the edges with flexible water and airtight adhesive, such as rubberized polyurethane adhesive. This manifold will also have an inlet pipe attached at either end or near the middle. The open bottom ends of the envelope layer channels will extend approximately half way inside the manifold opening. The manifold outer edges will be sealed against the envelope and heat exchange layer with flexible adhesive, thus forming an air and watertight pocket at the bottom of the thin heat exchanger.

Figure 15:
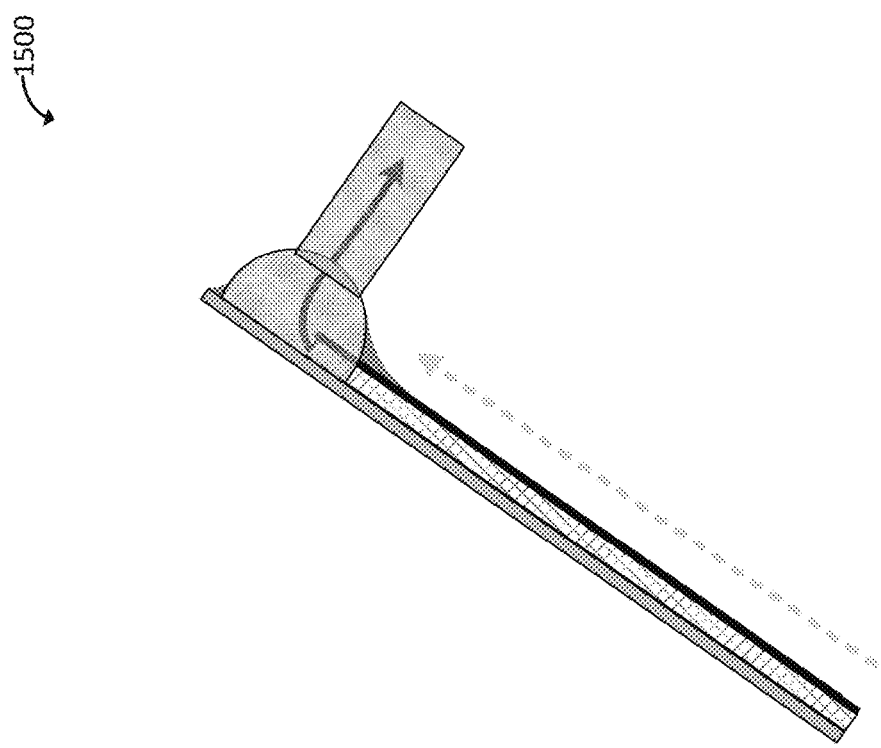
FIG. 15 is a schematic diagram that shows an example outlet manifold of the multi-channel heat exchanger, according to example embodiments of the disclosure.

FIG. 15 is a schematic diagram that shows an example outlet manifold 1500 of the multi-channel heat exchanger, according to example embodiments of the disclosure. The outlet manifold provides a low-resistance path for the coolant to flow from the top of the thin heat exchanger to the suction pump. This manifold will be under suction and will therefore have adequate shape and thickness to prevent collapse due to outside air pressure. For example, the outlet manifold 1500 can be a section of PVC pipe cut in half and capped at both ends, thus forming an arch bridging the upper edges of the envelope and heat exchange layers.

The horizontal manifold assembly will span the entire width of the heat exchange and manifold layers, which are sealed at the edges with flexible water and airtight adhesive (rubberized polyurethane adhesive, for example). This manifold will also have an outlet pipe attached at either end or near the middle. The open top ends of the envelope layer channels will extend approximately half way inside the manifold opening. The manifold outer edges will be sealed against the envelope and heat exchange layer with flexible adhesive, thus forming an air and watertight pocket at the top of the thin heat exchanger.

Figure 16:
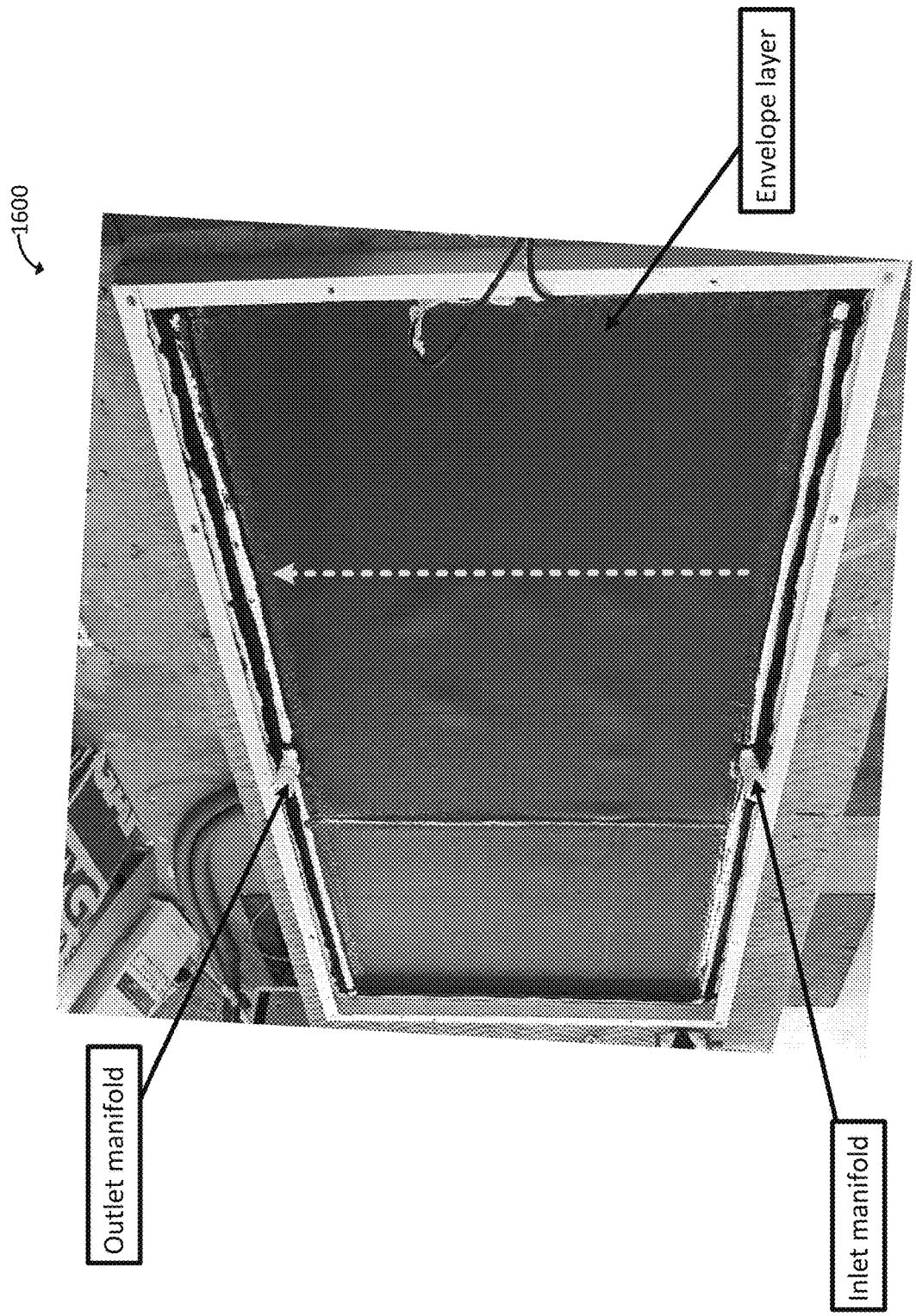
FIG. 16 is a photograph of an example heat exchanger provided to collect thermal energy from a photovoltaic panel, according to example embodiments of the disclosure.

FIG. 16 is a photograph 1600 of an example heat exchanger provided to collect thermal energy from a photovoltaic panel, according to example embodiments of the disclosure. The heat exchange layer is an impermeable heat-conductive flat or curved surface located where heat can be collected and/or radiated. This heat exchange layer can be part of an existing structure (metal roof, photovoltaic (PV) panel back sheet, pipe or window) or an independent surface (sheet of metal or plastic) added for the purpose of collecting or radiating heat from/to existing surface(s).

Figure 17:
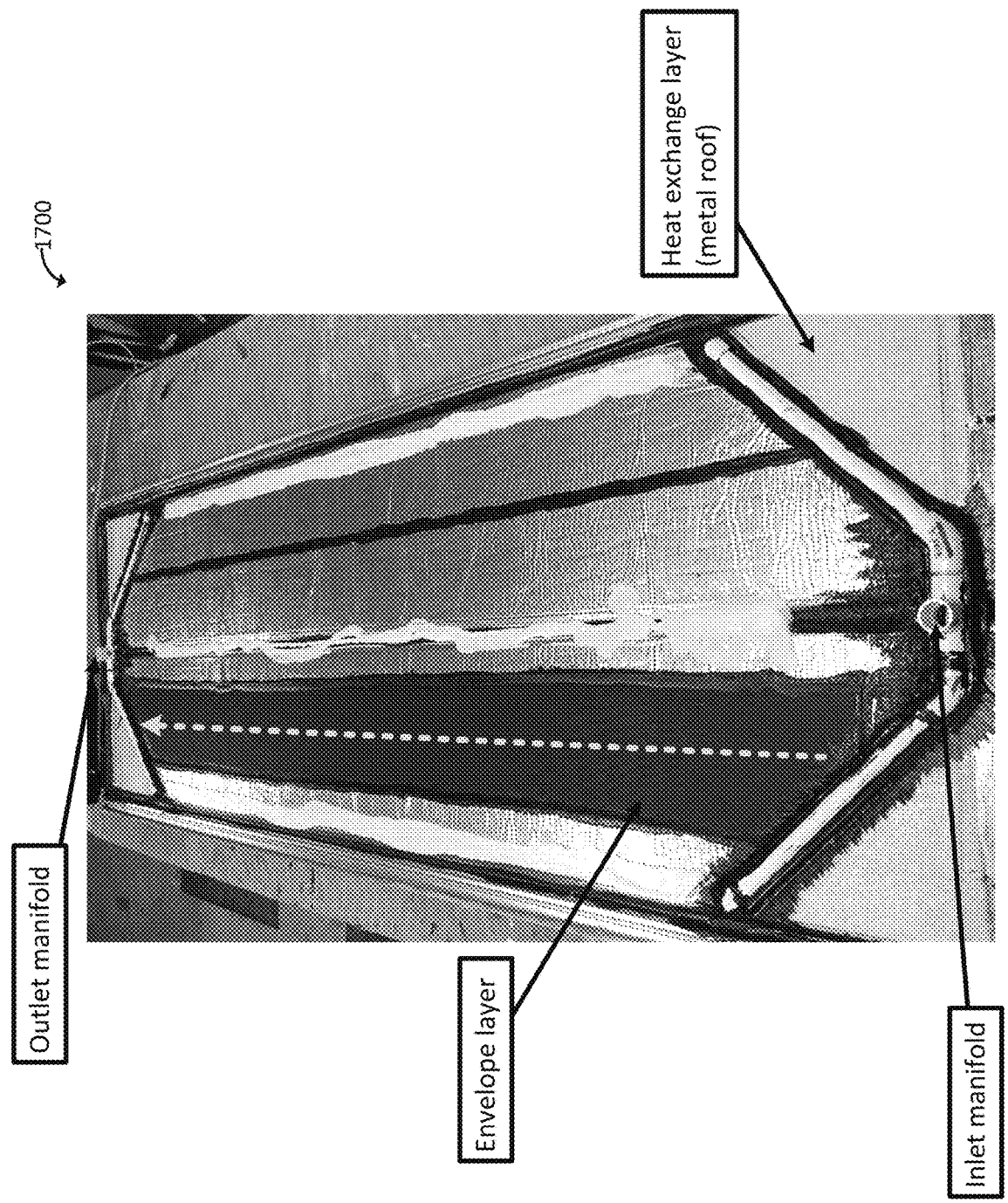
FIG. 17 is a photograph of an example heat exchanger provided to collect thermal energy from a metal roof, according to example embodiments of the disclosure.

FIG. 17 is a photograph 1700 of an example heat exchanger provided to collect thermal energy from a metal roof, according to example embodiments of the disclosure. The heat exchange layer outer surface faces, and is often in direct contact with, the area and material from which heat is to be collected and/or to which heat is to be radiated. This surface will be able to tolerate the conditions which surround it. For existing heat exchange layer outer surfaces could include the sky-facing side of a metal roof, sun-facing side of photovoltaic (PV) panel backing material, inner surface of a pipe or the outside surface of a glass window. For independent heat exchange layer outer surfaces could include the outside face of a sheet of metal or plastic.

The heat exchange layer envelope surface faces the inside of the envelope, and is always in direct contact with moving water or other heat-conducting liquid (coolant). This surface will be waterproof and resistant to corrosion, if any, associated with the chemical properties of the coolant. For existing heat exchange layer envelope surfaces could include the underside of a metal roof, underside of photovoltaic (PV) panel backing material, outer surface of a pipe or inside surface of a glass window. For independent heat exchange layer envelope surfaces could include the inside face of a sheet of metal or plastic.

Figure 18:
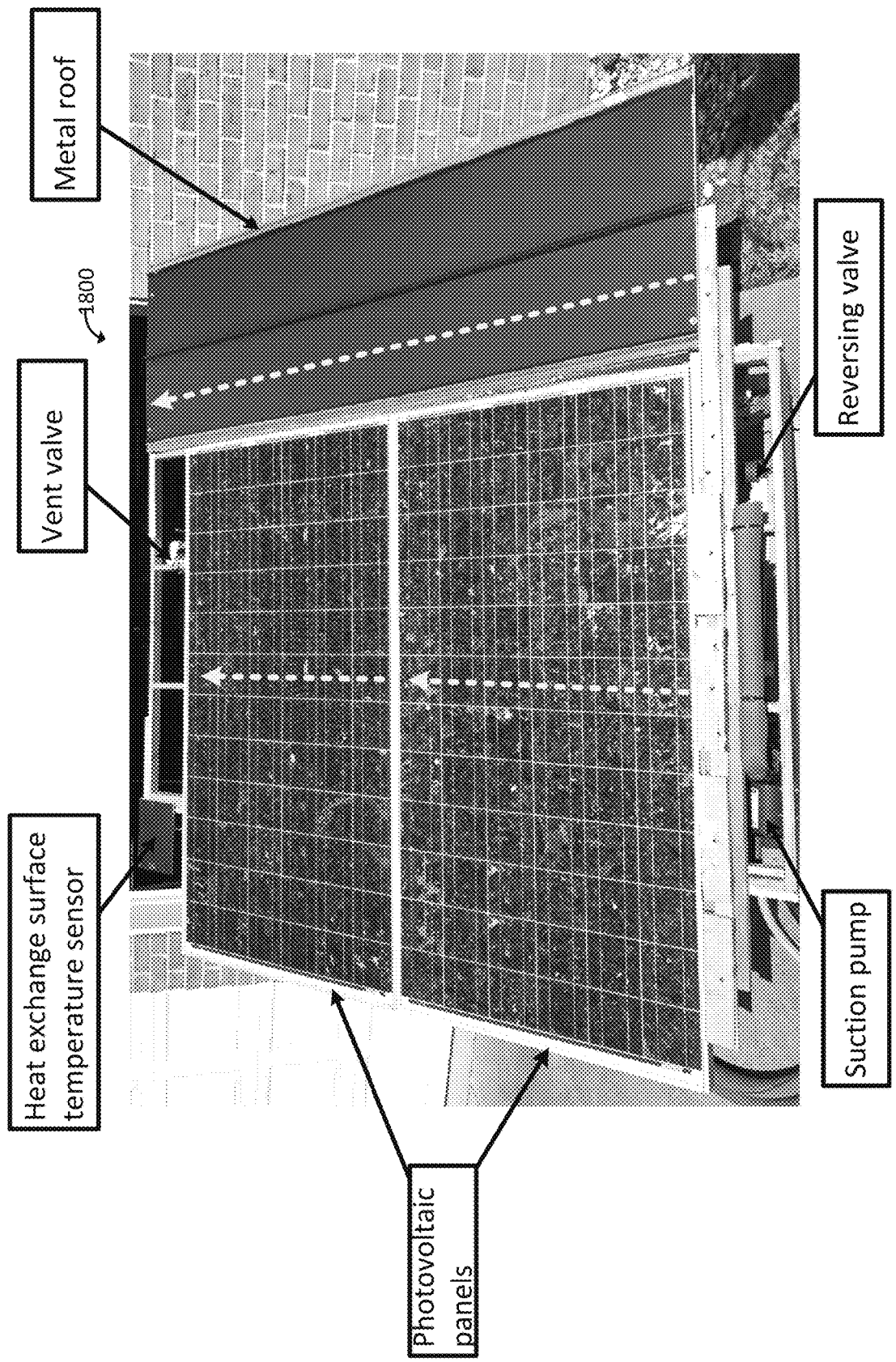
FIG. 18 is a photograph a front view of an example heat exchanger provided to collect thermal energy from a photovoltaic panel, according to example embodiments of the disclosure.
Figure 19:
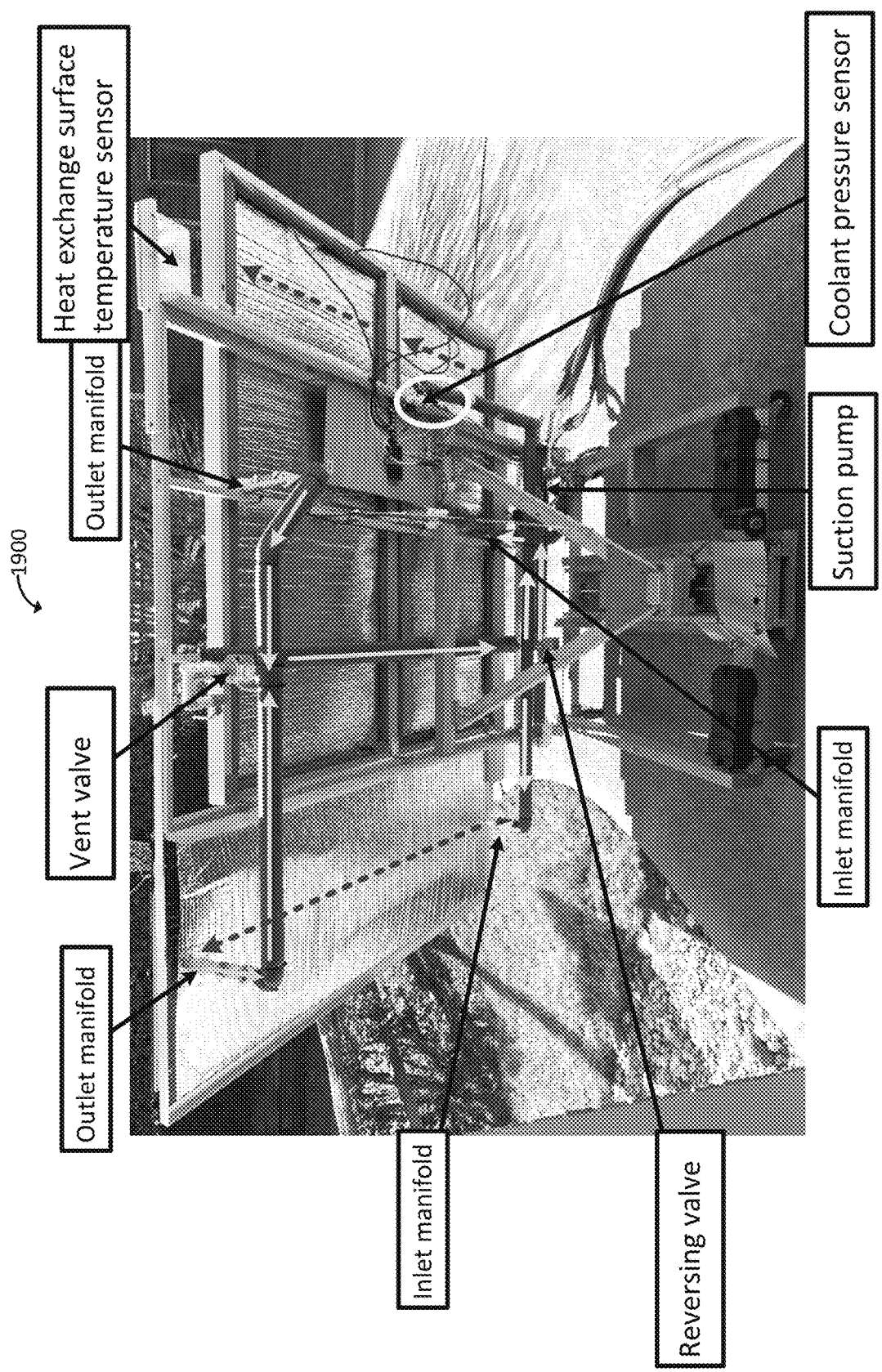
FIG. 19 is a photograph of a back view of an example heat exchanger provided to collect thermal energy from a photovoltaic panel, according to example embodiments of the disclosure.

FIG. 18 is a photograph 1800 of a front view of an example heat exchanger provided to collect thermal energy from a photovoltaic panel, according to example embodiments of the disclosure. FIG. 19 is a photograph 1900 of a back view of an example heat exchanger provided to collect thermal energy from a photovoltaic panel, according to example embodiments of the disclosure.

This prototype is to demonstrate and measure thin heat exchanger capabilities, as disclosed herein. Thin heat exchangers were applied to two PV panels and one length of metal roofing material. These three thin heat exchangers covered 4878 square inches of sun-facing surface area for approximately $65 material cost.

Figure 20:
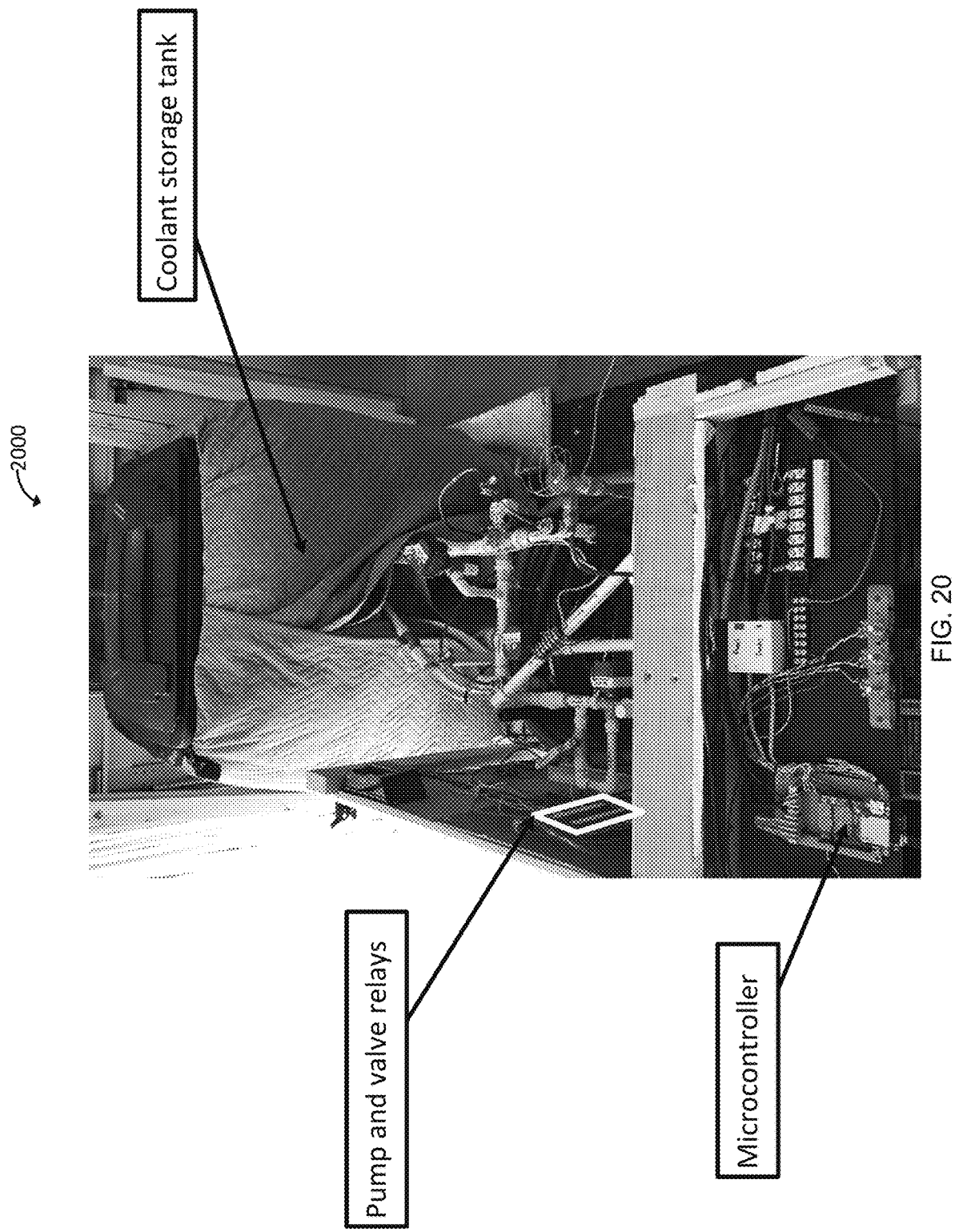
FIG. 20 is a photograph of an example microcontroller and coolant tank for the thin heat exchanger, according to example embodiments of the disclosure.

FIG. 20 is a photograph 2000 of an example microcontroller and coolant tank for the thin heat exchanger, according to example embodiments of the disclosure. The 96 gallon coolant storage tank, variable inlet valve, microcontroller and associated wiring are mounted on a stationary platform inside the garage. The storage tank, microcontroller and portable wooden frame with panels are interconnected with flexible coolant hoses (garden hoses with pipe insulation) and wiring harness.

Figure 21:
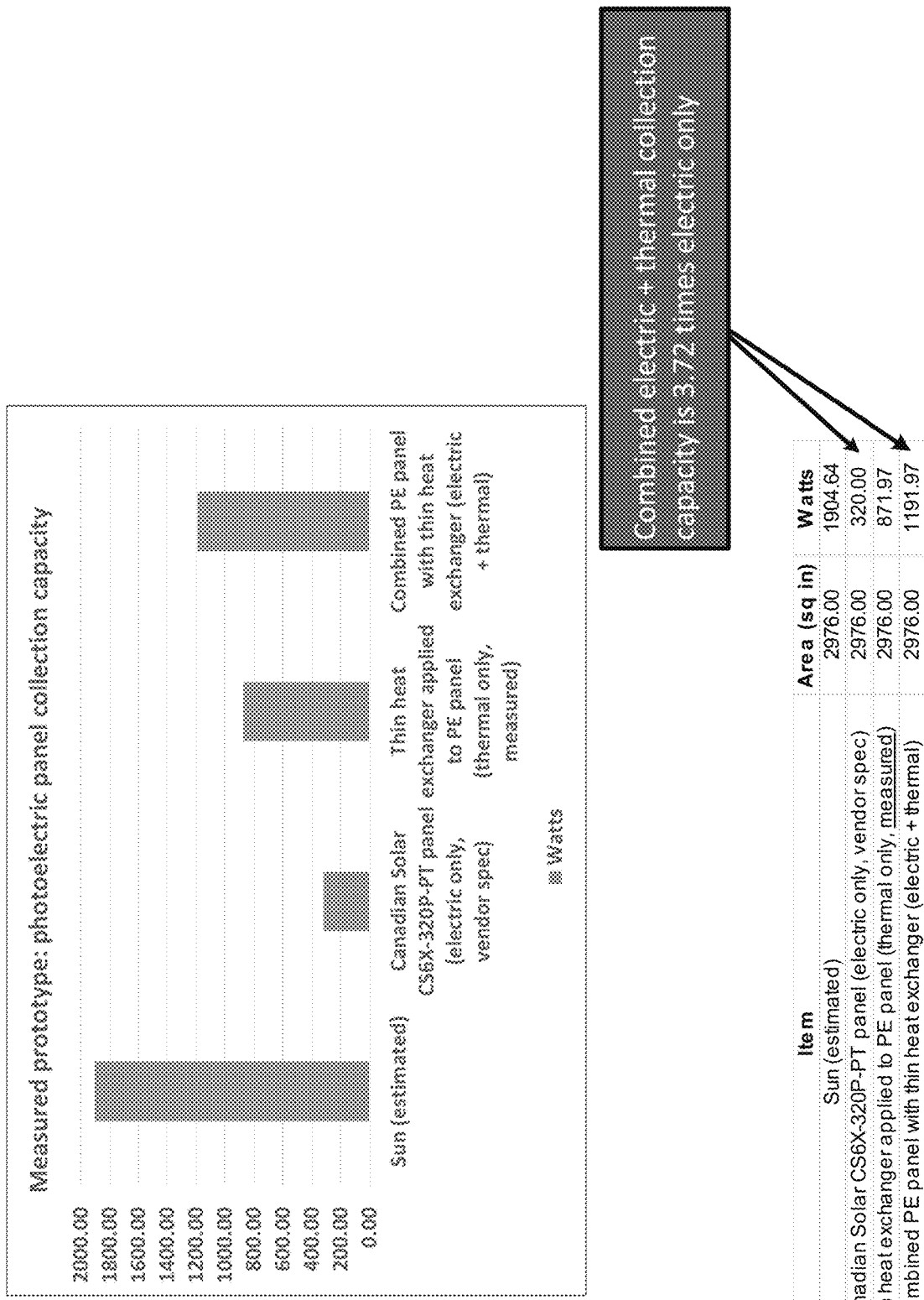
FIG. 21 is a chart of energy collected by a photoelectric panel and a prototype of the thin heat exchanger, according to example embodiments of the disclosure.

FIG. 21 is a chart of energy collected by a photoelectric panel and a prototype of the thin heat exchanger, according to example embodiments of the disclosure. The collector array, composed of two PV panels and one metal roof section, was moved to an outdoor location for sun exposure over a number of test days. Each test day the microcontroller executed and measured a number of cycles from idle through startup, collection and shutdown. During collection intervals the microcontroller measured the rate of temperature rise in the coolant storage tank.

1 BTU=1 degree F. temperature rise for 1 pound of water. 1 BTU=0.293 Watts. 1 gallon of water=8.34 pounds. For a 96 gallon tank (800 pounds), each 1 degree F. rise in temperature=800 BTU=234 Watts.

Over a 104 minute interval, tank temperature rose 10.54 degrees F.=8,432 BTU=2,466 Watts. Thermal collection rate (per hour)=gain×(60/104)=4865 BTU/hr=1,423 Watt/hr. Thermal collection area is 4878 square inches. Thermal collection rate per square inch=0.997 BTU/hr/sq-in =0.292 Watt/hr/sq-in. A typical 320 Watt (rated) photovoltaic solar panel has 2976 square inches surface area. Electric-only collection rate=0.11 Watt/hr/sq-in.

Figure 22:
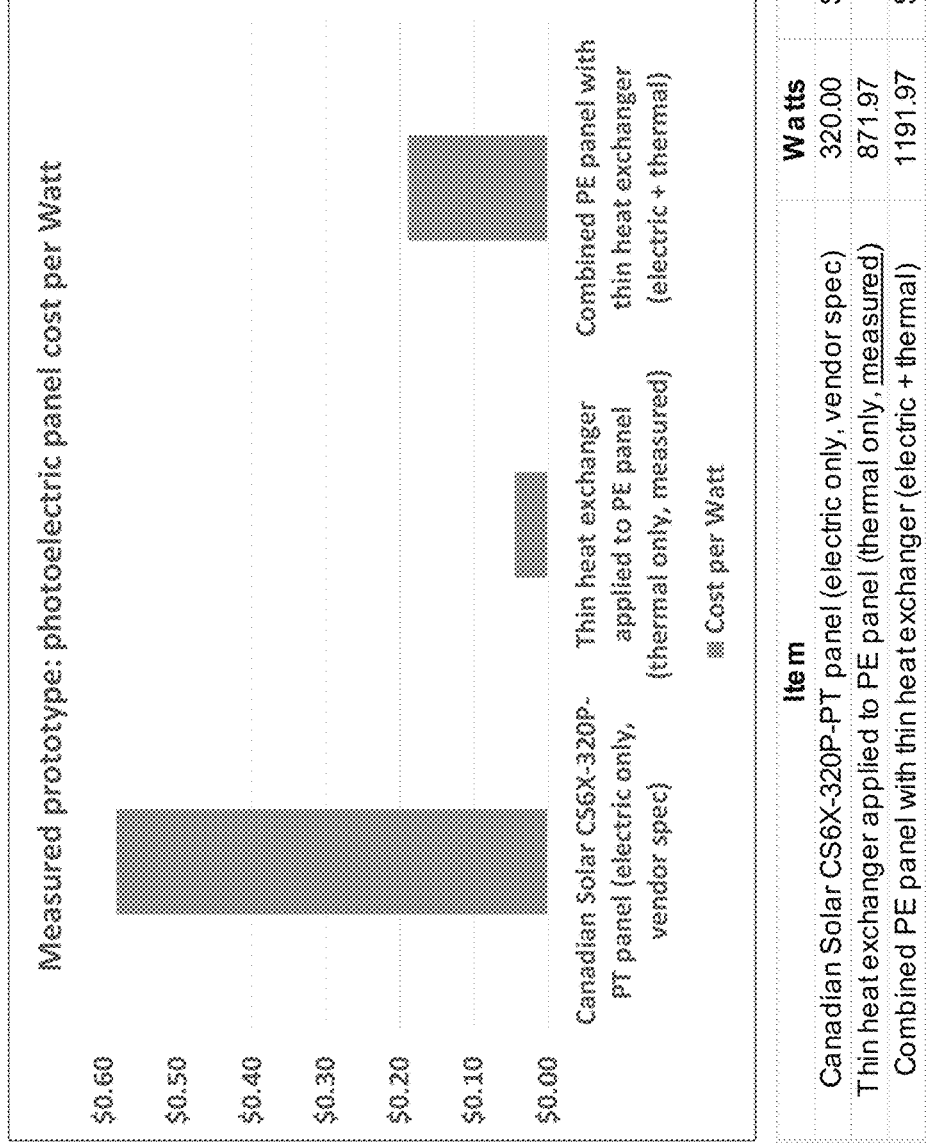
FIG. 22 is a chart of energy collected and an estimated cost of the photoelectric panel and the prototype of the thin heat exchanger, according to example embodiments of the disclosure.

FIG. 22 is a chart of energy collected and an estimated cost of the photoelectric panel and the prototype of the thin heat exchanger, according to example embodiments of the disclosure. FIG. 23 is a chart of sensor read-outs for the prototype of the thin heat exchanger, according to example embodiments of the disclosure. Applied to a typical photovoltaic solar panel, the thin heat exchanger can increase collection capacity from 320 Watts electric only to 1192 Watts of combined electric plus thermal energy. This may result in 3.7× increase in combined electric plus thermal collection capacity.

A typical 320 Watt photovoltaic solar panel costs $187=$0.58/Watt. Applied to a typical photovoltaic solar panel, thin heat exchanger materials cost $39 (retail) and increase collection capacity by 872 Watts=$0.04/Watt. Combined electric+thermal collection capacity (1192 Watts) costs $226=$0.19/Watt. 67% reduction in combined electric plus thermal Watt collection cost.

The thin heat exchanger results and costs are subject to the typical limitations of home workshop projects. For example, the most expensive tool used for this prototype construction was a $150 portable band saw to halve the inlet and outlet manifold pipes. All materials were purchased via retail outlets. It will be appreciated that production manufacturing materials, tools, techniques and economies of scale will likely yield even better collection and cost efficiency results.

Figure 24:
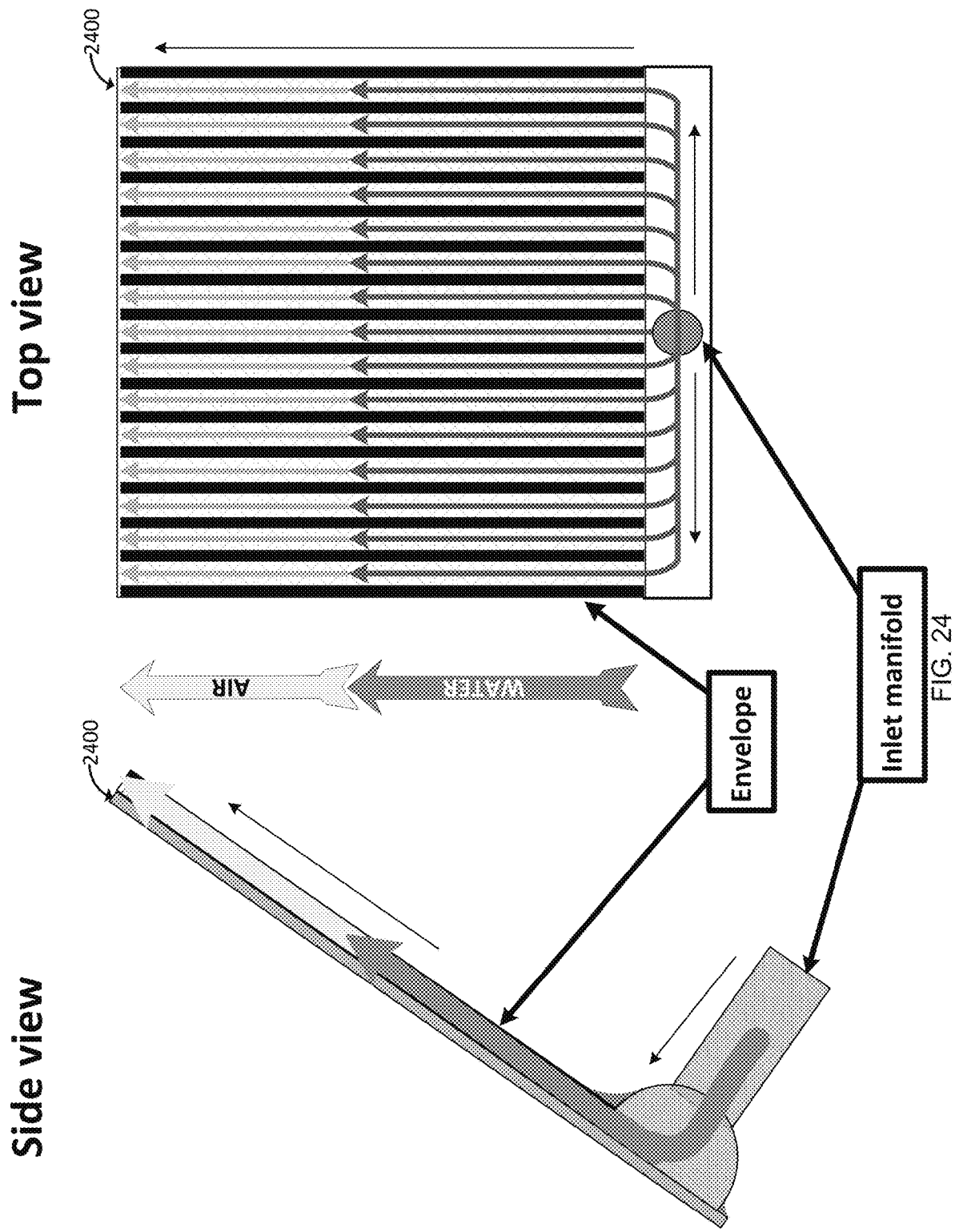
FIG. 24 is a schematic diagram of fluid flow through the thin heat exchanger, according to example embodiments of the disclosure.
Figure 25:
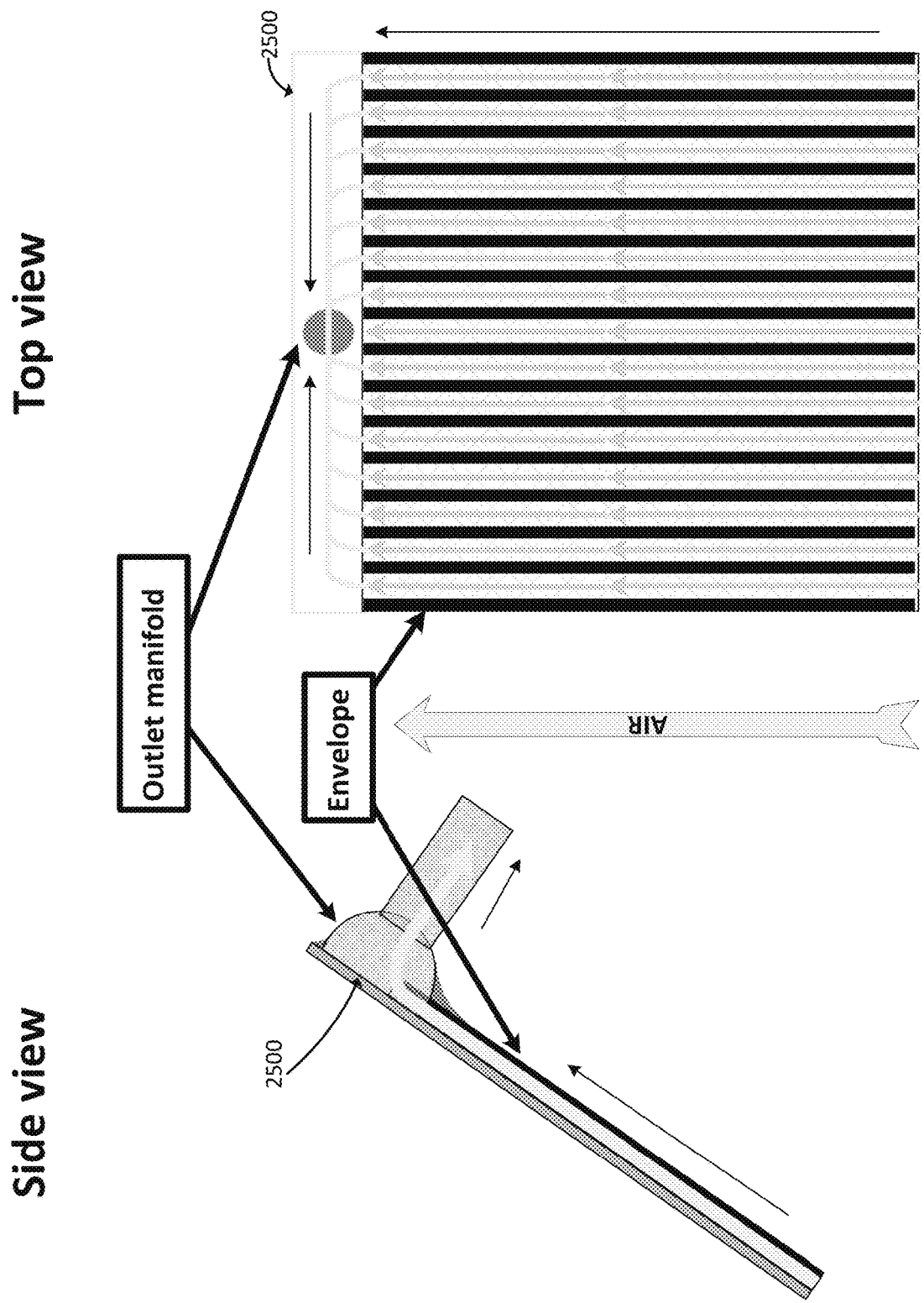
FIG. 25 is a schematic diagram of fluid flow through the thin heat exchanger and into the envelope outlet, according to example embodiments of the disclosure.
Figure 26:
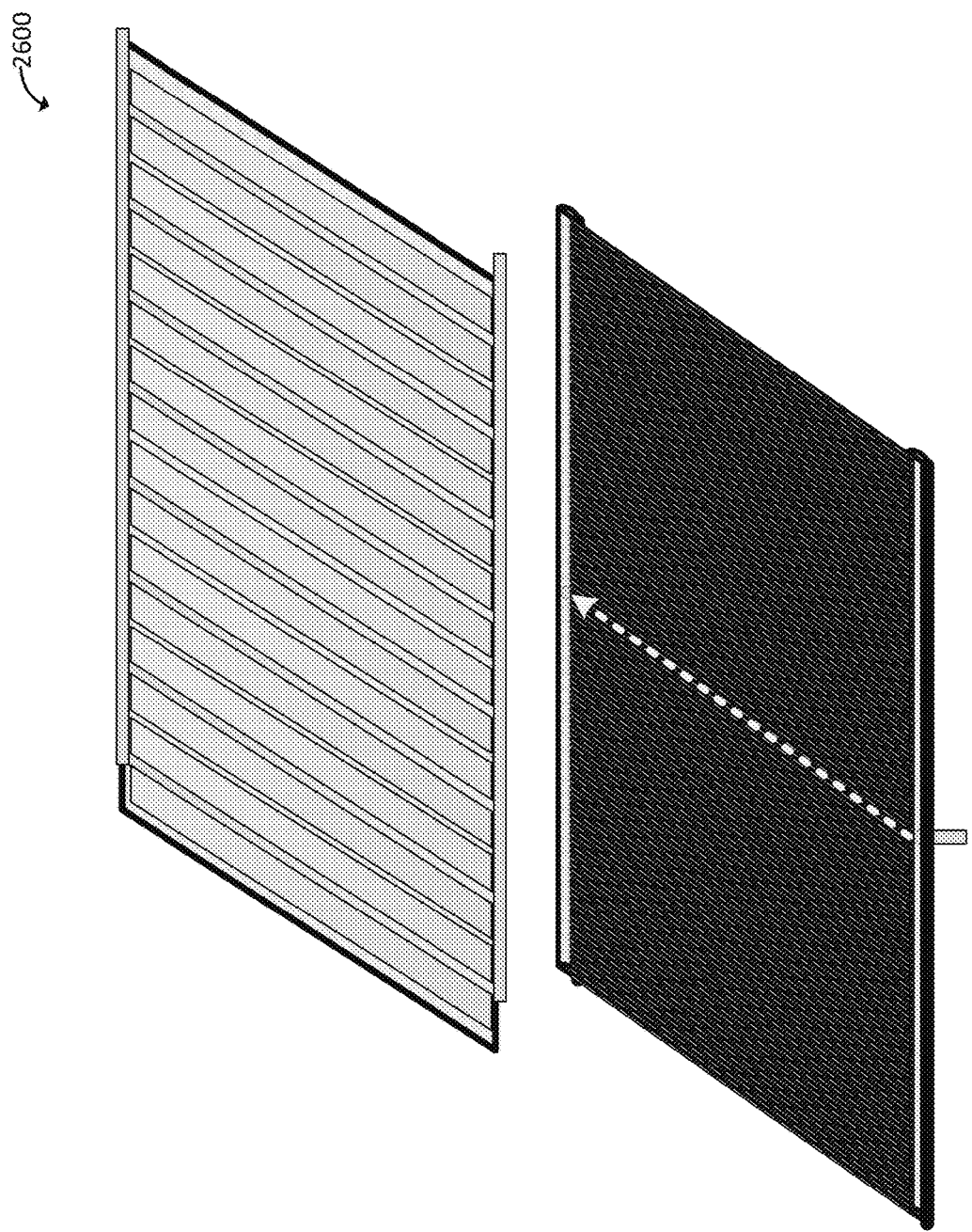
FIG. 26 is a schematic diagram of a partially exploded view of the thin heat exchanger, according to example embodiments of the disclosure.

FIG. 24 is a schematic diagram of fluid flow through a thin heat exchanger 2400, according to example embodiments of the disclosure. FIG. 25 is a schematic diagram of fluid flow through a thin heat exchanger 2500 and into the envelope outlet, according to example embodiments of the disclosure. FIG. 26 is a schematic diagram of a partially exploded view of the thin heat exchanger 2600, according to example embodiments of the disclosure.

When conditions are right for heat exchange, the self-priming suction pump may draw air from the outlet manifold at the top of the envelope. After the majority of air has been drawn out of the envelope, the suction may lift a column of coolant from the storage tank to the inlet manifold. As the coolant enters the horizontal inlet manifold, it seeks level, thus spreading evenly across the width of the inlet manifold interior trough.

Next the coolant will be drawn from the inlet manifold in to a plurality of tiny channels exposed at the bottom of the envelope. Once in the envelope channels, the coolant will seek level and the path of least flow resistance from bottom to top. If one of the envelope channels fills more than others, the weight of the associated coolant column will increase, thus adding flow resistance to the bottom-up coolant flow for that channel. This will cause coolant flow to prefer other channels with a shorter coolant column and less flow resistance. This effect will result in a self-regulating coolant flow leveling mechanism, thus ensuring relatively uniform coolant flow and/or convection heat exchange through each of the envelope channels of the thin heat exchanger.

The coolant columns will rise to the top of the envelope and spill in to the outlet manifold. Once inside the outlet manifold the coolant will flow towards the outlet pipe, suction pump and back to the coolant storage tank, thus completing the flow cycle.

Figure 27:
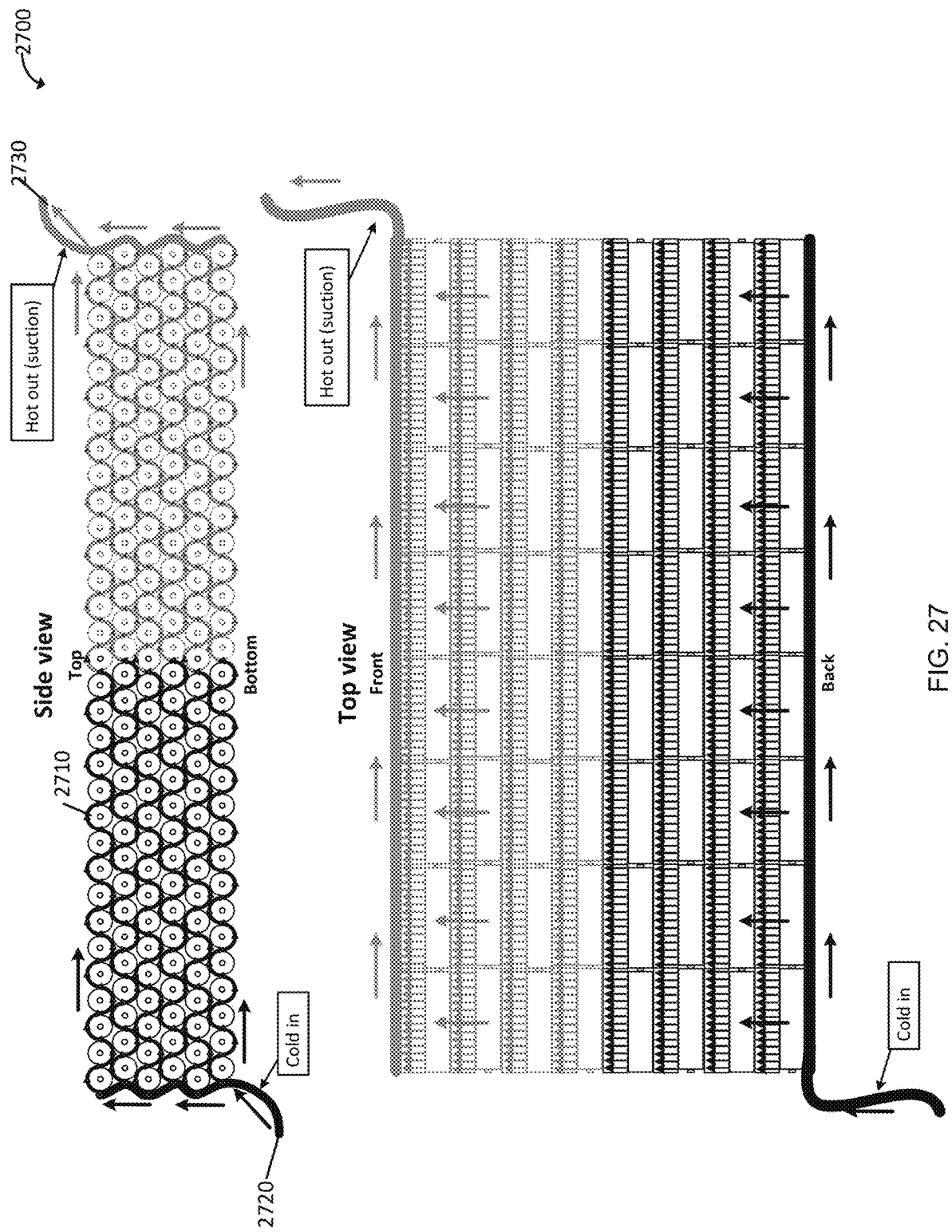
FIG. 27 is a schematic diagram of an example heat exchanger provided to collect thermal energy from a bank of batteries, according to example embodiments of the disclosure.
Figure 28:
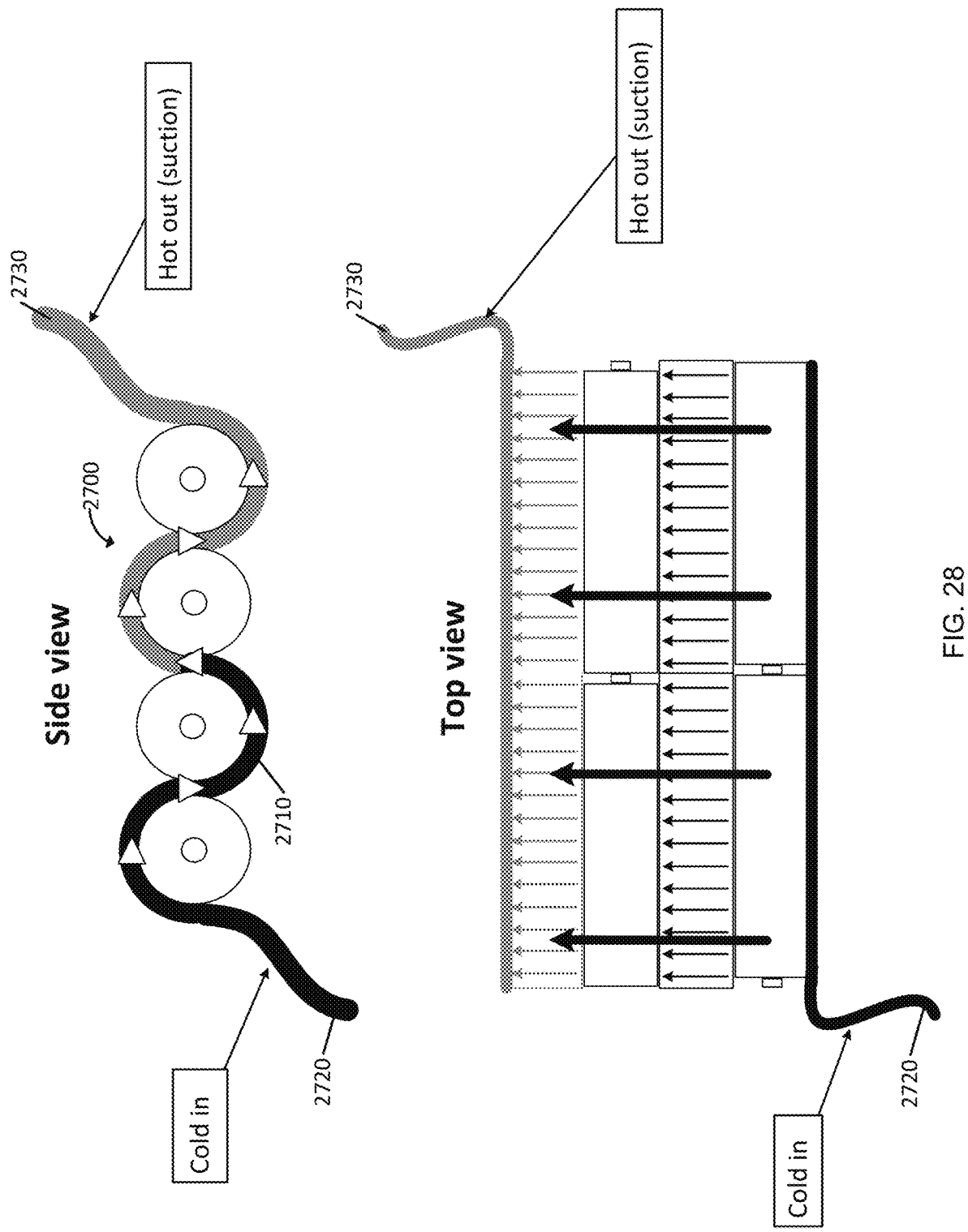
FIG. 28 is a schematic diagram of a close-up view of the example heat exchanger provided to collect thermal energy from the bank of batteries, according to example embodiments of the disclosure.

FIG. 27 is a schematic diagram of an example environment 2700 with a heat exchanger 2710 provided to collect thermal energy from a bank of batteries, according to example embodiments of the disclosure. FIG. 28 is a schematic diagram of a close-up view of the example heat exchanger 2710 provided to collect thermal energy from the bank of batteries, according to example embodiments of the disclosure.

Modern electric and hybrid vehicles contain powerful battery stacks, often exceeding 400 v and 90 kWh. These battery stacks are typically composed of hundreds of individual cells of various chemistries, each with thermal limitations and cooling requirements. If these batteries run hot, their useful and reliable service time may be reduced. If these batteries overheat, insulators melt, electrodes short, electrolytes boil and explosive chain reactions between adjacent cells can occur. To prevent this, traditional heat exchanger technology is used to draw battery heat through cooling fins to coolant circulated at relatively high volumes and pressures. These systems are limited by aforementioned factors associated with heat conduction distance, high volume and pressure pumping and relatively low heat exchange efficiency. The need for heavy piping and pumps to handle high volume and pressures also increases the weight of the battery pack, thus making the vehicle less efficient.

Thin heat exchangers are compact and flexible because the coolant flow is under suction, rather than under pressure. This attribute allows battery stack designers to wrap thin heat exchangers around and between cells, thus maximizing cooling without increasing cost, weight or efficiency. Cold coolant may enter the heat exchanger through inlet 2720 and hot coolant may exit via outlet 2730, according to example embodiments of the disclosure.

In this application, the thin heat exchanger collects heat from both sides. Two thin metal sheets are the heat exchange layers, and a slotted separator may be used to form the envelope between them. The metal sheet outer surfaces (facing the shell of the batteries) are used as the outer heat exchange surfaces and the inside surfaces (facing the slotted separator) are used as the envelope heat exchanger surfaces.

Figure 29:
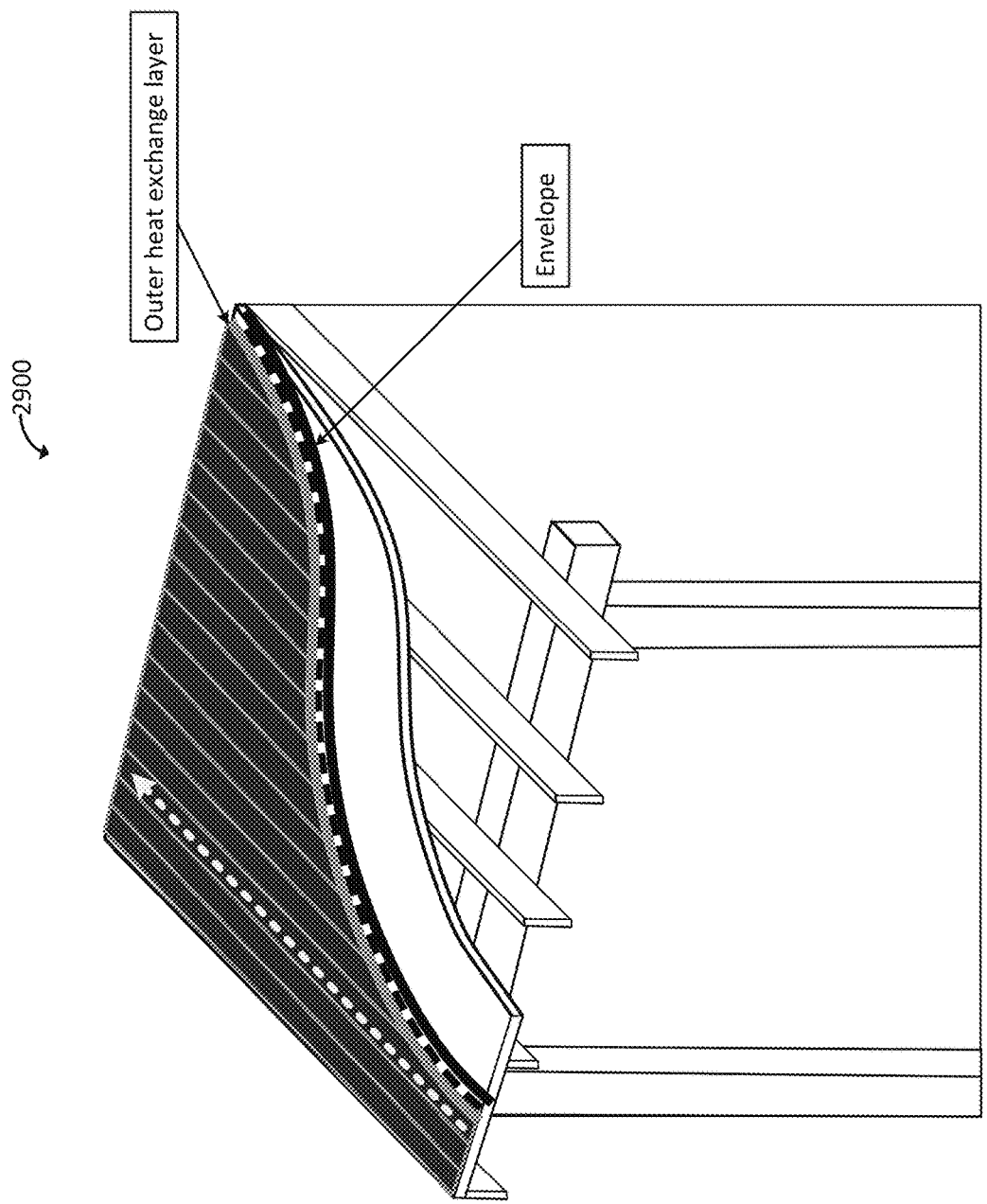
FIG. 29 is a schematic diagram of an example heat exchanger provided to collect thermal energy from a metal roof, according to example embodiments of the disclosure.

FIG. 29 is a schematic diagram of an example environment 2900 with a heat exchanger provided to collect thermal energy from a metal roof, according to example embodiments of the disclosure. A metal roof is a relatively large and available surface area to collect, insulate and radiate heat. South-, east- and west-facing metal roof surfaces are heated by the sun during the day in the northern hemisphere. These surfaces get so hot that extra ventilation and insulation is typically required to dissipate and block heat conduction that can damage roofing materials, overheat covered spaces and overload traditional air conditioning systems. Significant energy and material cost is therefore applied to dissipate metal roof waste heat to the outside air.

Thin heat exchangers may be applied to withdraw and reuse metal roof waste heat during the day. Heat-conducting liquid flow (convection) draws heat away from the roof surface and therefore away from other surfaces (for example roofing materials or rooms) below. The need for bulky ventilation and insulation is therefore reduced.

Thin heat exchangers can also be used to dissipate (radiate) excess waste heat (from air conditioners, for example) on shaded roof surfaces side during the day, and over all roof surfaces (very large surface area) after sunset. In cold climates, thin heat exchangers can also be used to melt (and therefore remove) snow from metal roofs, by using the thin heat exchangers as a radiator. In this application, the sky-facing side of the metal roof is used as the outer heat exchange layer surface and the underside is used as the envelope heat exchange layer surface.

Figure 30:
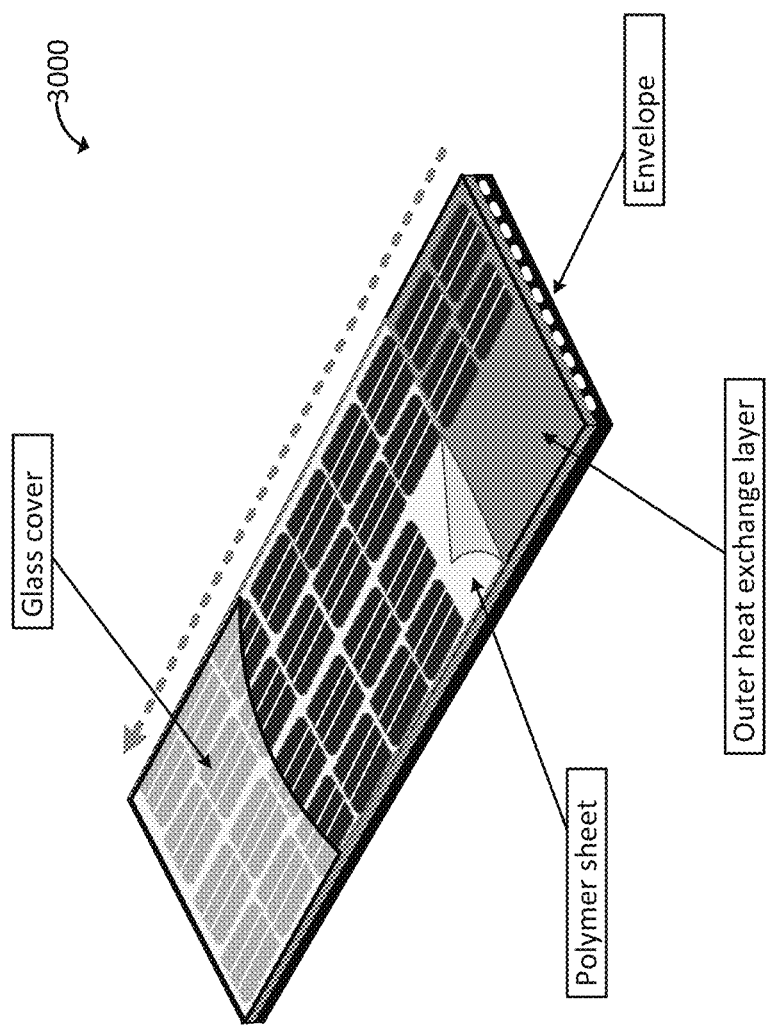
FIG. 30 is a schematic diagram of an example heat exchanger provided to collect thermal energy from a side of a photovoltaic panel, according to example embodiments of the disclosure.

FIG. 30 is a schematic diagram of an example environment 3000 with a heat exchanger provided to collect thermal energy from the underside of a photovoltaic (PV) panel, according to example embodiments of the disclosure. PV panels convert sunlight to electric current and heat. Tests indicate that a typical PV panel collects three times as much heat energy (in Watts) as electric Watts. Silicon PV cells become less efficient as they heat, which means the hotter they get, the less electrical energy they generate. For this reason, much of the traditional PV panel design and installation is optimized to dissipate waste heat to the outside air. Heavier heat-conductive glass is used on the cover, a relatively heavy metallic panel frame is used to create an air flow gap and installation requires an additional metal mounting frame to maintain an air flow gap under the solar electric panels. These factors lead to a relatively bulky and expensive PV panel installation.

Thin heat exchangers are applied to withdraw and reuse PV panel waste heat during the day. Heat-conducting liquid flow (convection) draws heat away from the PV panel back surface and therefore away from the silicon photovoltaic cells. The silicon photovoltaic cells run cooler and are therefore more efficient. The need for bulky panel frames, ventilation and mounting frames is also reduced.

Thin heat exchangers can also be used to dissipate (radiate) waste heat (from air conditioners, for example) on shaded PV panels during the day, and over all PV panels (very large surface area) after sunset. In cold climates thin heat exchangers can also be used to melt (and therefore remove) snow from PV panels. In this application the sky-facing side of the PV panel backing material is used as the outer heat exchange layer surface and the underside is used as the envelope heat exchange layer surface.

It will be appreciated that the application of the thin heat exchanger, as described herein, to PV panels may enhance energy collection efficiency in two ways simultaneously. First, the thin heat exchanger may cool down the PV panel so that the optical to electrical energy collection of the PV panel is improved; and, second, the thin heat exchanger may collect thermal energy while the PV panel collects optical to electrical energy.

In PV panel applications, the thin heat exchanger, according to example embodiments, may be constructed in an integrated fashion with the PV panel. For example, the envelope of the thin heat exchanger may be formed directly on the backside of the PV panel, where the PV panel itself serves at the heat conduction layer. In other words, an envelope with coolant conduction channels may be formed on the backside of a PV panel, and an inlet manifold may be attached to a first side of the PV panel, and an outlet manifold may be attached to a second side opposing the first side of the PV panel.

In some example embodiments, a curable epoxy material may be deposited and molded on a backside of a PV panel. The molding of the epoxy may form the ridges defining the coolant conduits therebetween, and after forming the ridges, the epoxy may be cured. The curing may be any suitable process, such as a thermal treatment, an ultra-violet light treatment, or indeed any type of treatment that may promote cross-linking of the epoxy material. Once the ridges are formed, a rubber mat or similar material may be attached thereon to form the envelope on the backside of the PV panel. Next, the inlet and outlet manifolds may be attached to the envelope and PV panel.

Figure 31:
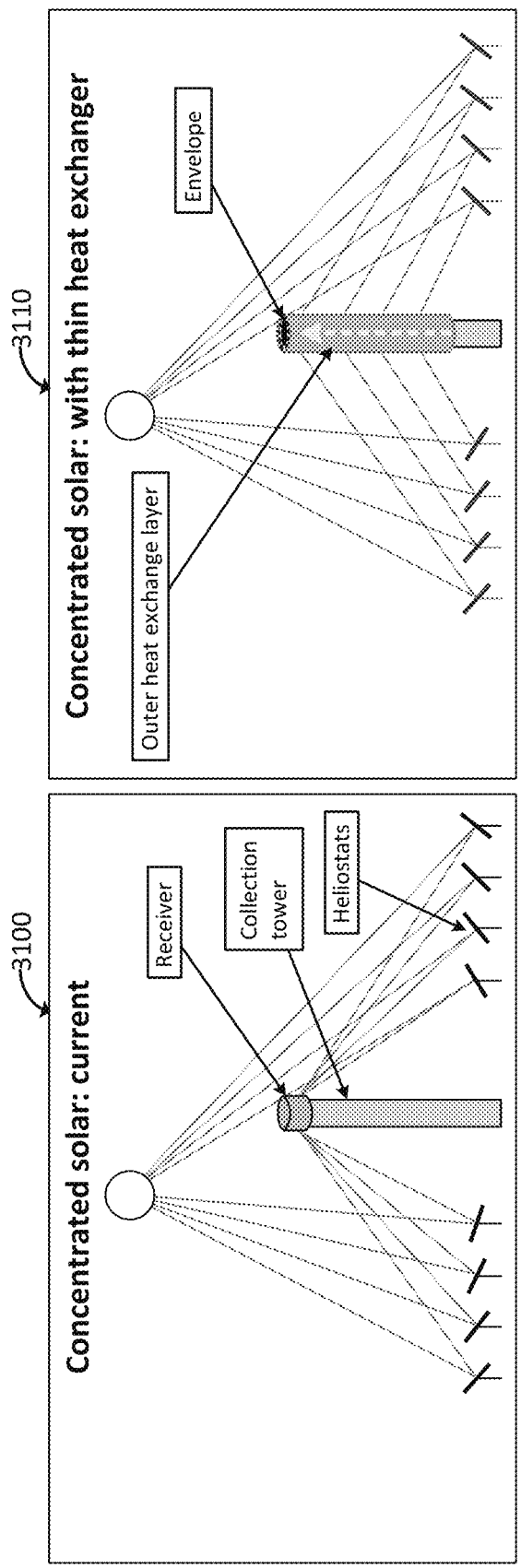
FIG. 31 is a schematic diagram of an example environment with a concentrated solar heat collector and an example environment with a thin heat exchanger provided to collect thermal energy from a concentrated solar-thermal collector, according to example embodiments of the disclosure.

FIG. 31 is a schematic diagram of an example environment 3100 with a concentrated solar heat collector and an example environment 3110 with a thin heat exchanger provided to collect thermal energy from a concentrated solar-thermal collector, according to example embodiments of the disclosure.

Concentrated solar installations use a large array of heliostats, or mirrors that track the sun, to reflect sunlight towards a receiver at the top of a central collection tower. The concentrated radiation is used to heat a liquid which is used to create steam. The steam is passed through a traditional steam turbine generator to create electricity. This configuration creates a very hot spot at the top of the tower. The receiver must be built to withstand extremely high temperatures and, in some cases, thermal and cost efficiency are reduced. The concentrated radiation is also hazardous to birds that can catch fire if they fly through the concentrated light beam. These factors lead to a relatively expensive and environmentally-impacting concentrated solar installation.

Thin heat exchangers are applied to the outer surface of the collection tower, from bottom to top. The inner ring of heliostats reflect sunlight towards the base of the tower and the outer ring of heliostats reflect sunlight towards the top of the tower. The coolant (molten salts, water, etc.) will progressively gain heat as it is drawn up the surface of the tower. In this case, the energy collection capacity from the inner rings of heliostats will be improved since the reflection angles (to lower portions of the tower) are closer to perpendicular. The use of a vertically distributed (versus single spot) focal point will reduce the probability of a single location with enough radiation to injure birds. In this application, the outer heliostat-facing side of the collection tower surface material is used as the outer heat exchange layer surface and the inside is used as the envelope heat exchange layer surface.

Figure 32:
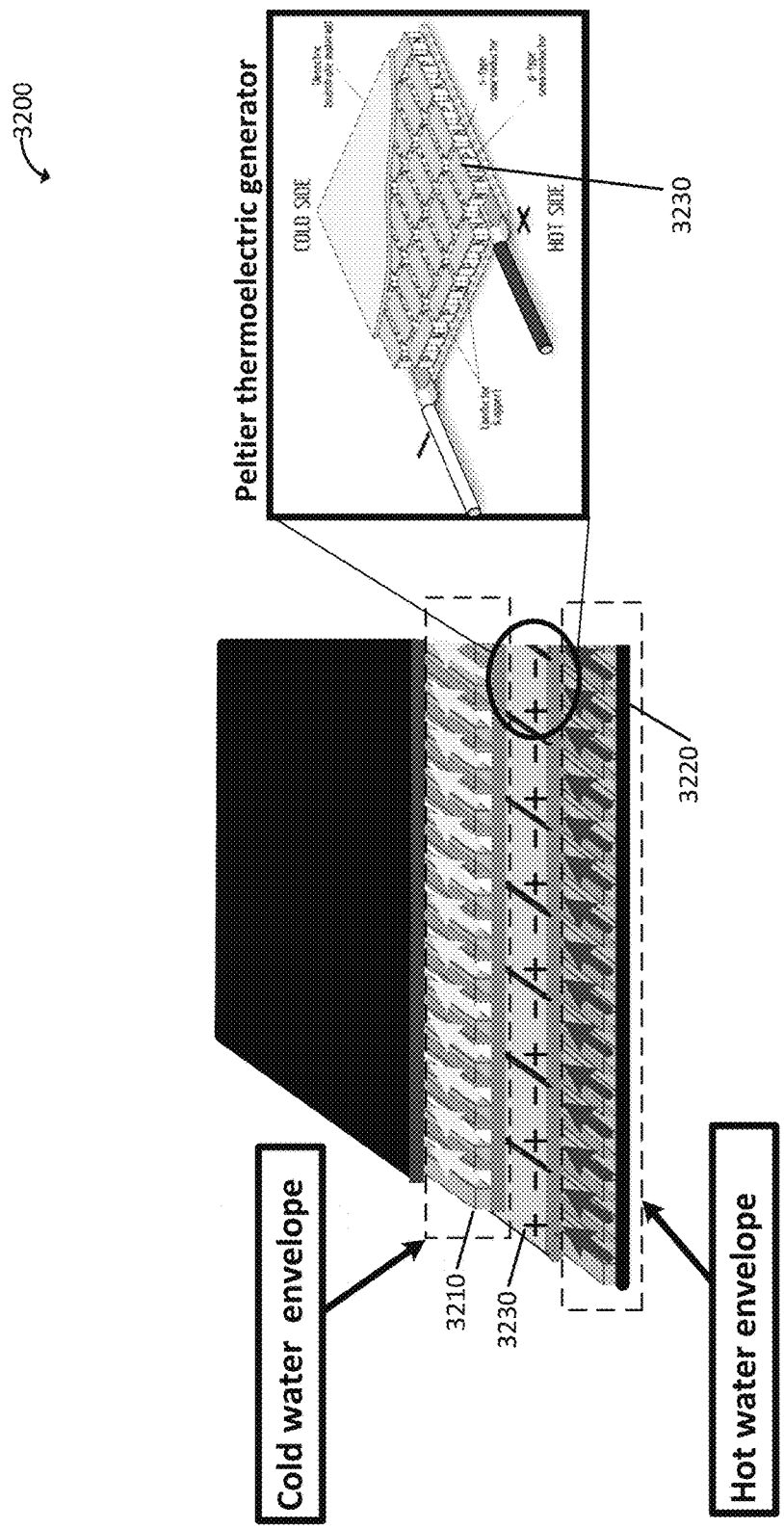
FIG. 32 is a schematic diagram of an example thin heat exchanger with a Peltier thermoelectric generators, according to example embodiments of the disclosure.

FIG. 32 is a schematic diagram of an example thin heat exchanger with a Peltier thermoelectric generator, according to example embodiments of the disclosure. By inserting a Peltier device between envelopes with a temperature differential, an electrical current may be directly generated. In example embodiments, one envelope may carry heated fluid, and another envelope may carry cold or unheated fluid to provide a temperature differential from which the Peltier device can harvest thermal energy and convert the same to electrical energy.

Figure 33:
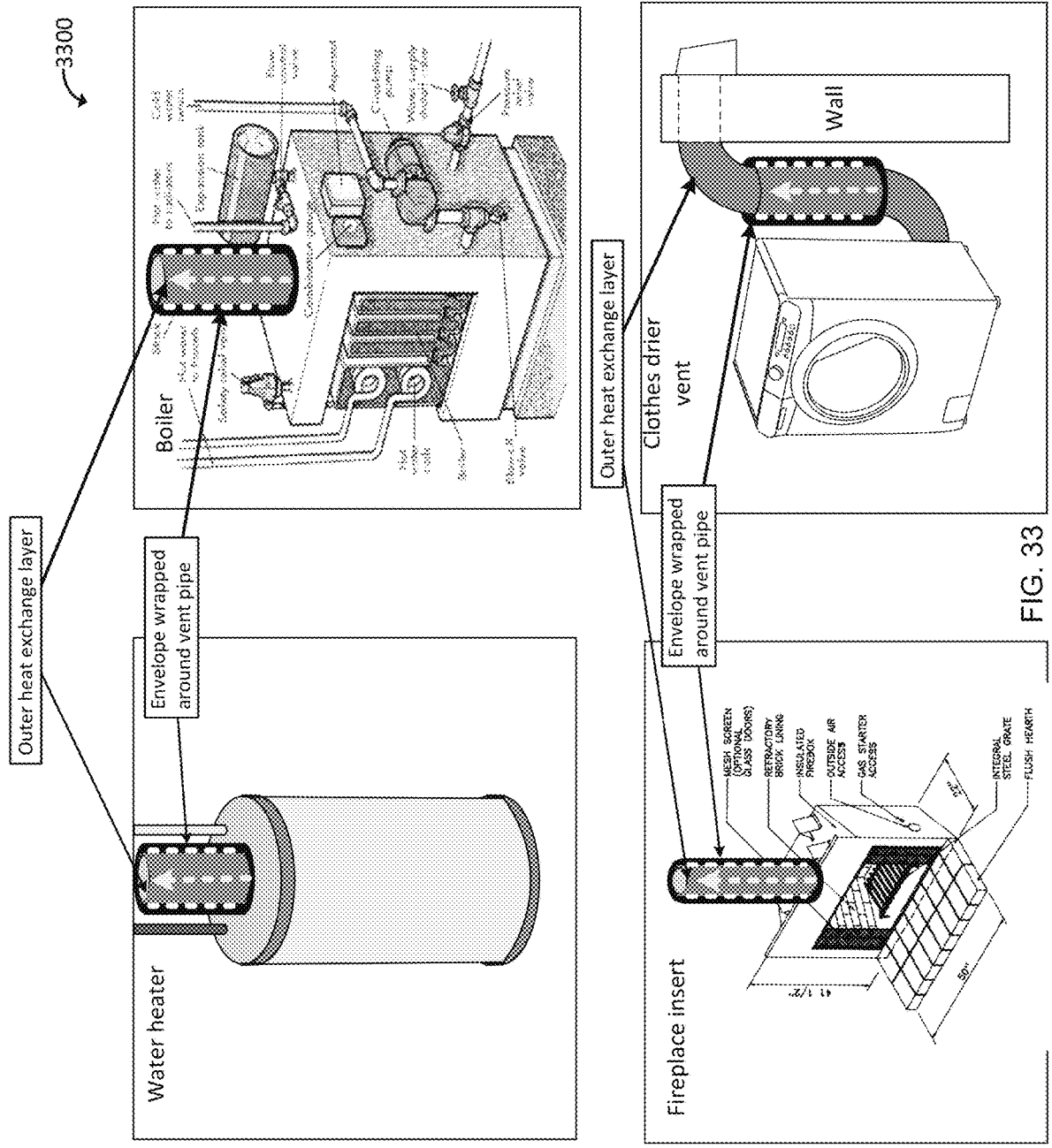
FIG. 33 is a schematic diagram of an example heat exchanger provided to collect thermal energy from a variety of household thermal appliances and/or conduits, according to example embodiments of the disclosure.

FIG. 33 is a schematic diagram of an example heat exchanger provided to collect thermal energy from a variety of household thermal appliances and/or conduits, according to example embodiments of the disclosure. Many home or commercial buildings contain mechanical appliances which create waste heat in the form of hot air which will be exhausted to the exterior of the building. Examples include water heaters, boilers, fireplace inserts and clothes driers. These appliances vent waste air through metal vent pipes or ducts.

Thin heat exchangers are applied to withdraw and reuse waste heat from the hot exhaust air when these appliances are running. In this application, the inside of metal vent pipes or ducts is used as the outer heat exchange layer surface and the outside is used as the envelope heat exchange layer surface.

Figure 34:
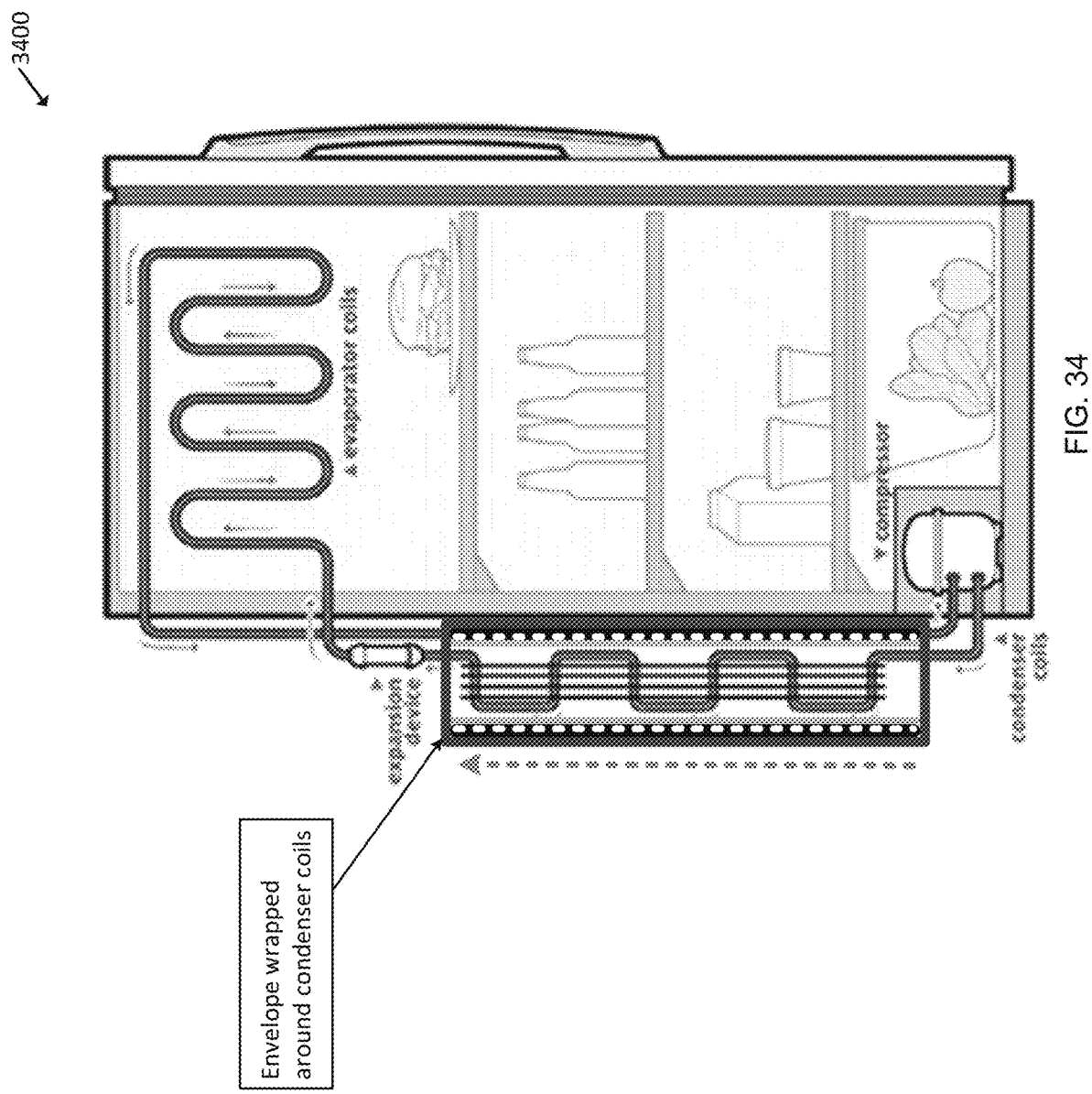
FIG. 34 is a schematic diagram of an example heat exchanger provided to collect thermal energy from a refrigerator, according to example embodiments of the disclosure.

FIG. 34 is a schematic diagram of an example environment 3400 with a heat exchanger 3400 provided to collect thermal energy from a refrigerator, according to example embodiments of the disclosure. Many home or commercial buildings contain refrigeration appliances which withdraw heat from a cooled space using evaporator coils and dissipate waste heat using condenser coils. In these cases, the condenser waste heat is dissipated via relatively inefficient air convection to the surrounding area. Refrigeration compressors run longer (thus using more electricity) if the condenser coil waste heat is not shed efficiently. This waste heat is also dissipated over a relatively small area, thus making the surrounding room hotter than most others in the building. In this case, other refrigeration devices (air conditioners) may be required to cool the room surrounding the refrigerator.

Thin heat exchangers are applied to withdraw and reuse waste heat from the condenser coils when these appliances are running. Thin heat exchangers and refrigerator condenser coils are enclosed within an insulated envelope, thus allowing the thin heat exchangers to collect most of the waste heat from the condenser coils and associated refrigeration process. This envelope may be filled with air or (for most efficient operation) water or other coolant with high heat conductivity.

In this application, the thin heat exchanger collects heat from both sides. Two thin metal sheets are the heat exchange layers, and a slotted separator is used to form the envelope between them. The metal sheet outer surfaces (facing the warm air inside the envelope) are used as the outer heat exchange surfaces and the inside surfaces (facing the slotted separator) are used as the envelope heat exchanger surfaces.

Figure 35:
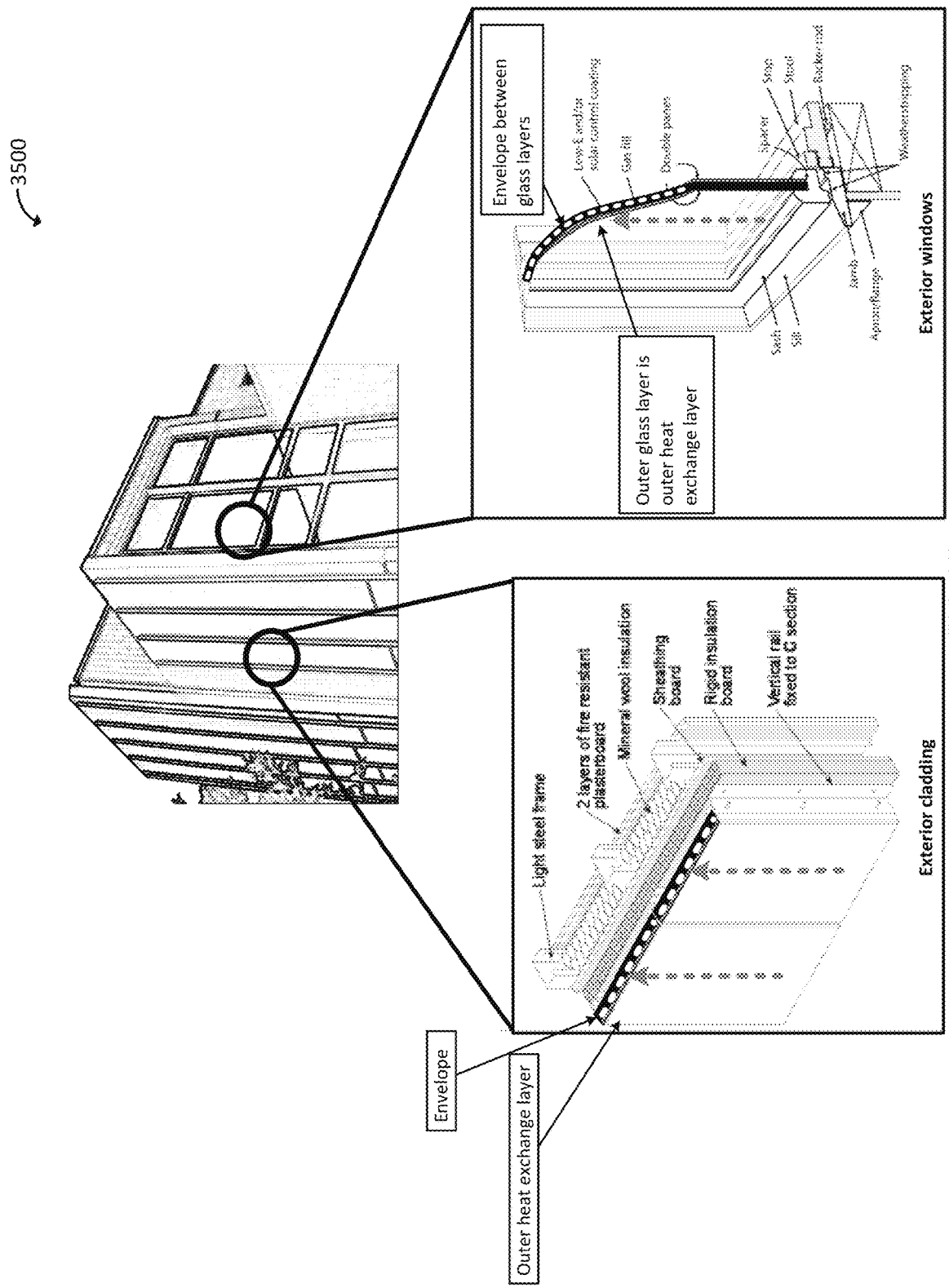
FIG. 35 is a schematic diagram of an example heat exchanger provided to collect thermal energy from building exteriors, according to example embodiments of the disclosure.

FIG. 35 is a schematic diagram of an example environment 3500 with a heat exchanger provided to collect thermal energy from building exteriors, according to example embodiments of the disclosure. Metal and glass cover significant portions of the exterior surface of many buildings including skyscrapers with lots of surface area. Sun-facing metal cladding gets very hot and typically requires layers of air gaps and insulation to dissipate waste heat and prevent overheating of interior spaces. Likewise, windows are typically double-paned and tinted to prevent overheating of interior spaces.

Applied to cladding, thin heat exchangers provide a form of controllable and adaptable convection insulation. Thin heat exchangers are applied to withdraw, reuse and radiate waste heat from the external metal and glass cladding. This technique may also reduce the need for layers of traditional insulation, thus reducing bulk and cost. On hot sunny days, thin heat exchangers can be used to remove, store, reuse or dissipate otherwise wasted cladding heat with less need for bulky and expensive insulation. On cool days, thin heat exchangers can be used to harvest and redistribute cladding heat from warm to cool spaces. In other cold-weather applications thin heat exchangers can be disabled (no water flow) to allow solar heat to conduct directly from the exterior to interior rooms that need warming.

For metal cladding applications, the outside of metal cladding is used as the outer heat exchange layer surface and the inside is used as the envelope heat exchange layer surface. For double-paned windows the outside pane of glass is used as the outer heat exchange layer surface and the inside is used as the envelope heat exchanger surface.

Figure 36:
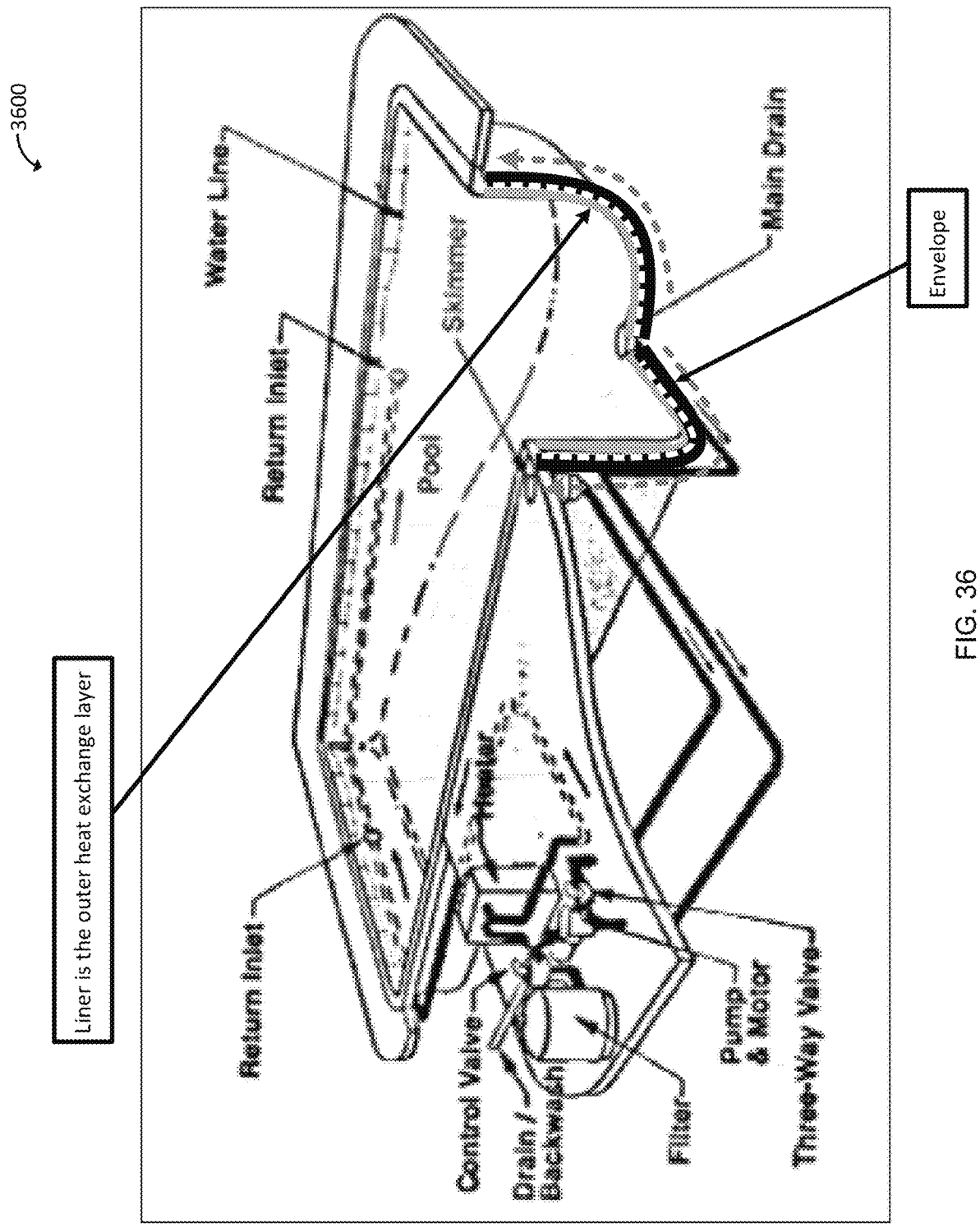
FIG. 36 is a schematic diagram of an example heat exchanger provided to collect thermal energy from a swimming pool, according to example embodiments of the disclosure.

FIG. 36 is a schematic diagram of an example an example environment 3600 with a heat exchanger provided to transfer thermal energy to a swimming pool, according to example embodiments of the disclosure. Prior examples describe use of thin heat exchangers to collect otherwise wasted heat from warm surfaces when the sun is shining. Ideally all of this collected heat is stored and reused for other purposes including heating in rooms and during times where/when the sun is not shining. During the sunny and hot days of summer more heat may be collected than can be reused within a day. This is especially likely if air conditioners (heat pumps) are also dumping heat to the system. In this case, system temperatures will increase day over day and collection efficiency will degrade. One way to prevent system overheating is to use thin heat exchangers to radiate surplus heat in a swimming pool. In this application, the inside (water side) of the rubber pool liner is used as the outer heat exchange layer surface and the outside (soil side) is used as the envelope heat exchange layer surface.

Figure 37:
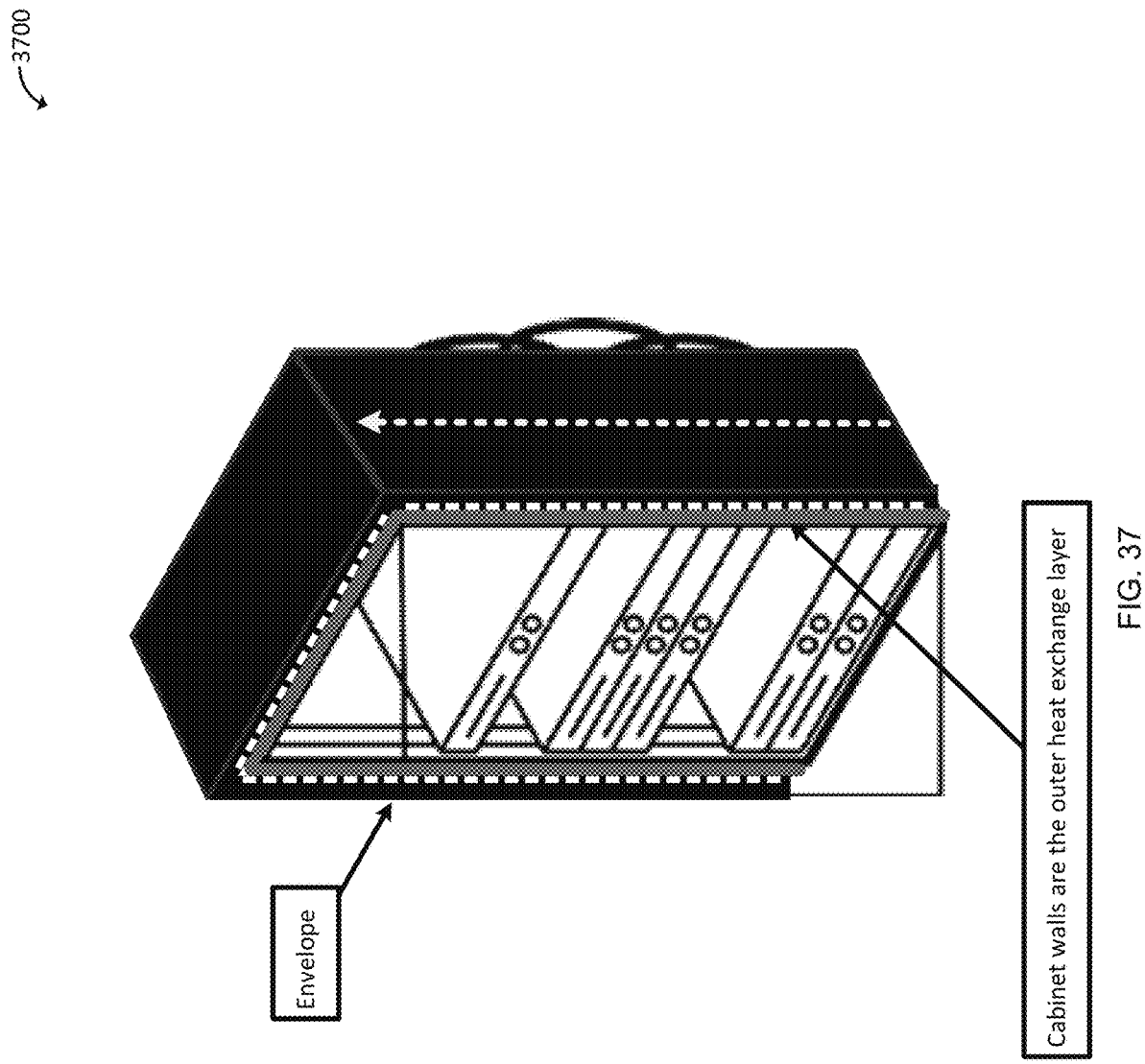
FIG. 37 is a schematic diagram of an example heat exchanger provided to collect thermal energy from a server, according to example embodiments of the disclosure.

FIG. 37 is a schematic diagram of an example an example environment 3700 with a heat exchanger provided to collect thermal energy from a computer server, according to example embodiments of the disclosure. Over 40% of the energy used in industrial data centers is for cooling. Air cooled server cabinets contain lots of air-cooled computer processors which generate huge amounts of heat. These cabinets vent their hot air into the data center room and powerful air conditioners are used to chill and return this air for recirculation to the server cabinets. This process is relatively inefficient since it depends upon air as the convection heat exchange medium. Air is a relatively poor heat conductor. Huge volumes of air will be circulated by noisy and power-hungry air handlers (e.g., fans) to provide adequate convection cooling for the computer processors.

Thin heat exchangers can be used to efficiently collect waste heat from the outer shell of the server rack, thus reducing the amount of heat to be withdrawn by relatively inefficient air convection. In this case, some air convection is still required to move heat between the air-cooled computer processors and the server rack shell, but the distance is shorter and heat conductivity (between heat source and heat destination) is improved. In this application, the inside of the server rack cabinet is used as the outer heat exchange layer surface and the outside is used as the envelope heat exchange layer surface.

Figure 38:
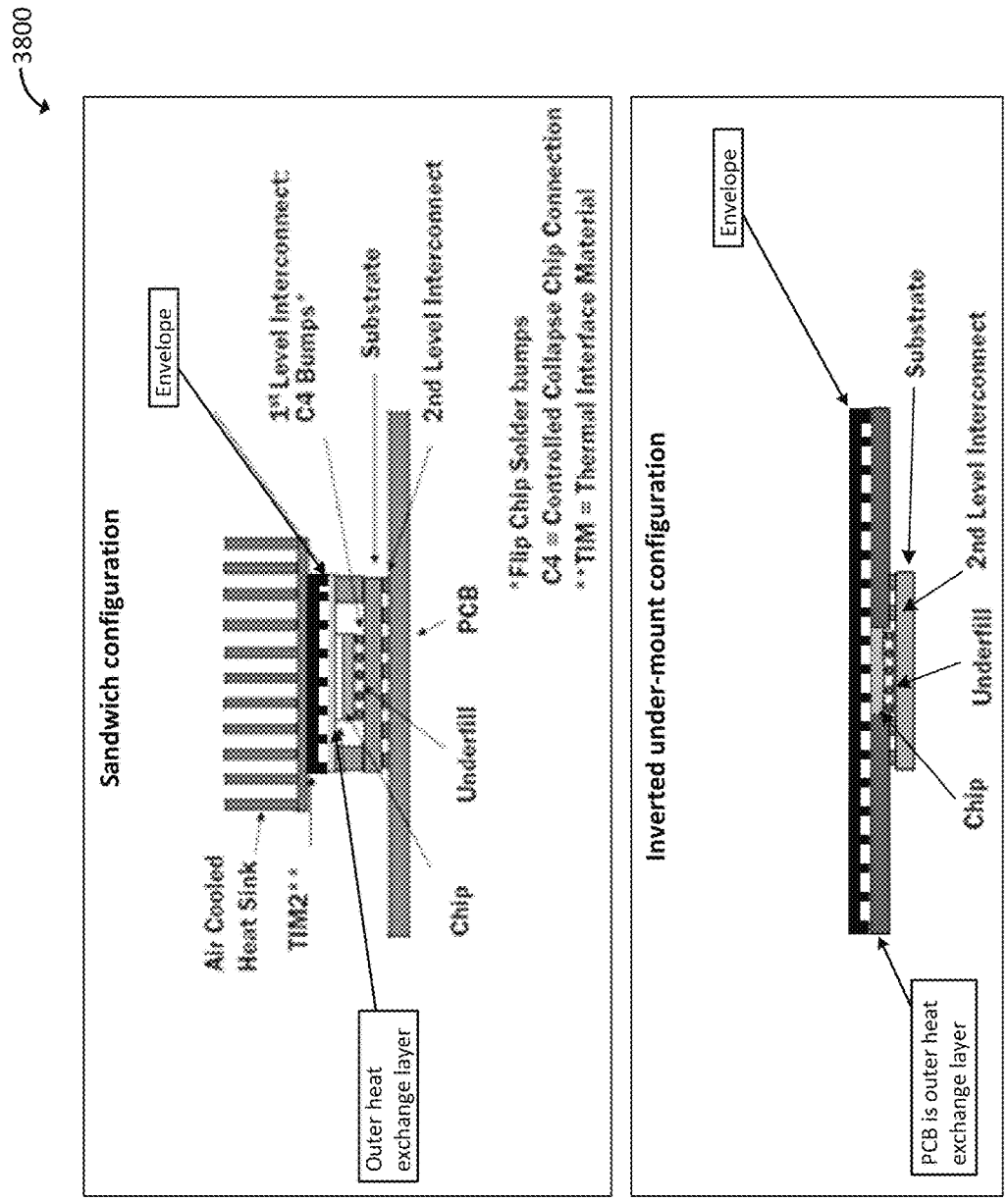
FIG. 38 is a schematic diagram of an example heat exchanger provided to collect thermal energy from a semiconductor device, according to example embodiments of the disclosure.

FIG. 38 is a schematic diagram of an example an example environment 3800 with a heat exchanger provided to collect thermal energy from a semiconductor device, according to example embodiments of the disclosure. In the prior data center server cabinet example, some air convection is required to move heat from the air cooled computer processors to the liquid-cooled server rack shell. This implementation is useful for existing processors and server racks, but even more efficient cooling (and heat harvesting) is possible if the thin heat exchanger has a direct physical connection to the processor heat sink surface. A number of configuration options are possible for this thin heat exchanger application.

One incremental configuration option is to sandwich the thin heat exchanger between the existing computer processor and the existing air heat sink. In this application, a thin heat conductive sheet (aluminum) is attached to the hot electronic component surface with thermal conduction adhesive. The outside of the heat conductive sheet (attached to the electronic component hot surface) is used as the outer heat exchange layer surface and the inside of the heat conductive sheet is used as the envelope heat exchange layer surface.

Another more aggressive configuration option is to invert the circuit board (component side down so heat rises to the board) and use the non-component side of the circuit board as the heat exchange layer. In this case the hot components are attached to the circuit board with heat-conductive adhesive. The component side (underside) of the circuit board is the outer heat exchange layer surface and the non-component side (topside) of the circuit board is the envelope heat exchanger surface. In this case the non-component side of the circuit board will be coated with a waterproof yet heat-conductive film over which cooling liquid will be drawn.

Figure 39:
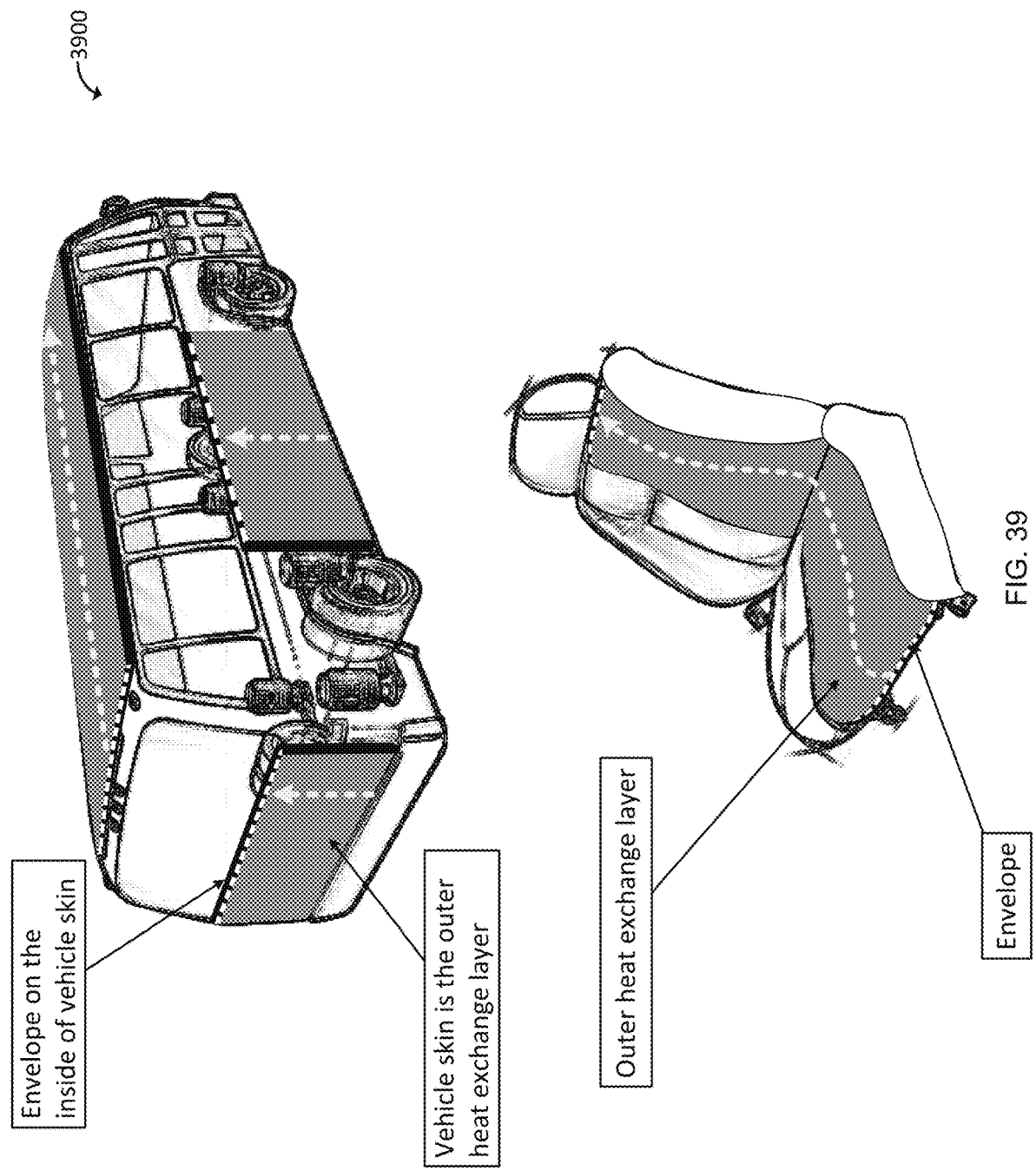
FIG. 39 is a schematic diagram of an example heat exchanger provided to collect thermal energy from various components of a vehicle, according to example embodiments of the disclosure.

FIG. 39 is a schematic diagram of an example an example environment 3900 with a heat exchanger provided to collect thermal energy from various components of a vehicle, according to example embodiments of the disclosure. A considerable amount of energy is used to cool and heat vehicles. This is especially true on sunny days where solar heat is built up on vehicle outer surfaces (e.g., roof and windows) and radiated to the inside of the vehicle. In these cases, air conditioners are used to draw heat from the interior via air convection (e.g., evaporators, blowers, and vents) and dissipate this heat to the outside via air convection (e.g., compressors, condensers, and fans). As mentioned previously, air convection is relatively noisy, bulky, and inefficient mechanism to move heat around. Additionally, the noise from blowers may lead to hearing loss for people in the vicinity of the blowers.

Thin heat exchangers provide an efficient mechanism to move heat around vehicles without adding significant weight, bulk, noise, or cost. In warm climates, thin heat exchangers can be used to efficiently collect waste heat from the sunny side(s) of the vehicle shell and dissipate this heat on the shady side(s) of the vehicle shell. In this application, the thin heat exchangers are used to transfer heat around (as opposed to through) the vehicle interior via air convection, thus reducing the air conditioner load and conserving energy. In cold climate applications, thin heat exchangers can be used to collect heat from the sunny rooftop and radiate this otherwise wasted heat from thin heat exchangers in the seats. This implementation could be especially useful for busses and trains plus hybrid and electric vehicles which have less engine waste heat to use for interior heating. Thin heat exchangers could also be used to dissipate drivetrain heat (batteries and electric motors) over the relatively large surface area of the vehicle shell.

In this application, the outside of the vehicle body (e.g., roof, hood, trunk lid, doors, or fenders) is used as the outer heat exchange layer surface and the inside is used as the envelope heat exchange layer surface. In addition to heat transfer the thin heat exchangers could provide some sound and vibration insulation for the interior of the vehicle.

Figure 40:
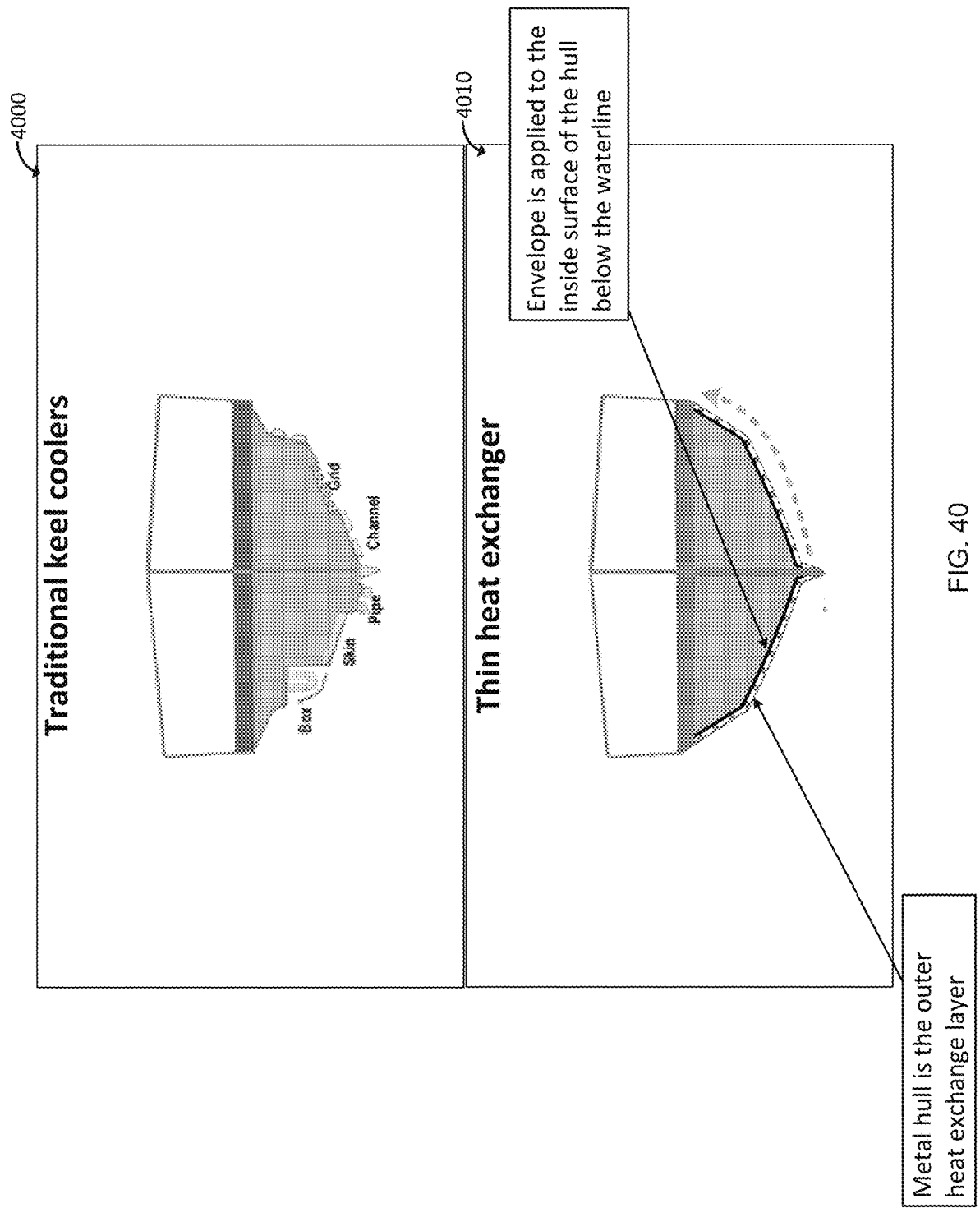
FIG. 40 is a schematic diagram of an example environment with a traditional keel cooler and an example environment with a heat exchanger provided to collect thermal energy from a boat and/or a ship, according to example embodiments of the disclosure.

FIG. 40 is a schematic diagram of an example environment 4000 with a traditional keel cooler and an example environment 4010 with a heat exchanger provided to collect thermal energy from a boat and/or a ship, according to example embodiments of the disclosure. Ships have many applications requiring heat transfer to the surrounding water. Examples include battery and motor cooling, refrigeration and air conditioning. Traditional heat exchange methods involve pumping large volumes of sea or lake water through one side of a heat exchanger with metal plates and another liquid or gas through the other side. The metal plates enable heat exchange without mixing between the two liquids. Another traditional cooling method is keel coolers which pump coolant through a heat exchanger applied to the hull exterior. These heat exchangers are bulky, expensive, and relatively inefficient due to the high pumping velocity and associated energy required to run the pumps. Additionally, keel coolers may introduce drag. The high pumping velocity is required to maximize heat exchange between two fluids with a relatively small heat exchange surface area between them. Maintenance is also a concern since sea water and associated contaminants are being pumped through relatively small orifices at high volumes and pressures.

Thin heat exchangers provide an efficient means to use the submerged portion of the metal ship hull as the outer heat exchange layer. The ship hull has a much larger surface area contacting the lake or sea water, and is able to transfer more heat at much lower pumping velocities.

In this application, the outer ship hull surface is used as the outer heat exchange layer surface and the inside ship hull surface is used as the envelope heat exchange layer. A non-corrosive heat exchange liquid (e.g., water+anti-freeze mix, for example) is drawn through the envelope on the inside of the hull surface at relatively low volume and associated energy use. There is no need to pump corrosive sea water through any internal heat exchange components so reliability and maintenance are also improved.

Figure 41:
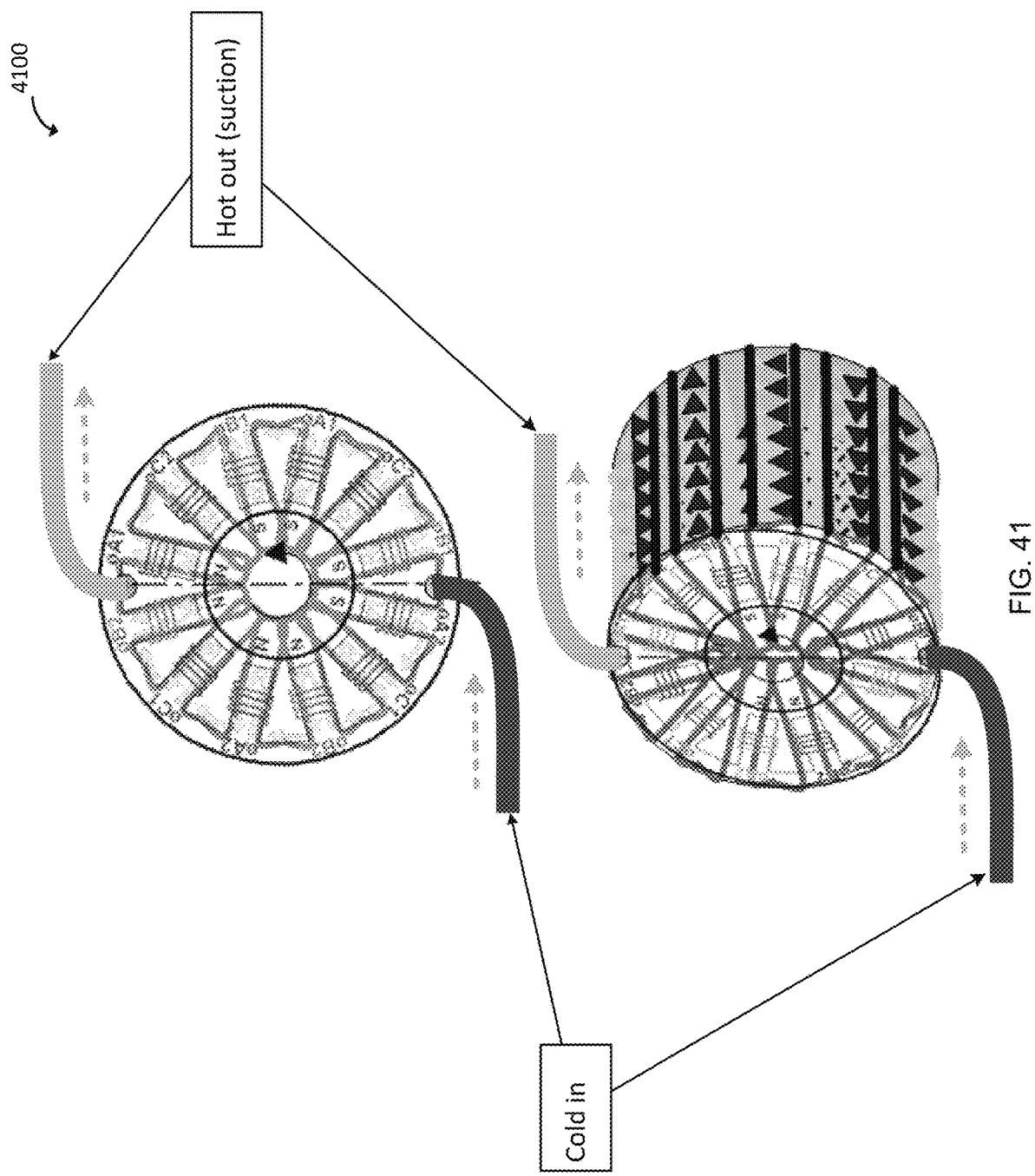
FIG. 41 is a schematic diagram of an example heat exchanger provided to collect thermal energy from a motor, according to example embodiments of the disclosure.

FIG. 41 is a schematic diagram of an example environment 4100 with a heat exchanger provided to collect thermal energy from a motor, according to example embodiments of the disclosure. Some modern electric and hybrid vehicles contain one to two AC induction motors producing over 380 bhp while consuming up to 280 kW each. As is the case with most electrical machines, these powerful motors create significant amounts of heat and lose efficiency and reliability if this heat is not controlled. Stator coils turn the rotor and wheels via alternating magnetic fields produced by powerful alternating current flows. The stator body is typically convection cooled by air, which is relatively inefficient. High current produces high heat and high heat increases resistance of the stator coils. This effect can reduce efficiency and also lead to motor failure and fire. For this reason, AC drive motors are often de-rated to stay well within operating ranges, thus reducing the power to weight ratio.

Thin heat exchangers are compact and flexible because the coolant flow is under suction (not pressure). This attribute allows AC drive motor designers to apply thin heat exchangers around the inside of the stator frame. Stator coils are wound around thin heat exchangers, thus maximizing cooling without increasing cost, weight or efficiency.

In this application, a thin non-ferrous metal sheet (aluminum) is the heat exchange layer. The metal sheet outer surface (facing the stator coils) is used as the outer heat exchange surface and the inside surface (facing the stator frame) is used as the envelope heat exchanger surface.

Figure 42:
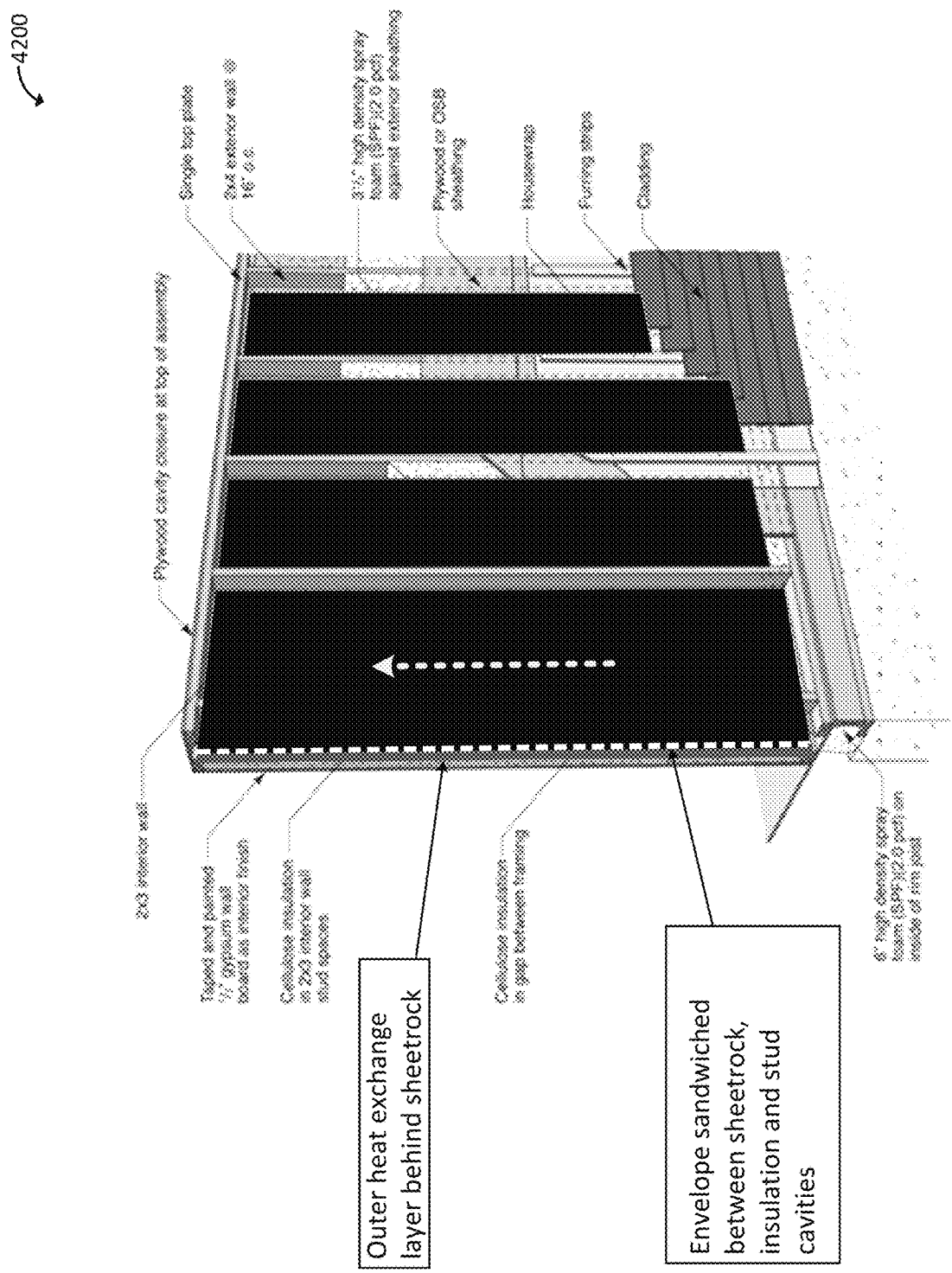
FIG. 42 is a schematic diagram of an example heat exchanger provided to collect thermal energy from building walls, according to example embodiments of the disclosure.

FIG. 42 is a schematic diagram of an example environment 4200 with a heat exchanger provided to collect thermal energy from building walls, according to example embodiments of the disclosure. Interior rooms are typically heated and cooled with radiators, air ducts and fans that throw or collect heat from a relatively small portion of the room surface area. This method depends upon relatively large volumes of water and air circulation to heat and cool room spaces evenly. High volume pumps and fans are expensive and consume energy. Radiators, air ducts and fans take up space and create noise.

Thin heat exchanger profile, flexibility and low cost allow for application with little to no aesthetic or cost impact. Thin heat exchangers can be applied to or behind interior wall and ceiling sheetrock, thus making nearly any room surface capable of radiating or collecting room heat. With improved efficiency, thin heat exchangers can radiate lots of heat with relatively low water flow volume, power and noise required.

In this application, a thin metal or plastic sheet is the heat exchange layer. The metal or plastic sheet outer surface (e.g., facing the room interior) is used as the outer heat exchange surface and the inside surface is used as the envelope heat exchanger surface.

Figure 43:
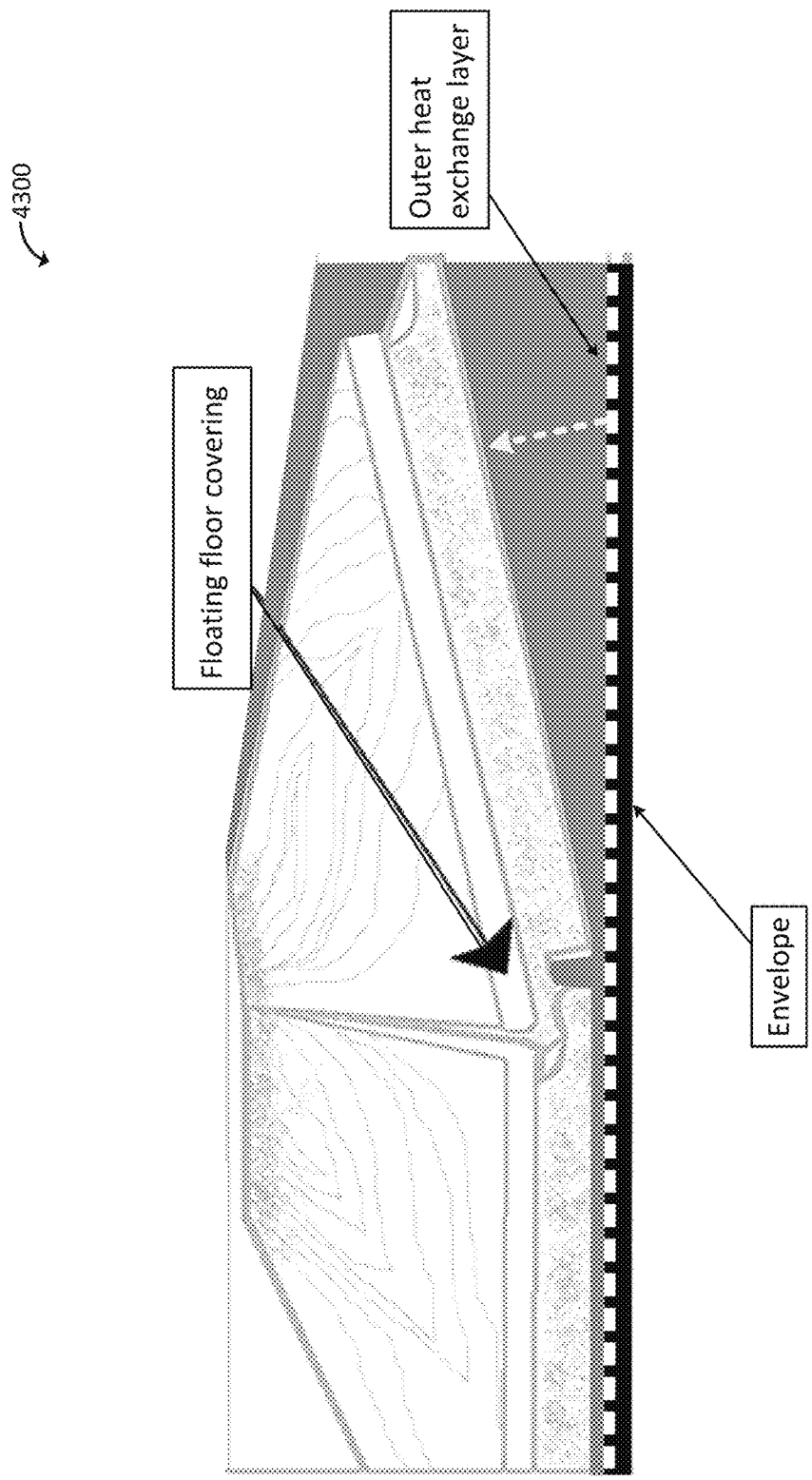
FIG. 43 is a schematic diagram of an example heat exchanger provided to collect thermal energy from flooring, according to example embodiments of the disclosure.

FIG. 43 is a schematic diagram of an example environment 4300 with a heat exchanger provided to collect thermal energy from flooring, according to example embodiments of the disclosure.

Conventional radiant (e.g., hydronic) heating includes the installation of pipes, such as plastic pipes, in a subfloor grid which is overlaid with concrete, and then finished flooring material. Hot water is pumped through the plastic pipes which radiate heat through the concrete and finished floor surface. The conventional radiant floor surface area is relatively large, but the combination of plastic pipes and long heat conduction distance results in a relatively inefficient radiator surface. To make up for this inefficiency, large water volume and pressure is required to optimize convection. Conventional radiant floors are also bulky and expensive to install due to the use of plastic grid, pipe (¾ inch) and concrete.

Thin heat exchangers can be applied as the cushioned underlayment between the subfloor and the finished floor, thus taking no additional space or floor thickness than conventional cushioned underlayment. As mentioned previously, the heat conduction distance is the thickness of the heat exchange layer material. Applied to floors, thin heat exchangers can radiate a lot of heat with very little water flow and associated pumping power. With high heat conduction and radiation efficiency, thin heat exchangers can also operate efficiently at lower system temperatures (e.g., 90 degrees F.) versus typical radiators (e.g., 180 degrees F.).

In this application, a thin metal or plastic sheet is the heat exchange layer. The metal or plastic sheet outer surface (facing the underside of the finished floor) is used as the outer heat exchange surface and the inside surface (facing the subfloor) is used as the envelope heat exchanger surface.

Figure 44:
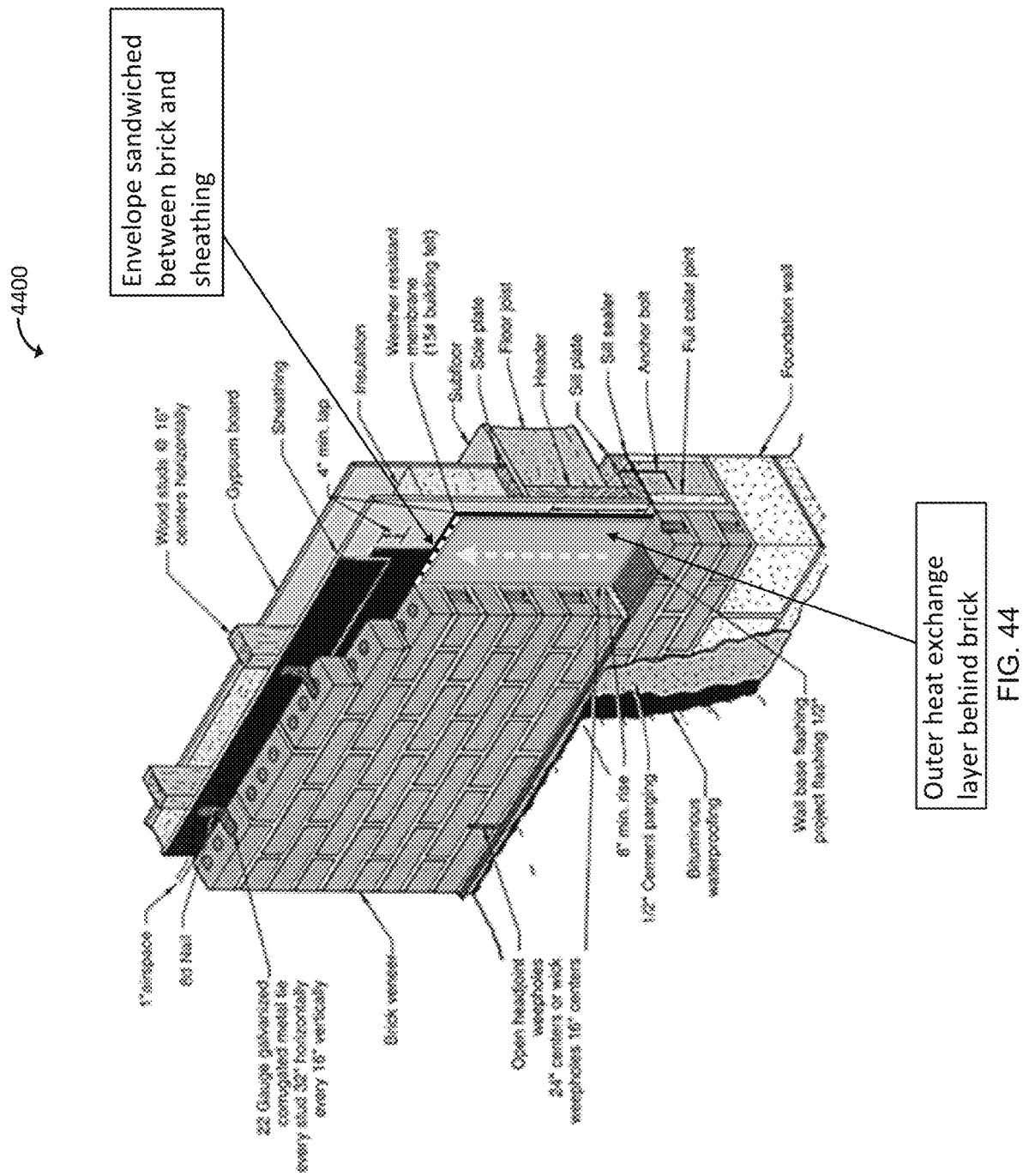
FIG. 44 is a schematic diagram of an example heat exchanger provided to collect thermal energy from masonry, according to example embodiments of the disclosure.
Figure 45:
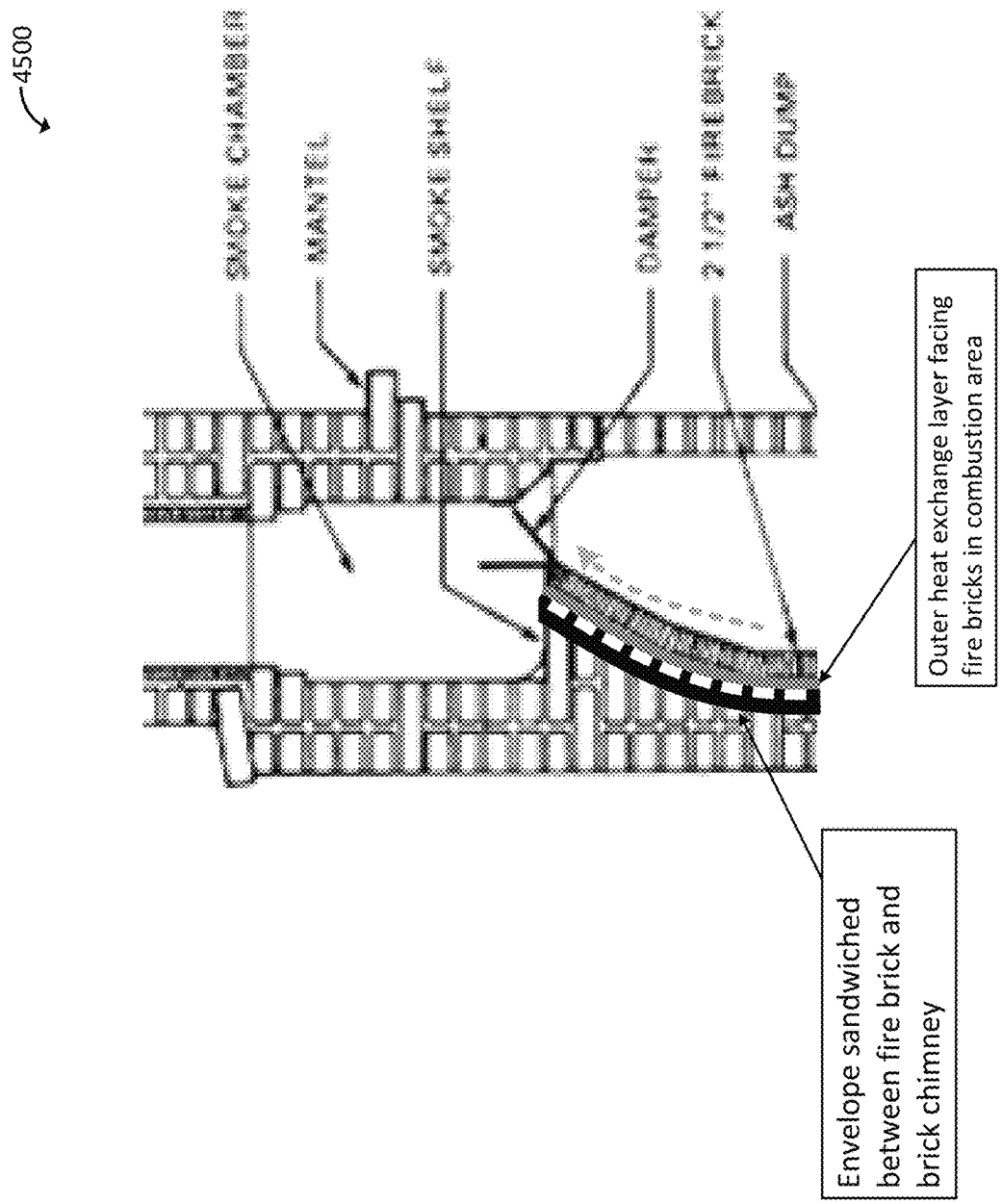
FIG. 45 is a schematic diagram of an example heat exchanger provided to collect thermal energy from a fireplace and/or heating apparatus, according to example embodiments of the disclosure.
Figure 46:
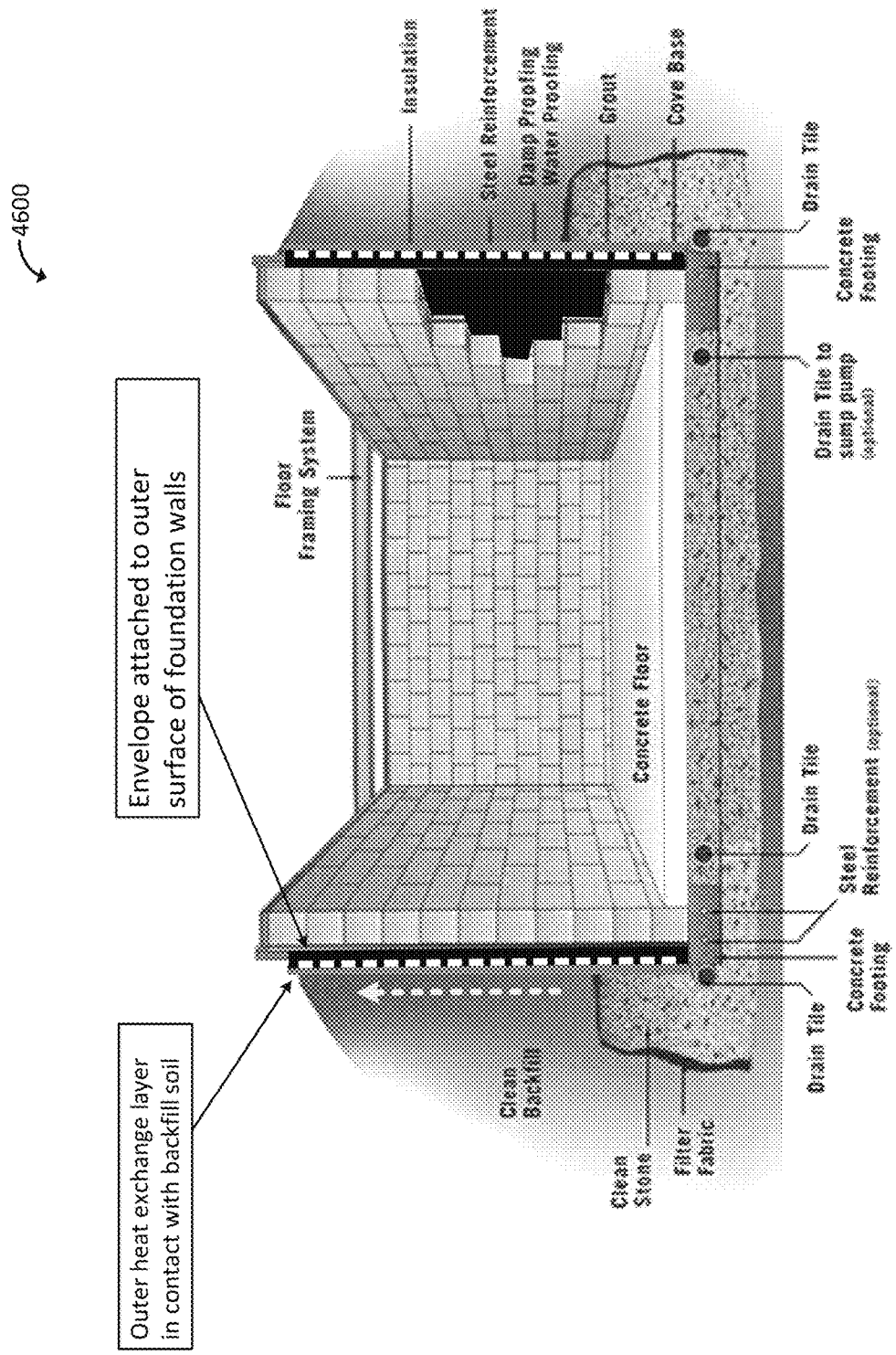
FIG. 46 is a schematic diagram of an example heat exchanger provided to collect thermal energy from foundation walls, according to example embodiments of the disclosure.
Figure 47:
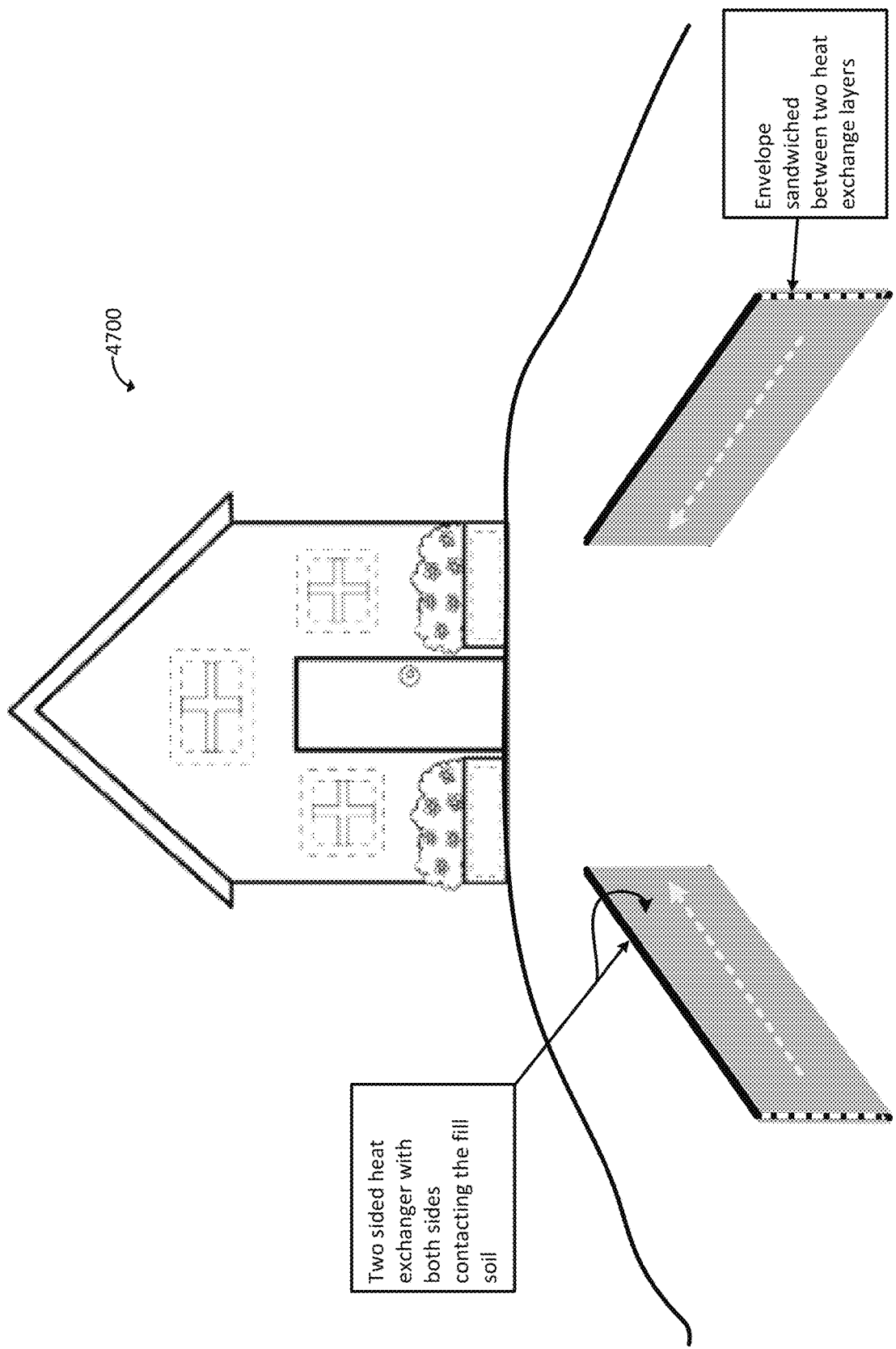
FIG. 47 is a schematic diagram of an example heat exchanger provided to collect thermal energy from septic tanks, according to example embodiments of the disclosure.

FIG. 44 is a schematic diagram of an example environment 4400 with a heat exchanger provided to collect thermal energy from masonry, according to example embodiments of the disclosure. FIG. 45 is a schematic diagram of an example environment 4500 with a heat exchanger provided to collect thermal energy from a fireplace and/or heating apparatus, according to example embodiments of the disclosure. FIG. 46 is a schematic diagram of an example environment 4600 with a heat exchanger provided to collect thermal energy from foundation walls, according to example embodiments of the disclosure. FIG. 47 is a schematic diagram of an example environment 4700 with a heat exchanger provided to collect thermal energy from septic tanks, according to example embodiments of the disclosure.

Thermal capacity is an indicator of the ability of a material to store heat per unit volume. The greater the thermal capacity of a material, the more heat it can store in a given volume per degree of temperature increase. Common building materials like concrete, brick, asphalt and soil have over 1,000 times the thermal capacity of air. These materials naturally store radiation heat from sources like the sun, the earth's core and wood burning in a fireplace. This heat is collected, stored and dissipated over time (wasted) to the atmosphere.

These properties of common building materials enable their use as "heat batteries" if thin heat exchangers (and their efficient convection heat transfer attributes) are used to withdraw and reuse heat. For example, thin heat exchangers, as disclosed herein, applied to the inside surface of a sun-facing brick wall, can withdraw heat as the bricks heat up in the sun during the day. Similar heat exchange can occur with the bricks surrounding a fireplace, where the burning wood is the radiation heat source. Depending on latitude, ground temperatures range from 45° F. (7° C.) to 75° F. (21° C.). Like a cave, this ground temperature is warmer than the air above it during the winter and cooler than the air in the summer. Geothermal ground source heat pumps take advantage of this by exchanging heat with the earth through a ground heat exchanger. Traditional ground heat exchangers include hundreds of feet of expensive trenches and deep bores which suffer from many of the tubular heat exchanger inefficiencies mentioned previously.

Thin heat exchangers can be applied between the insulation and soil backfill surrounding a building foundation and/or septic system, thus exchanging heat over a much larger surface area at a much lower cost. This application may have two applications, such as heating and cooling. In the winter, thin heat exchangers can withdraw heat from the ground, which is much warmer than the air above. With a warmer heat source, heat pumps, which raise the temperature to 90+ degrees as required for heating, run much more efficiently. In the summer, thin heat exchangers can dissipate waste heat from air conditioners to the ground, which is much cooler than the air above.

In these applications, the masonry and soil-facing outside face of thin sheet metal or other heat-conductive material is used as the outer heat exchange layer surface. The inside is used as the envelope heat exchange layer surface.

Figure 48:
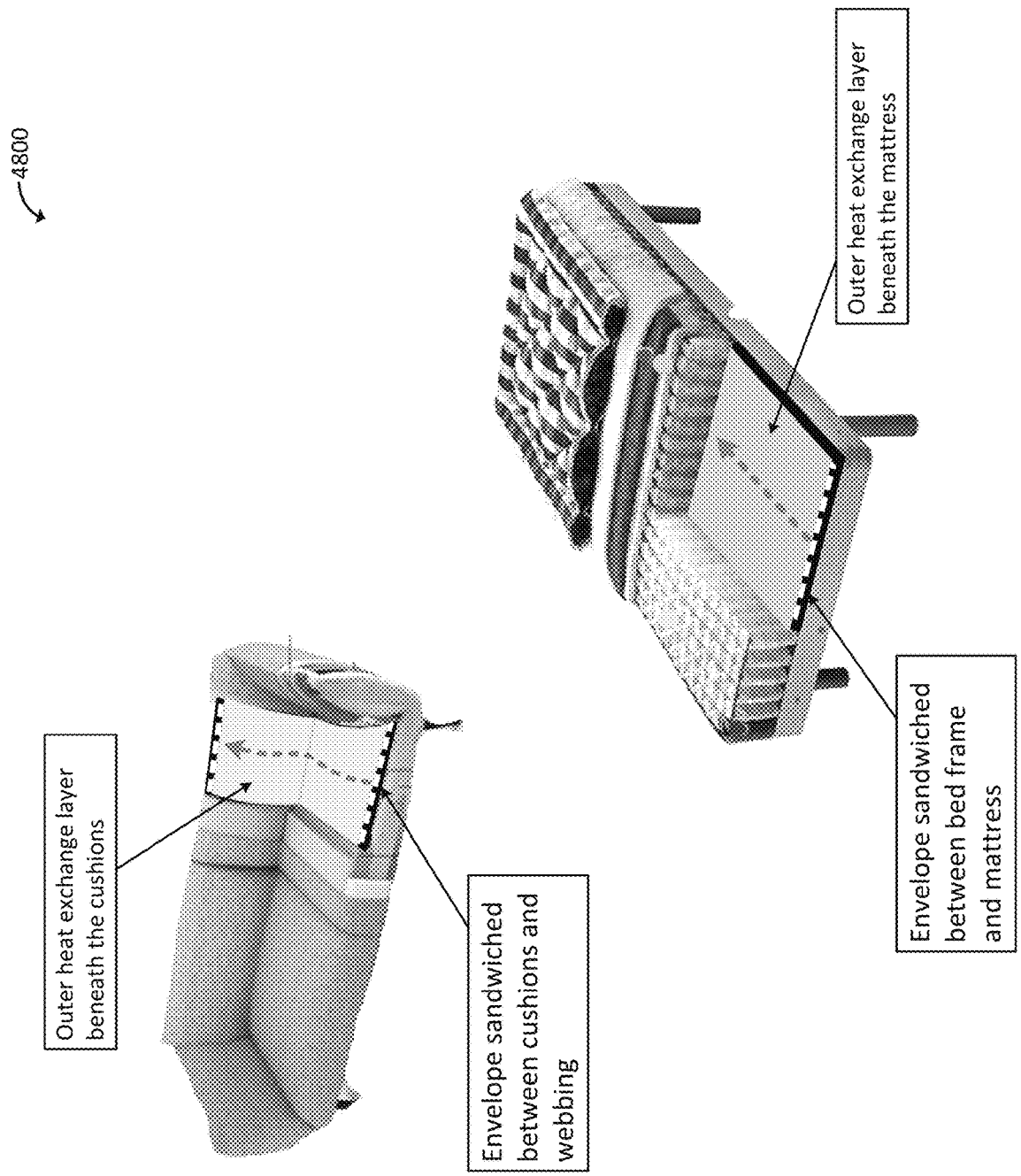
FIG. 48 is a schematic diagram of an example heat exchanger provided to collect thermal energy from furniture, according to example embodiments of the disclosure.

FIG. 48 is a schematic diagram of an example environment 4800 with a heat exchanger provided to collect thermal energy from furniture, according to example embodiments of the disclosure. Interior rooms are typically heated and cooled with radiators, air ducts and fans that throw or collect heat from a relatively small portion of the room surface area. This method depends upon relatively large volumes of water and air circulation to heat and cool room spaces evenly. High volume pumps and fans are expensive and consume energy. Radiators, air ducts and fans take up space and make noise.

Thin heat exchanger profile, flexibility and low cost allow for application to furniture with little to no aesthetic or cost impact. For example, thin heat exchangers can be applied to or behind couch and chair cushions and bed mattresses, thus making nearly any furniture surface capable of radiating heat directly to the furniture occupant and room. With improved efficiency, thin heat exchangers can radiate lots of heat with relatively low water flow volume, temperature, power and noise required.

In this application, a thin metal or plastic sheet is the heat exchange layer. The metal or plastic sheet outer surface (facing the cushion and room interior) is used as the outer heat exchange surface and the inside surface is used as the envelope heat exchanger surface.

Figure 49:
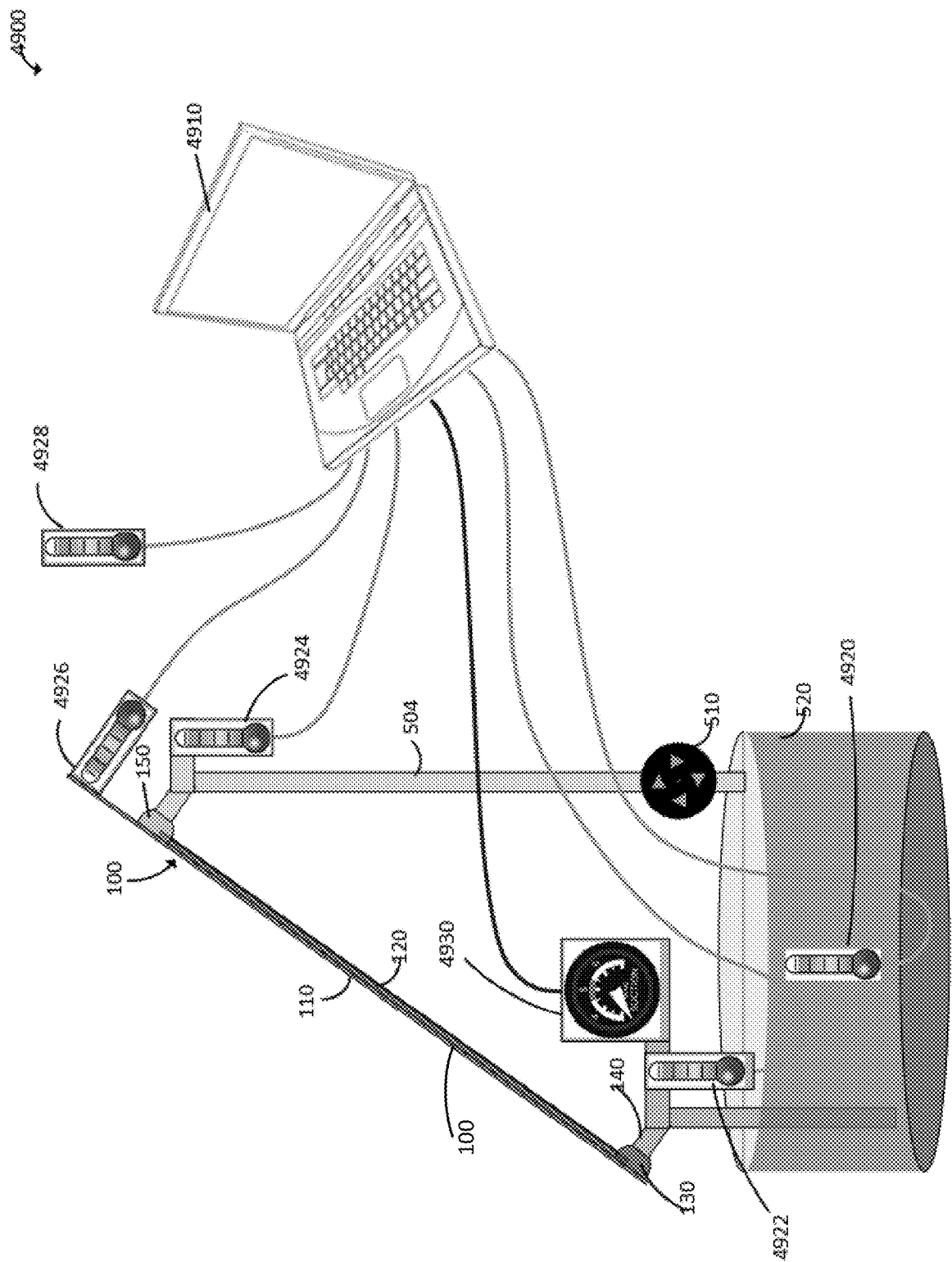
FIG. 49 is a schematic diagram of an example heat exchanger with a coolant reservoir and computer control of based at least in part on a variety of sensors, according to example embodiments of the disclosure.

FIG. 49 is a schematic diagram of an example environment 4900 with a heat exchanger 100 with a coolant reservoir 520 and computer 4910 to control the operation of the heat exchanger 100 based at least in part on a variety of sensors 4920, 4922, 4924, 4926, 4928, 4930, according to example embodiments of the disclosure.

To achieve relatively high reliability and efficiency, the thin heat exchanger control may automatically self-adjust to a variety of temperature and coolant pressure conditions reported by the aforementioned sensors 4920, 4922, 4924, 4926, 4928, 4930, such as temperature sensors 4920, 4922, 4924, 4926, 4928 and pressure sensor 4930. These sensors may be connected to the computer 4910 having a programmable microcontroller which converts analog readings to digital values. Next this microcontroller applies these digitized sensor readings as variables in programmable control algorithms. Following these control algorithms, the microcontroller will control the speed and aperture of electric pumps 510 and valves to regulate coolant flow and pressure. The computer 4910 may calculate and display temperatures, pressures, heat gain, heat loss and other associated efficiency statistics. Thin heat exchanger plumbing 504 can be simple or complex, depending upon the relative elevation of the thin heat exchanger versus the coolant source.

The suction pump 510 may be used for thin heat exchanger applications, as disclosed herein. The simplest thin heat exchanger plumbing configuration is used where the bottom of the thin heat exchanger inlet manifold 130 is slightly above the idle coolant level of the coolant source 520. In this configuration, the coolant pressure inside the envelope is always lower than outside (even when the suction pump is not running) because the coolant is drawn to the coolant source by gravity. In this case a simple suction pump may be all that is required to safely circulate coolant through the envelope.

When initially energized by the computer 4910, the suction pump 510 will first draw air from the system, through the heat exchanger 100 and pipes 504, and then produce adequate vacuum to draw coolant to the inlet manifold 130, up the entire height and width of the thin heat exchanger envelope 120 to the outlet manifold 150.

Diaphragm, jet, or other self-priming pumps will be adequately sized to lift the coolant column from the coolant source to the outlet manifold. Once the coolant has crested the outlet manifold 150, gravity will draw it down towards the suction pump 510, thus creating a siphoning action which will significantly reduce pumping load.

Figure 50:
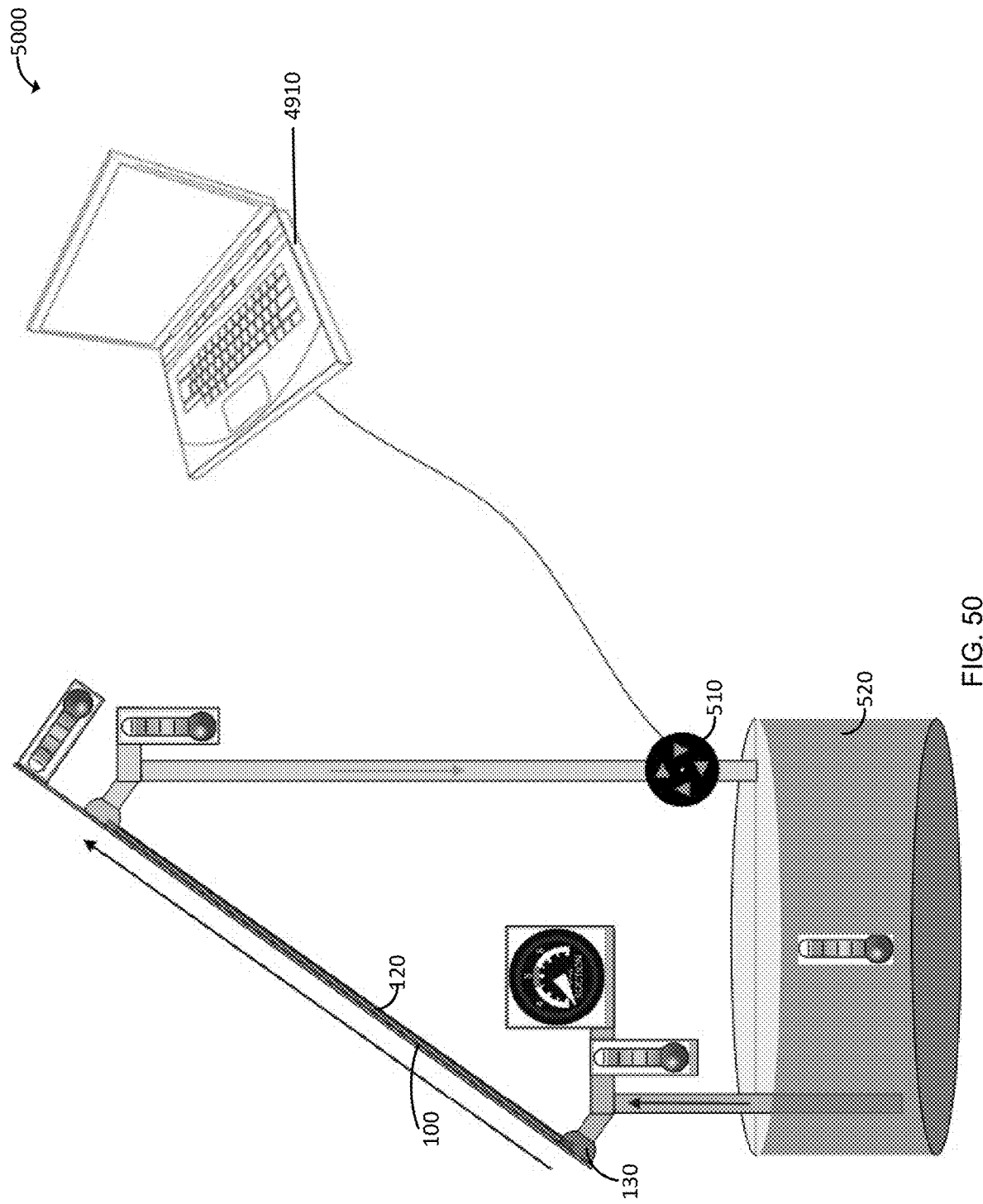
FIG. 50 is a schematic diagram of an example heat exchanger with computer control of a suction pump, according to example embodiments of the disclosure.

FIG. 50 is a schematic diagram of an example environment 5000 with a heat exchanger 100 with computer control of a suction pump 510, according to example embodiments of the disclosure. The computer 4910 may be configured to control the velocity of the pumping of the suction pump. In example embodiments, the computer 4910 may interact with a local controller of the suction pump 510, or directly control the level of voltage, current, and/or power provided to the suction pump 510 to provide a desired level of pumping.

Figure 51:
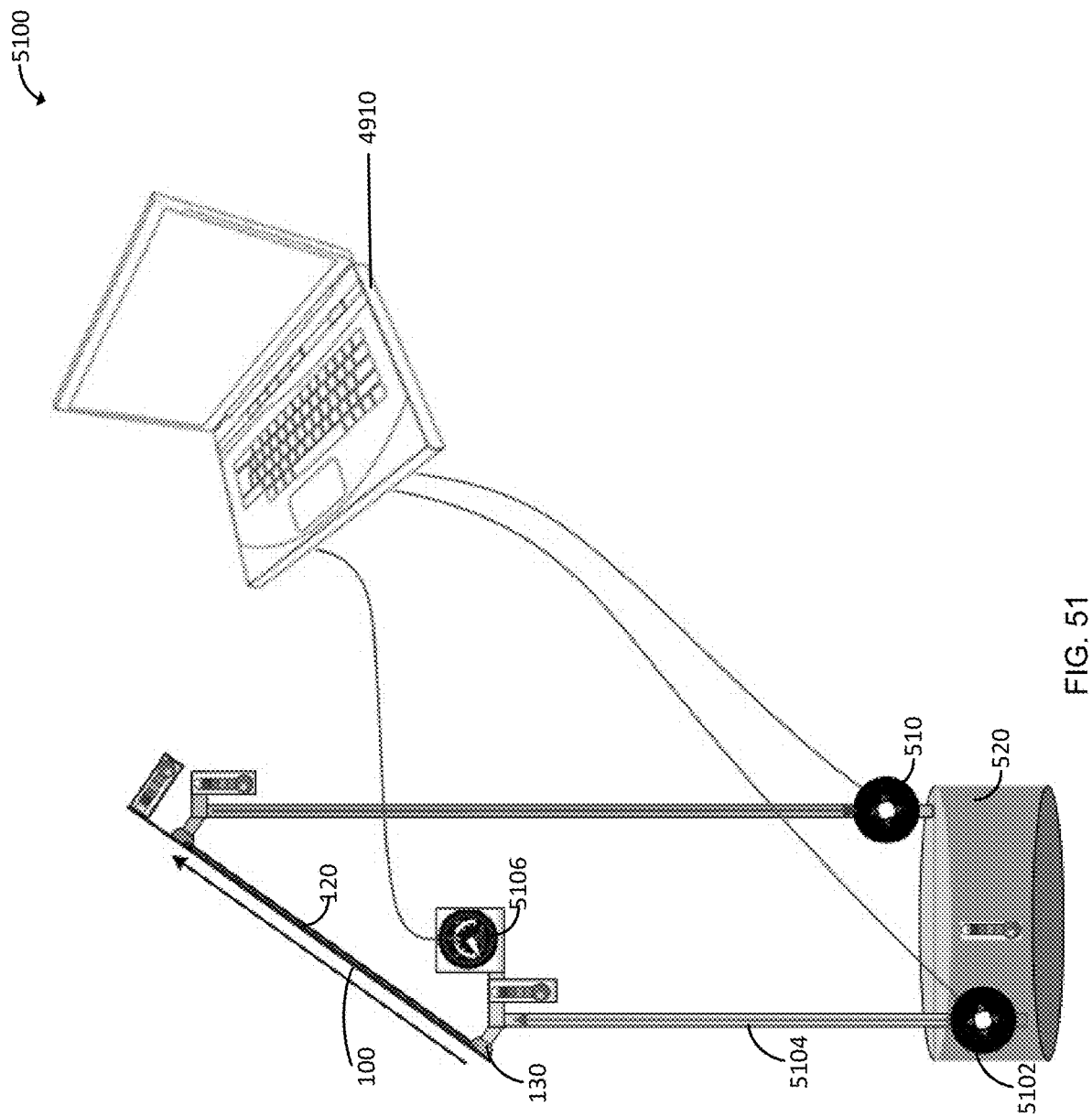
FIG. 51 is a schematic diagram of an example heat exchanger with computer control of a suction pump and an upstream pump, according to example embodiments of the disclosure.

FIG. 51 is a schematic diagram of an example environment 5100 with a heat exchanger 100 with computer control of a suction pump 510 and an upstream pump 5102, according to example embodiments of the disclosure. If the thin heat exchanger inlet manifold 130 is far above the idle coolant level of the coolant source 520 then a large, heavy column of coolant will be drawn up pipes 5104 before it even reaches the inlet manifold 130. In this case, strong suction may be used to draw the coolant to and through the thin heat exchanger envelope 120 from bottom to top. As mentioned previously, excessive suction can cause buckling that will restrict coolant flow.

For these applications, coolant pressure sensors and variable feed pumps may be used. In this application, a traditional centrifugal pump may be connected between the coolant source or reservoir tank 520 and the inlet manifold 130. If the coolant suction, as measured by a coolant pressure sensor 5106, is above a high suction threshold, the computer 4910 may energize the variable feed upstream pump 5102. The variable feed upstream pump 5102 will push the coolant column towards the inlet manifold 130, thus compensating for the weight of the long coolant column. The computer 4910 will adjust the variable feed upstream pump drive voltage up or down to maintain coolant pressure within a targeted range between the high suction and high pressure values.

Figure 52:
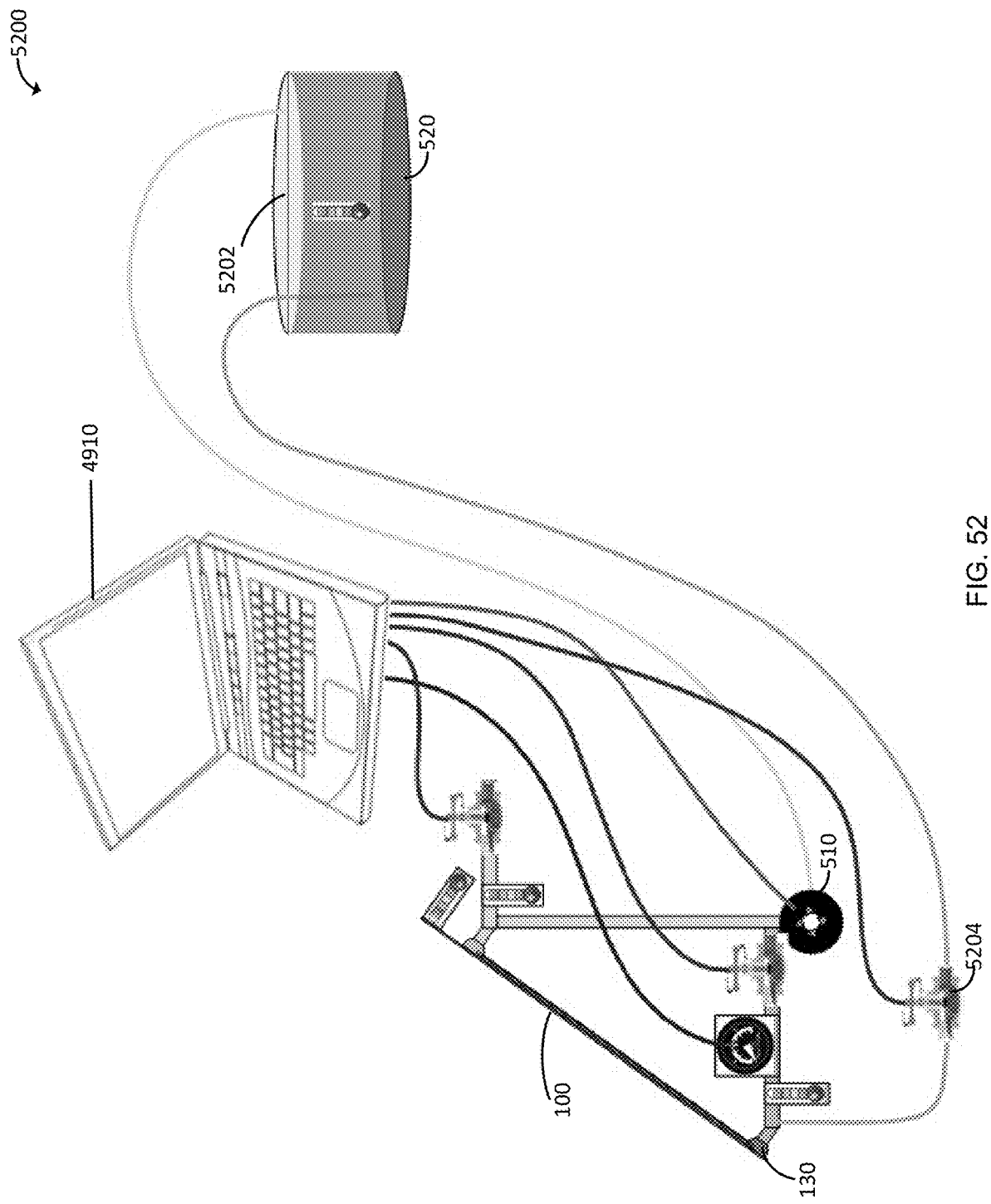
FIG. 52 is a schematic diagram of an example heat exchanger with computer control of a suction pump with a coolant reservoir at a height greater than the heat exchanger ingress point, according to example embodiments of the disclosure.

FIG. 52 is a schematic diagram of an example environment 5200 with a heat exchanger 100 with computer control of a suction pump with a coolant reservoir at a height greater than the heat exchanger ingress point, according to example embodiments of the disclosure. If the thin heat exchanger inlet manifold 130 is below the idle water level 5202 of the coolant source 520, gravity will draw the coolant from the source to the thin heat exchanger 100. In this case the envelope coolant pressure will exceed outside pressure, thus leading to inflation and potential bursting.

For these applications coolant pressure sensors, variable inlet valves, reversing valves and vent valves are required. Variable inlet valves 5204 may be provided in-line between the coolant source tank 520 and the inlet manifold 130. The variable inlet valve 5204 may be closed by the computer 4910 when the suction pump 510 is off, thus preventing gravity-fed water flow from the coolant source tank 520 to the inlet manifold 130.

Figure 53:
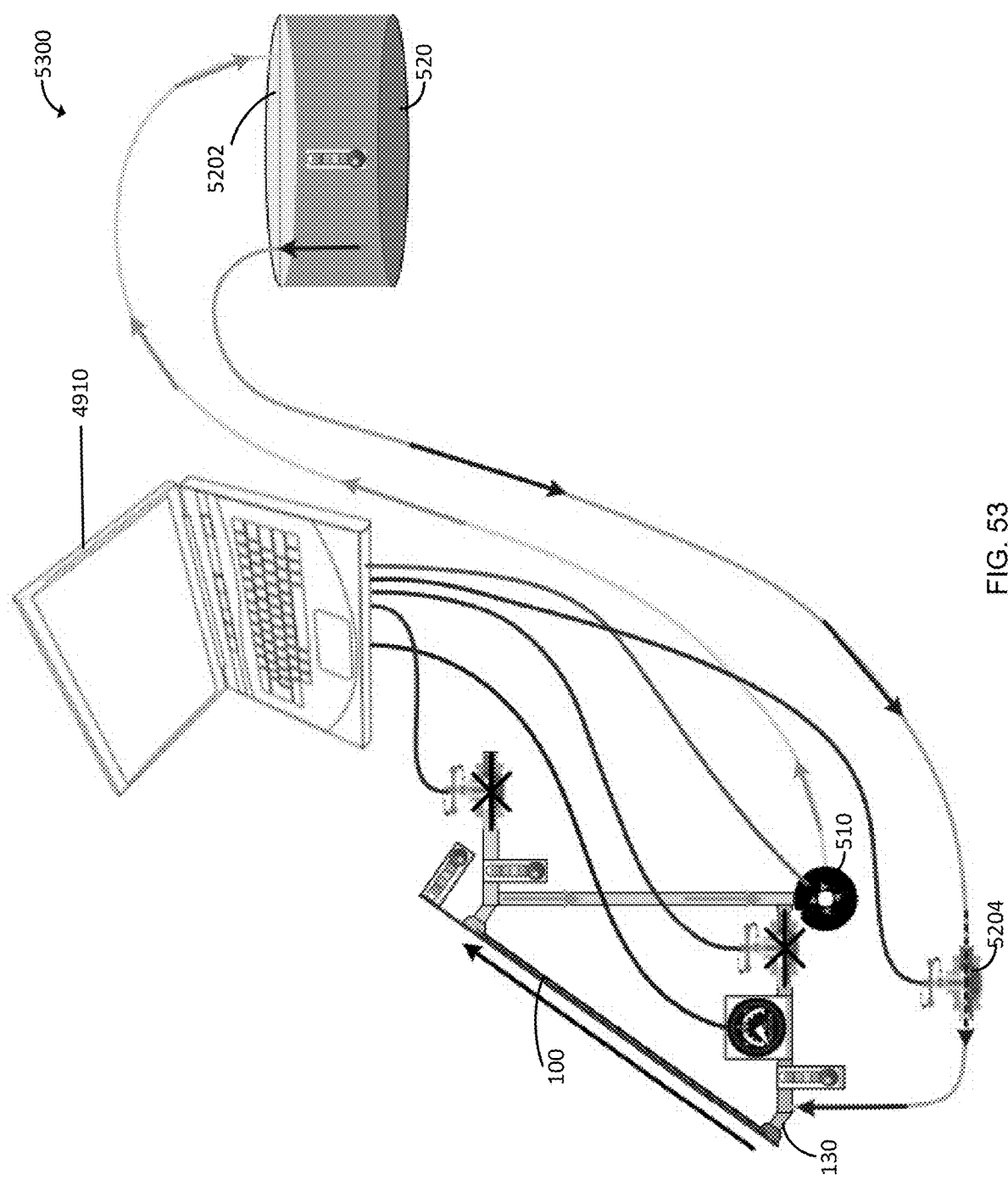
FIG. 53 is a schematic diagram of an example heat exchanger with computer controlled inlet and outlet valves, according to example embodiments of the disclosure.

FIG. 53 is a schematic diagram of an example environment 5300 with a heat exchanger 100 with computer controlled inlet and outlet valves during startup, according to example embodiments of the disclosure. At startup, when the suction pump is energized by the computer 4910, the coolant pressure sensor will detect a pressure reduction (suction). When the coolant pressure falls below a threshold (high suction) the microcontroller will slowly open the variable inlet valve 5204 to enable coolant flow from the coolant source tank 520 to the inlet manifold 130. The computer 4910 will open or close the variable inlet valve 5204 in gradual steps to maintain coolant pressure within a targeted range between the high suction and high pressure values.

Figure 54:
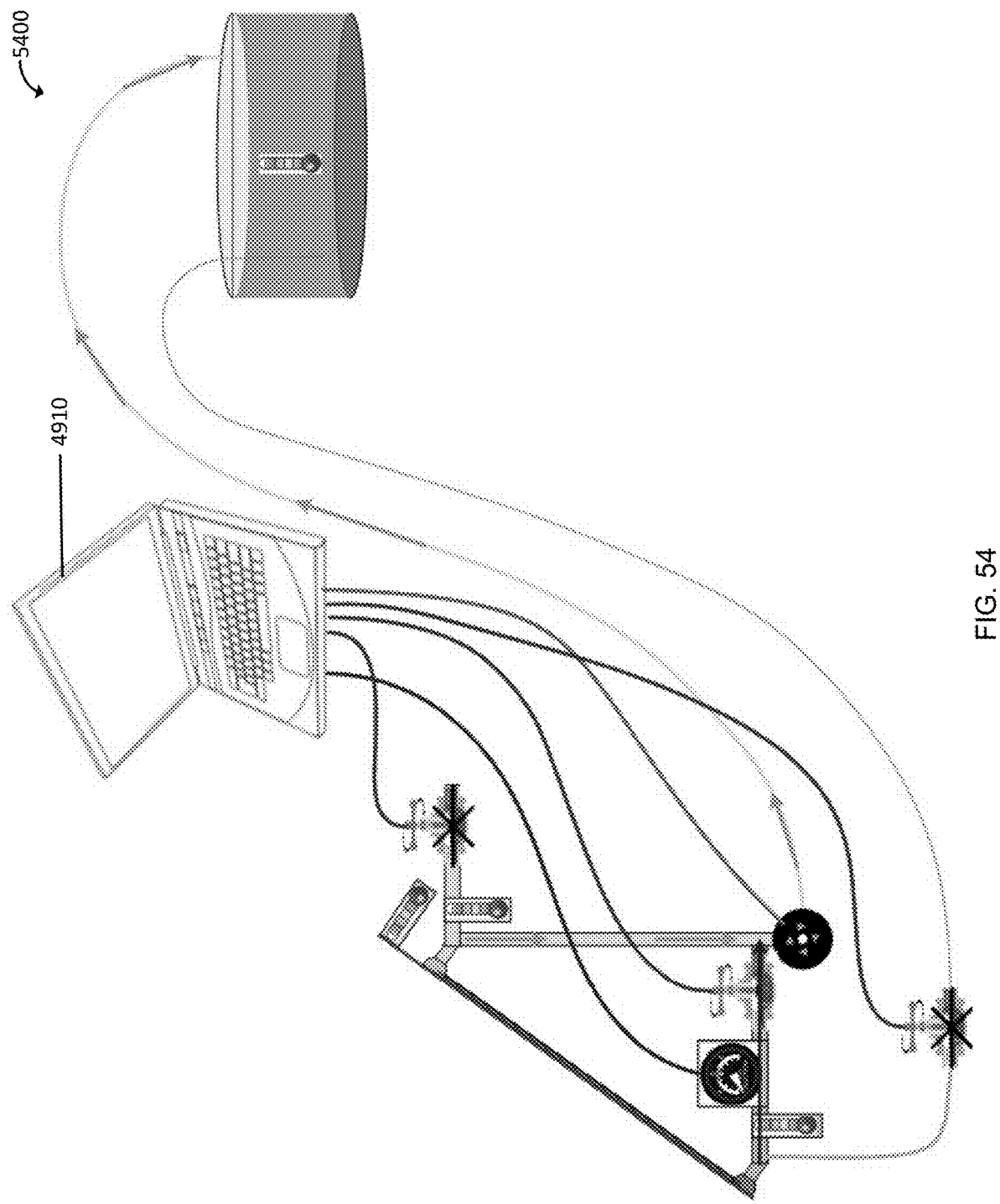
FIG. 54 is a schematic diagram of an example heat exchanger with computer control of a suction pump with a coolant reservoir at a height greater than the heat exchanger ingress point and computer controlled inlet and outlet valves, according to example embodiments of the disclosure.

FIG. 54 is a schematic diagram of an example environment 5400 with a heat exchanger with computer control of a suction pump with a coolant reservoir at a height greater than the heat exchanger ingress point and computer controlled inlet and outlet valves during evacuation, according to example embodiments of the disclosure.

When coolant circulation is no longer required (sundown for solar applications), the thin heat exchanger system will evacuate. The microcontroller will close the variable inlet valve to block additional coolant flow from the coolant source tank. This will cause the suction to increase (coolant pressure decrease) and the envelope will begin to collapse, thus "wringing" some of the remaining water from the envelope.

Next the reversing valve is adjusted (by the computer 4910) to remove remaining coolant from the envelope. The reversing valve will open and connect the inlet manifold to the suction line (also connected to the outlet manifold), thus sucking some remaining coolant from the inlet manifold.

Figure 55:
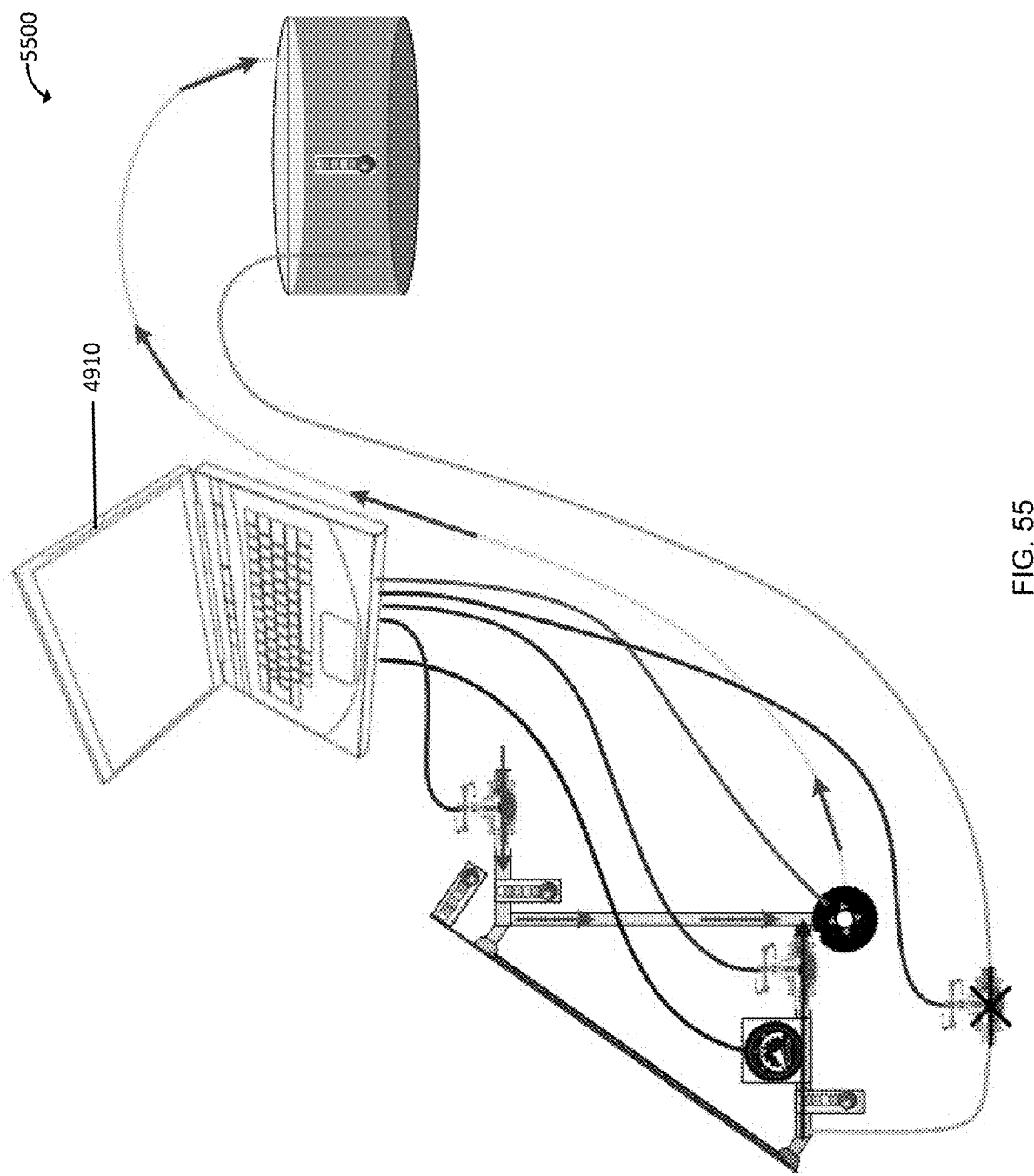
FIG. 55 is a schematic diagram of an example heat exchanger with computer control of a suction pump with a coolant reservoir at a height greater than the heat exchanger ingress point and computer controlled inlet and outlet valves, according to example embodiments of the disclosure.

FIG. 55 is a schematic diagram of an example environment 5500 with a heat exchanger with computer control of a suction pump with a coolant reservoir at a height greater than the heat exchanger ingress point and computer controlled inlet and outlet valves during shutdown, according to example embodiments of the disclosure.

The vent valve (in the suction line at the outlet manifold near the thin heat exchanger top edge) will open the suction line to the outside air. This will allow outside air to rush in the envelope, thus forcing the remaining envelope coolant and some air towards the suction pump. This shutdown process will ensure that pooled coolant does not remain to inflate and potentially burst the envelope.

Figure 56:
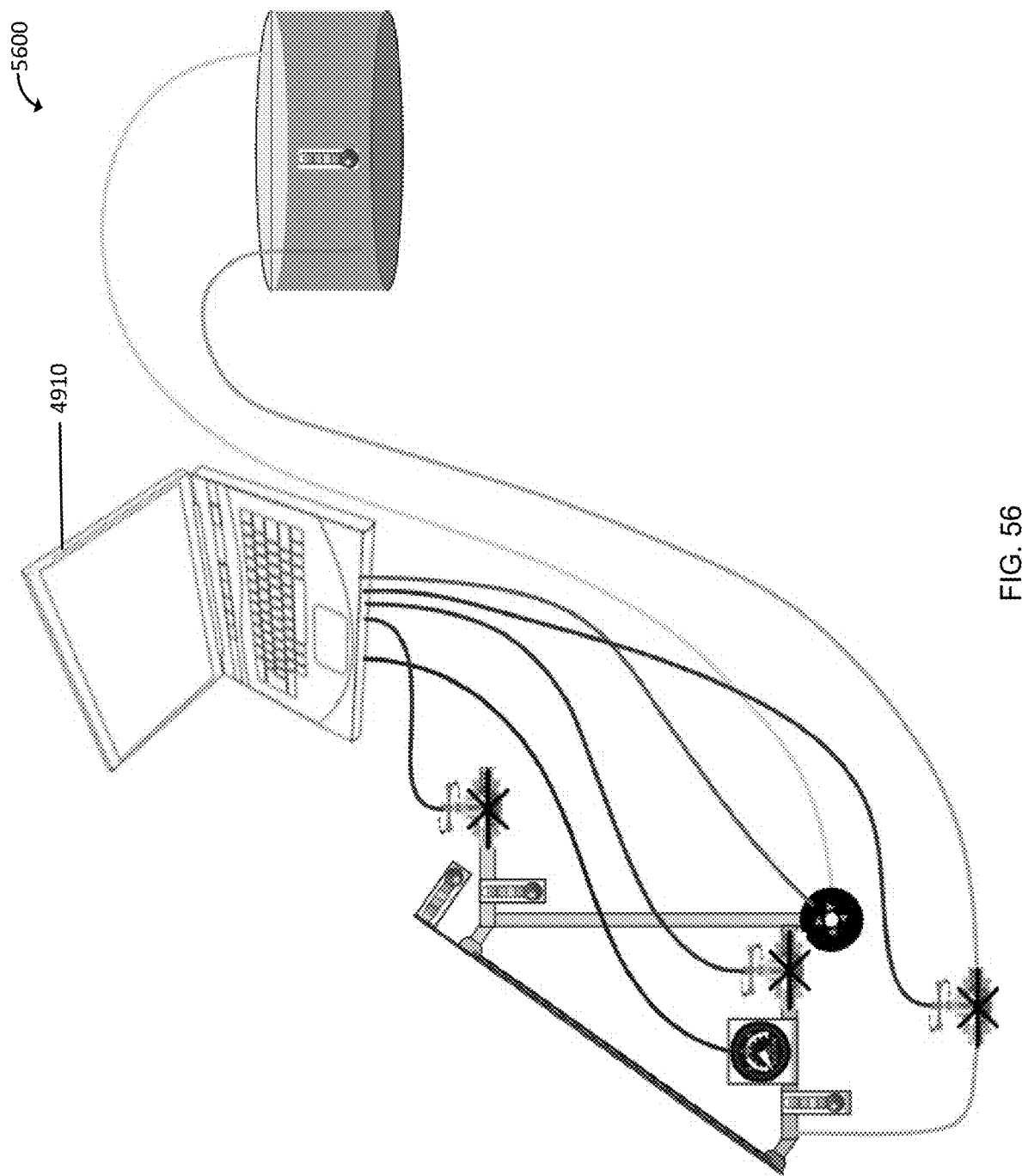
FIG. 56 is a schematic diagram of a prototype heat exchanger when idling, according to example embodiments of the disclosure.

FIG. 56 is a schematic diagram of an example environment 5600 with a heat exchanger when idling, according to example embodiments of the disclosure. This prototype configuration and associated trial and error led to the below-tank configuration described previously. The filled, 96 gallon coolant storage tank weighs nearly 800 lbs. and is therefore in a stationary position. The collector is mounted on wheels so it can be rolled to areas with sun exposure. During operation, the thin heat exchanger inlets were below the storage tank coolant level. The prototype made use of coolant pressure sensor, variable inlet valve, reversing valve, vent valve and significant microcontroller code to regulate envelope coolant pressure and evacuate the heat exchangers at shutdown.

In the idle configuration, all pumps are off and valves are closed. This configuration prevents gravity-induced coolant flow, envelope bursting and unnecessary electric power use.

Figure 57:
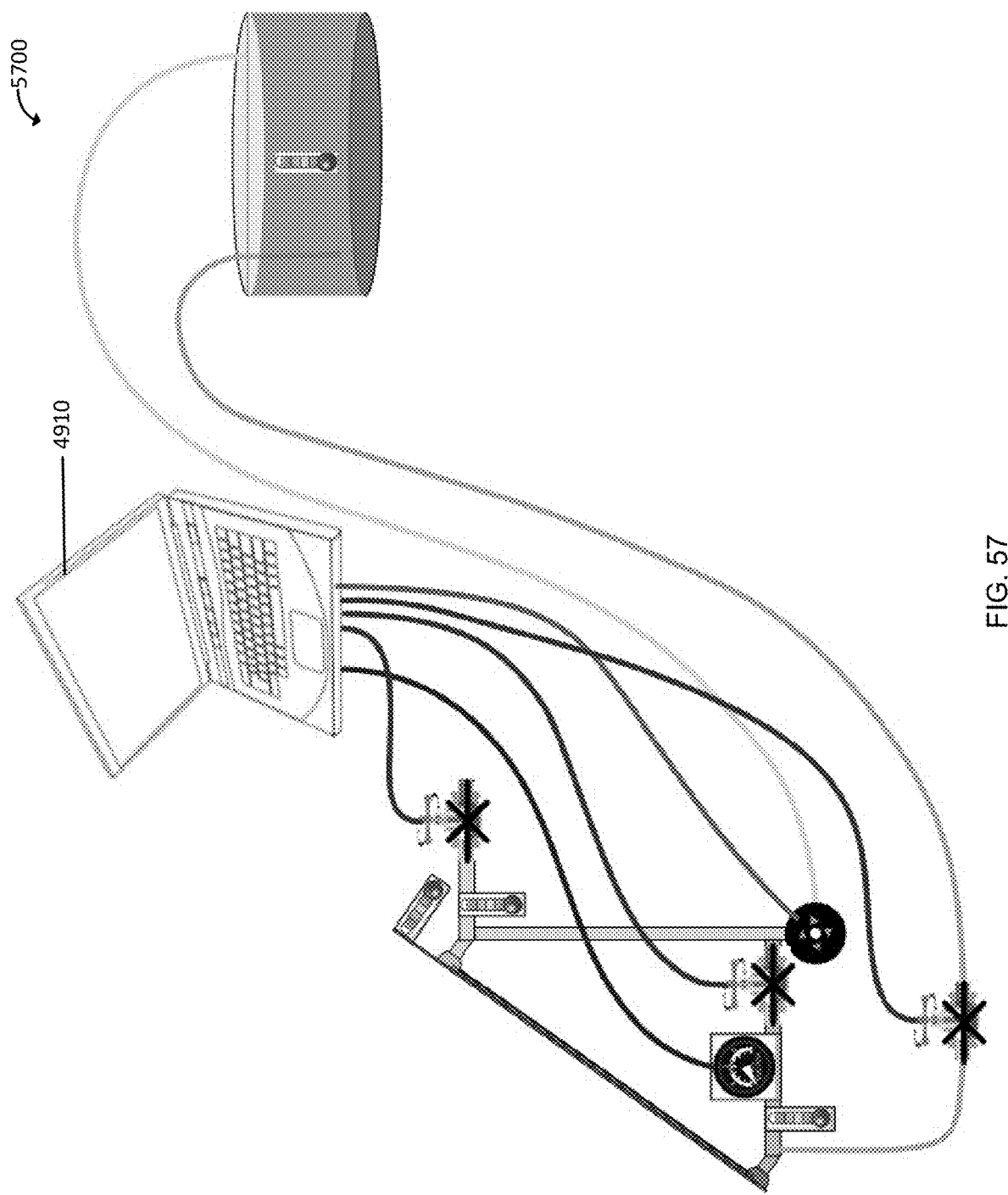
FIG. 57 is a schematic diagram of the prototype heat exchanger during startup, according to example embodiments of the disclosure.

Configuration when idle:
Suction pump: off
Variable inlet valve: closed
Reversing valve: closed
Vent valve: closed FIG. 57 is a schematic diagram of an example environment 5700 with a heat exchanger during startup, according to example embodiments of the disclosure. After some time with sun exposure (sunrise or cloud no longer blocks the sun), the heat exchange surface temperature will exceed the storage tank temperature. The microcontroller will sense this positive temperature differential and will activate the suction pump. This will de-pressurize the system for coolant circulation.

Figure 58:
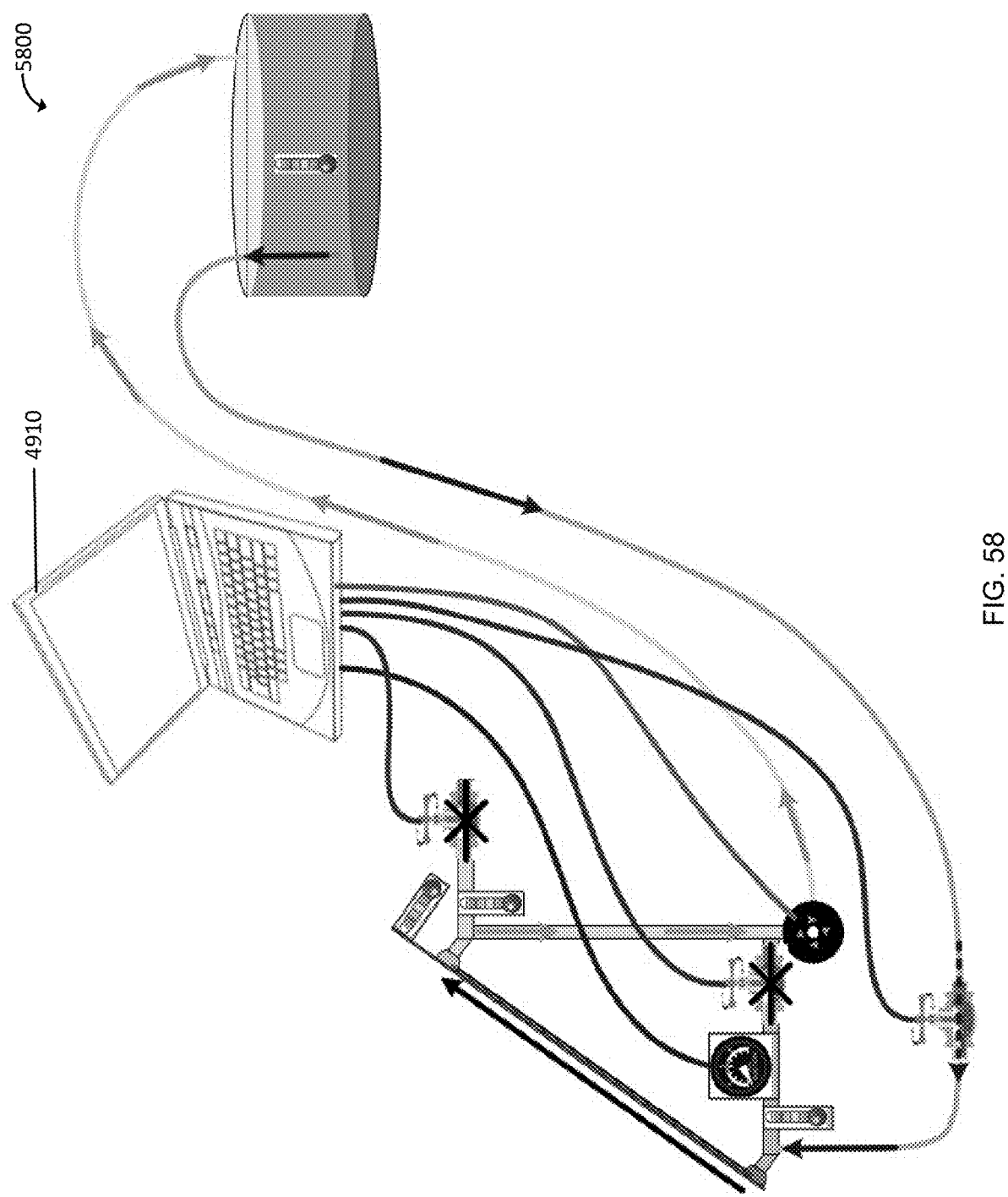
FIG. 58 is a schematic diagram of the prototype heat exchanger with increasing coolant flow, according to example embodiments of the disclosure.

Condition at startup:
Heat exchange surface temperature>storage tank temperature
Configuration at startup:
Suction pump: on
Variable inlet valve: closed
Reversing valve: closed
Vent valve: closed FIG. 58 is a schematic diagram of an example environment 5800 with a heat exchanger with increasing coolant flow, according to example embodiments of the disclosure. The suction pump will draw air and coolant from the envelope until the coolant pressure drops below the high suction threshold. The microcontroller will sense this pressure drop and will open the variable inlet valve in small increments, thus enabling coolant flow from the coolant storage tank. If the coolant pressure is still below the high suction threshold, the microcontroller will open the variable inlet valve by another increment. This cycle shall repeat until the coolant pressure rises above the high suction threshold or the variable inlet valve is opened all the way. This will maximize coolant flow while preventing excess coolant pressure.

Figure 59:
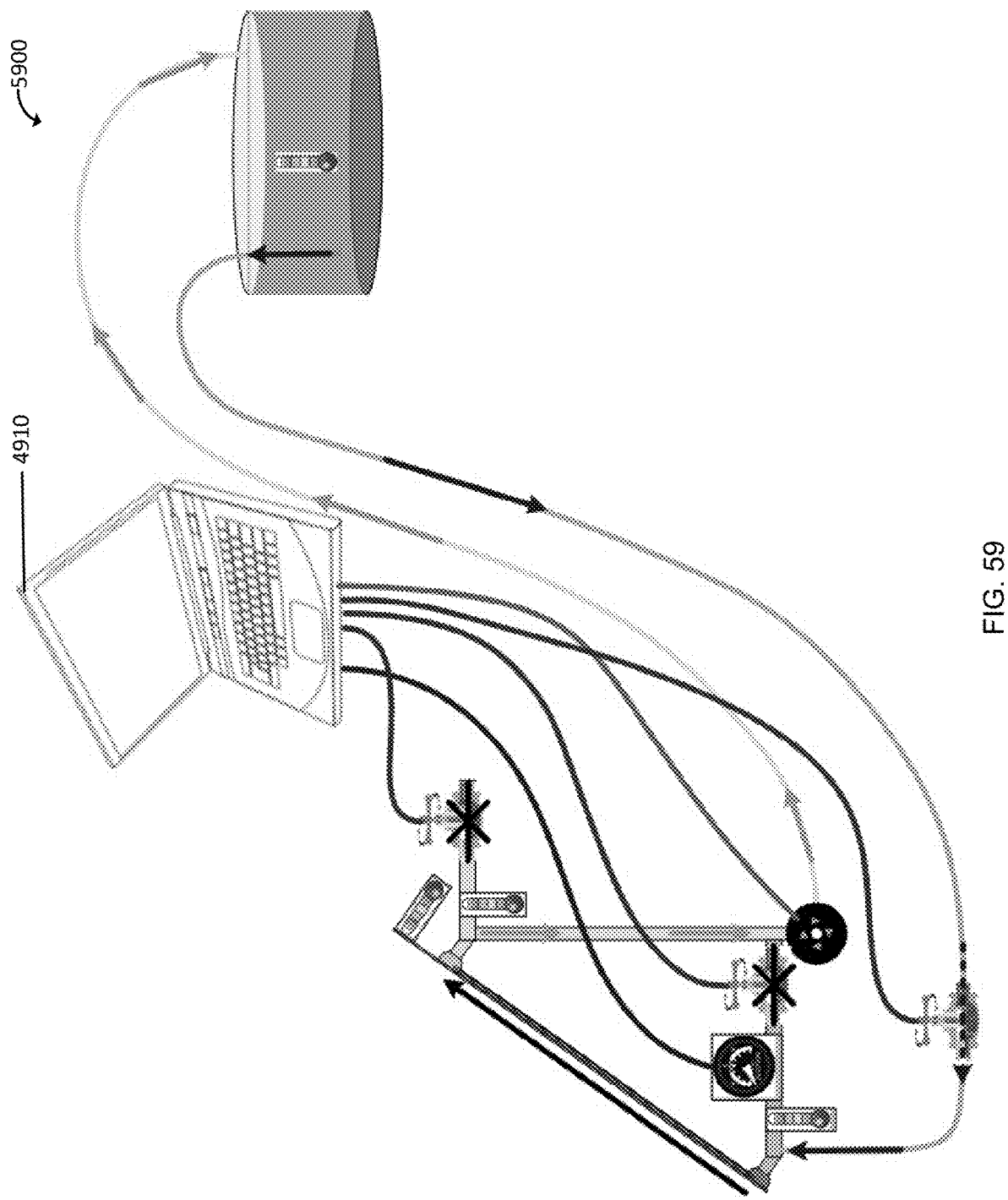
FIG. 59 is a schematic diagram of the prototype heat exchanger with decreasing coolant flow, according to example embodiments of the disclosure.

Condition for increased coolant flow:
Heat exchange surface temperature>storage tank temperature
Coolant pressure less than high suction threshold
Configuration for increased coolant flow:
Suction pump: on
Variable inlet valve: opened in small increments
Reversing valve: closed
Vent valve: closed FIG. 59 is a schematic diagram of an example environment 5900 with a heat exchanger with decreasing coolant flow, according to example embodiments of the disclosure. Some envelope surfaces may compress or otherwise change shape under high suction and high temperature. In other cases, the suction pump may be serving multiple sets of thin heat exchangers which turn on and off during the collection period. These changes may cause the coolant pressure to fluctuate above the high pressure threshold. The microcontroller will sense this pressure increase and will close the variable inlet valve in small increments, thus reducing coolant flow from the coolant storage tank. If the coolant pressure is still above the high pressure threshold, the microcontroller will close the variable inlet valve by another increment. This cycle shall repeat until the coolant pressure falls below the high pressure threshold or the variable inlet valve is completely closed. This will prevent excess coolant pressure and minimize the risk of envelope bursting.

Figure 60:
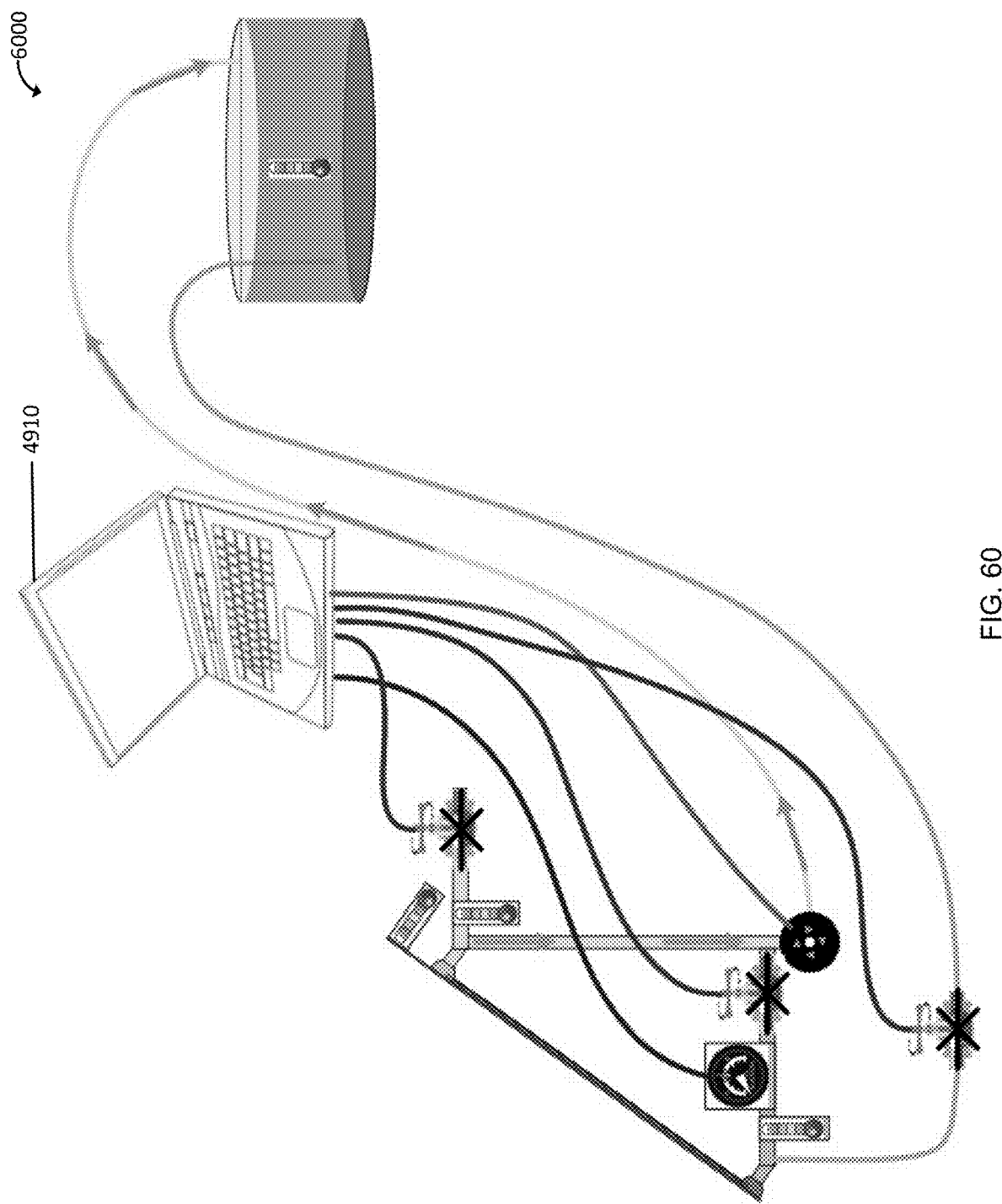
FIG. 60 is a schematic diagram of the prototype heat exchanger during evacuation, according to example embodiments of the disclosure.

Condition for decreased coolant flow:
Heat exchange surface temperature>storage tank temperature
Coolant pressure greater than high pressure threshold
Configuration for decreased coolant flow:
Suction pump: on
Variable inlet valve: closed in small increments
Reversing valve: closed
Vent valve: closed FIG. 60 is a schematic diagram of an example environment 6000 with a heat exchanger during evacuation, according to example embodiments of the disclosure. After some time with reduced sun exposure (e.g., sunset or cloud blocks the sun), the heat exchange surface temperature will fall below the storage tank temperature. The microcontroller will sense this negative temperature differential and will close the variable inlet valve. This will stop coolant circulation. The suction pump will draw remaining coolant from the outlet manifold and create a strong vacuum within the envelope.

Figure 61:
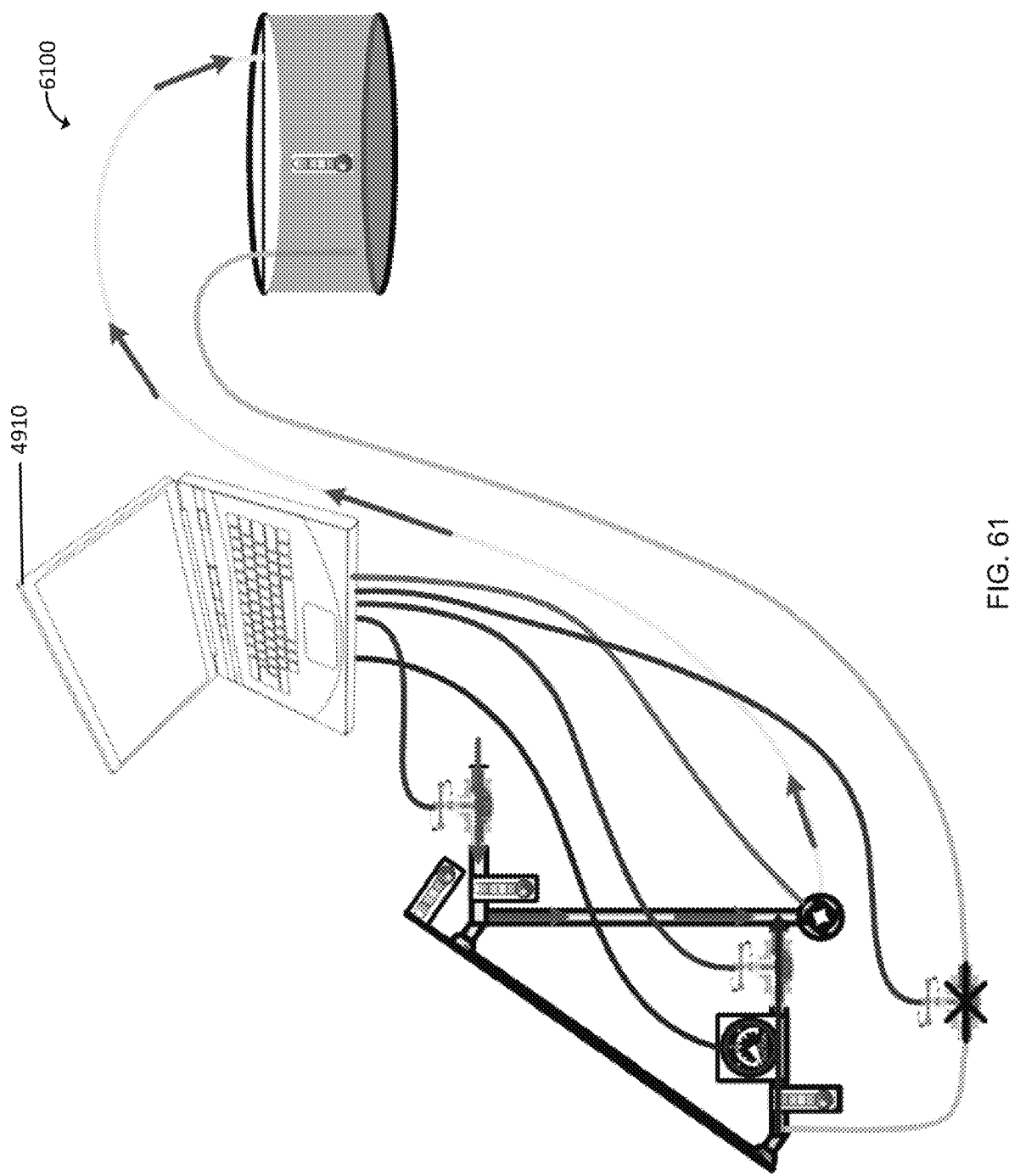
FIG. 61 is a schematic diagram of the prototype heat exchanger during purge for shutdown, according to example embodiments of the disclosure.

Condition for evacuation:
Heat exchange surface temperature<storage tank temperature
Configuration for evacuation:
Suction pump: on
Variable inlet valve: closed
Reversing valve: closed
Vent valve: closed FIG. 61 is a schematic diagram of an example environment 6100 with a heat exchanger during purge for shutdown, according to example embodiments of the disclosure. After some time with the variable inlet valve closed, the suction pump will draw a significant amount of coolant and build a relatively strong vacuum in the envelope. Next, the microcontroller will open the reversing and vent valves. The open reversing valve will allow the suction pump to draw remaining coolant from the inlet manifold. The open vent valve will allow air to rush in the envelope, thereby flushing remaining coolant from the envelope. This will clear most coolant from the envelope before returning to the idle configuration.

Figure 62:
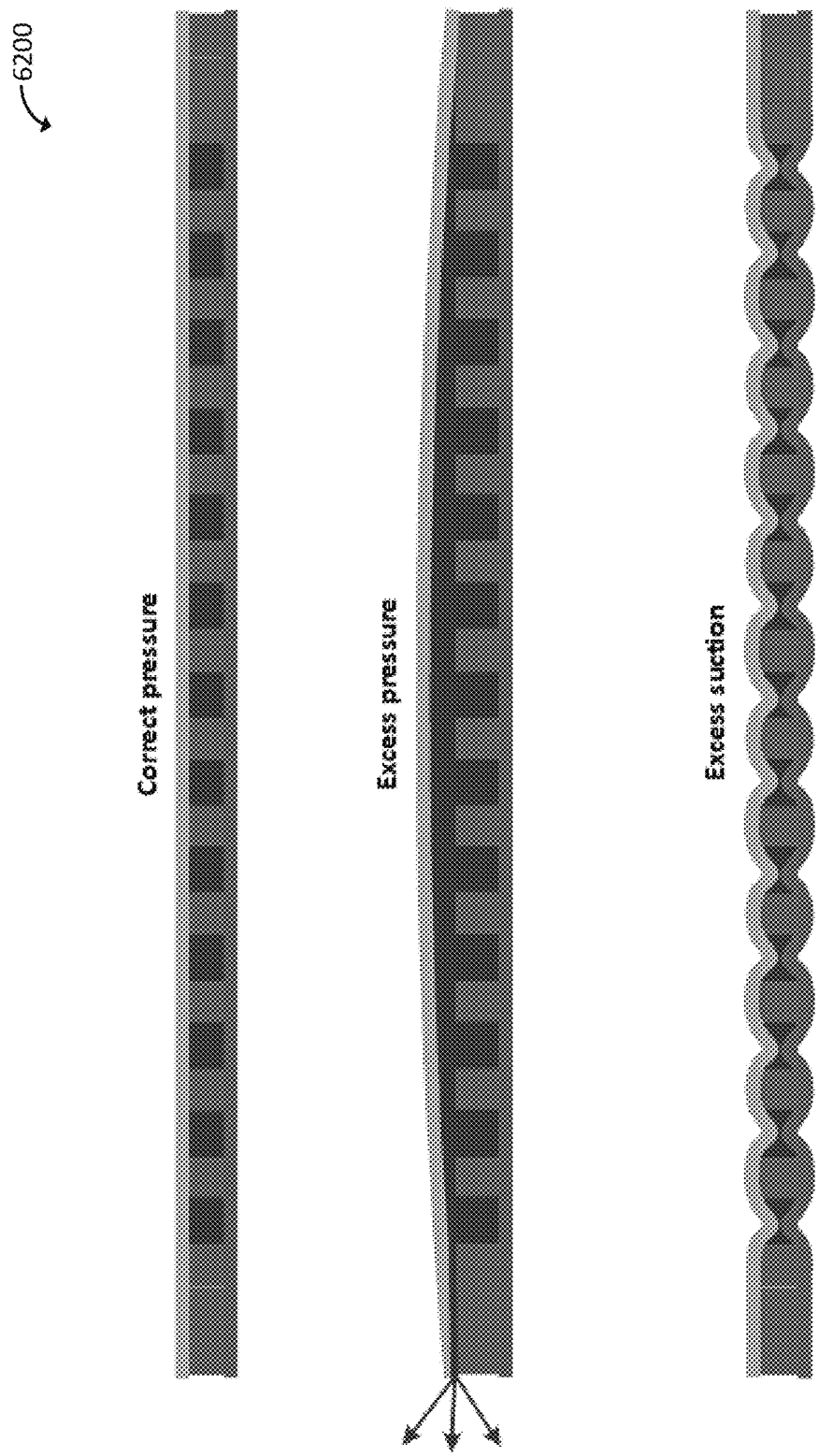
FIG. 62 is a schematic diagram of an example heat exchanger with various coolant pressurization, according to example embodiments of the disclosure.

Condition for purge:
Heat exchange surface temperature<storage tank temperature
Variable inlet valve closed Coolant pressure below the high suction threshold
Configuration for purge:
Suction pump: on
Variable inlet valve: closed
Reversing valve: open
Vent valve: open FIG. 62 is a schematic diagram of an example heat exchanger 6200 with various coolant pressurization, according to example embodiments of the disclosure. Thin heat exchanger materials and sealants (for example thin metal, plastic or rubber heat exchange or envelope layers) can withstand external air pressure but are not designed to withstand internal coolant pressure. If internal coolant pressure is greater than ambient air or water pressure this coolant will accumulate and sections of the envelope will inflate. This inflation will compromise seal or material integrity until the thin heat exchanger bursts, thus leaking coolant to the surrounding area. If the internal coolant pressure is too low (suction is too high) then the envelope and/or heat exchange layers will buckle under high external air pressure. This buckling effect will not damage the heat exchanger but it will cause narrowing of the envelope serrations and potentially restrict coolant flow and efficiency.

Coolant pressure sensors are optional for simpler implementations where thin heat exchangers are relatively small, above and relatively close to the coolant source (tank). In these cases, it is relatively safe to assume that coolant is drawn to the source by gravity, envelope pressure is less than outside and not low enough to cause buckling. For other more complex applications coolant pressure will be measured and regulated to maximize thin heat exchanger reliability and efficiency. A coolant pressure sensor will be added to the inlet manifold end of the inlet pipe. Most liquid pressure sensors compare the pressure of the internal liquid to the pressure of external air or water. In this case the target range for coolant versus outside differential pressure will be less than 0 and greater than the point at which buckling occurs.

It should be appreciated that the functionality provided by the computer 4910 can be provided by other types of computing devices, including hand-held computers, embedded computer systems, personal digital assistants, and other types of computing devices known to those skilled in the art. It is also contemplated that the computer 4910 might not include all of the components shown in the figures, can include other components that are not explicitly shown in the figures, or might utilize an architecture completely different than that shown in the figures.

Figure 63:
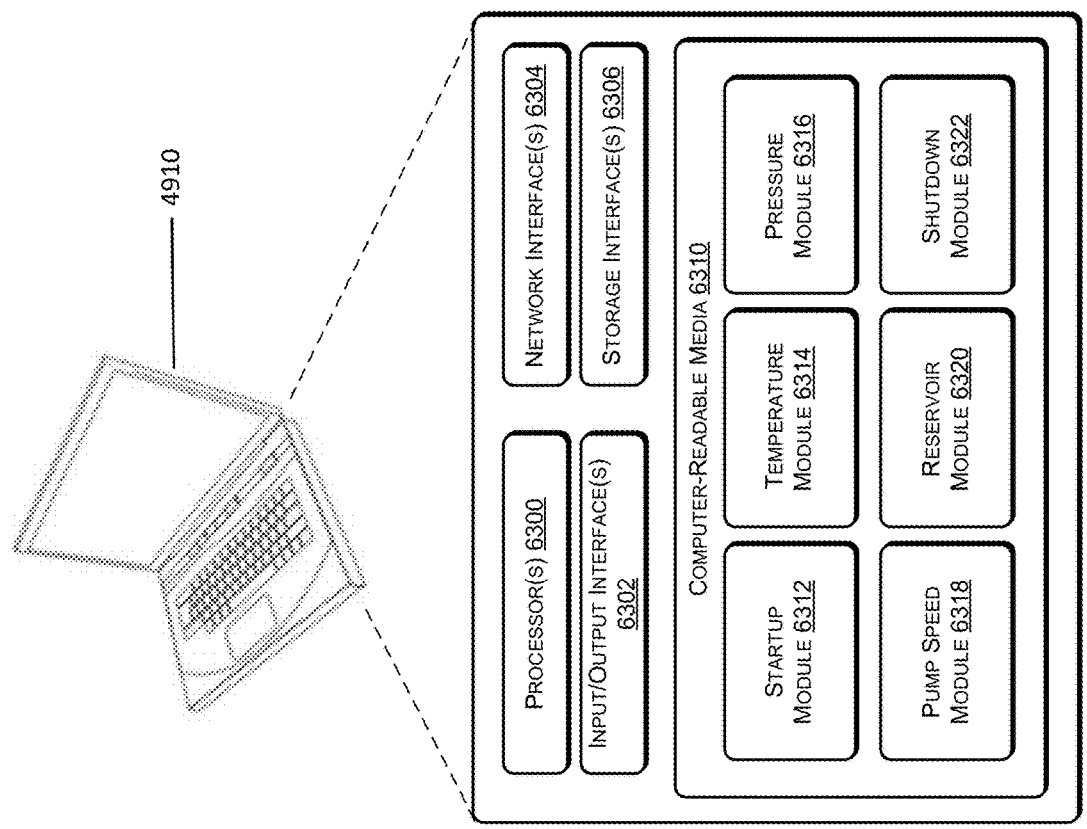
FIG. 63 is a block diagram of an example controller for operating a heat exchanger, according to example embodiments of the disclosure.

FIG. 63 is a block diagram of an example computer 4910 for operating a heat exchanger assembly 4900, according to example embodiments of the disclosure.

The computer 4910 may include one or more processor(s) 6300, one or more input/output (I/O) interface(s) 6302, one or more communication interface(s) 6304, one or more storage interface(s) 6306, and computer-readable media 6310.

In some implementations, the processors(s) 6300 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that may be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 6300 may possess its own local memory, which also may store program modules, program data, and/or one or more operating systems. The one or more processor(s) 6300 may include one or more cores.

The one or more input/output (I/O) interface(s) 6302 may enable the computer 4910 to detect interaction with a user. The I/O interface(s) 6302 may include a combination of hardware, software, and/or firmware and may include software drivers for enabling the operation of any variety of I/O device(s) integrated on the computer 4910 or with which the computer 4910 interacts, such as displays, microphones, speakers, cameras, switches, and any other variety of sensors, or the like.

The network interface(s) 6304 may enable the computer 4910 to communicate via the one or more network(s). The network interface(s) 6304 may include a combination of hardware, software, and/or firmware and may include software drivers for enabling any variety of protocol-based communications, and any variety of wireline and/or wireless ports/antennas. For example, the network interface(s) 6304 may comprise one or more of a cellular radio, a wireless (e.g., IEEE 802.1x-based) interface, a Bluetooth® interface, and the like. In some embodiments, the network interface(s) 6304 may include radio frequency (RF) circuitry that allows the computer 4910 to transition between various standards. The network interface(s) 6304 may further enable the computer 4910 to communicate over circuit-switch domains and/or packet-switch domains.

The storage interface(s) 6306 may enable the processor(s) 6300 to interface and exchange data with the computer-readable medium 6310, as well as any storage device(s) external to the computer 4910. The storage interface(s) 6306 may further enable access to removable media.

The computer-readable media 6310 may include volatile and/or nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, RAID storage systems, or any other medium which can be used to store the desired information and which can be accessed by a computing device. The computer-readable media 6310 may be implemented as computer-readable storage media (CRSM), which may be any available physical media accessible by the processor(s) 6300 to execute instructions stored on the computer-readable media 6310. In one basic implementation, CRSM may include random access memory (RAM) and Flash memory. In other implementations, CRSM may include, but is not limited to, read-only memory (ROM), electrically erasable programmable read-only memory (EEPROM), or any other tangible medium which can be used to store the desired information and which can be accessed by the processor(s) 6300. The computer-readable media 6310 may have an operating system (OS) and/or a variety of suitable applications stored thereon. The OS, when executed by the processor(s) 6300 may enable management of hardware and/or software resources of the computer 4910.

Several modules such as instruction, data stores, and so forth may be stored within the computer-readable media 6310 and configured to execute on the processor(s) 6300. The computer readable media 6310 may have stored thereon a start-up module 6312, a temperature module 6314, a pressure module 6316, a pump speed module 6318, a reservoir module 6320, and a shutdown module 6322. It will be appreciated that each of the modules 6312, 6314, 6316, 6318, 6320, 6322 may have instructions stored thereon that when executed by the processor(s) 6300 may enable various functions pertaining to the operation of the heat exchanger assembly 4900.

The instructions stored in the start-up module 6312, when executed by the processor(s) 6300, may configure the computer 4910 to start-up a thin heat exchanger assembly, when there is primarily air within the heat exchanger. This start-up process may entail starting up with a different pump speed than during steady state operation when there is primarily coolant within the channels of the heat exchanger.

The instructions stored in the temperature module 6314, when executed by the processor(s) 6300, may configure the computer 4910 to adjust pump speed and/or other parameters according to various temperature measurements, such as from various temperature sensors. These temperature measurements may include inlet temperature, outlet temperature, temperature of the heat source, temperature of the reservoir, combinations thereof, or the like. For example, the computer 4910 may be configured to increase the pump speed of coolant through the heat exchanger if the thermal extraction efficiency can be improved by a reduced residence time of coolant within the heat exchanger.

The instructions stored in the pressure module 6316, when executed by the processor(s) 6300, may configure the computer 4910 to modify operating parameters of the heat exchanger assembly based at least in part on pressure measurements, such as pressure measured by various pressure sensors of the heat exchanger assembly. The pressure sensors may indicate an over pressure and/or an under pressure of the heat exchanger, which can lead to an inflation and/or collapse of the heat exchanger. In these cases, the pump speed and/or valves of the heat exchanger assembly may be controlled to maintain pressure of the heat exchanger within a threshold level.

The instructions stored in the pump speed module 6318, when executed by the processor(s) 6300, may configure the computer 4910 to control the pump speed of various pumps, such as a suction pump provided on the outlet manifold of the heat exchanger assembly. The pumps may be controlled according to various data collected from the heat exchanger assembly, such as various temperatures, pressures, or the like. Additionally, the pump speeds may be controlled at startup and shutdown of the heat exchanger assembly, such as in conjunction with processes enabled by the startup module 6312 and/or shutdown module 6322.

The instructions stored in the reservoir module 6320, when executed by the processor(s) 6300, may configure the computer 4910 to manage the coolant reservoir. As the coolant reservoir heats up during operation of the heat exchanger assembly, the pump speed and/or other parameters of the heat exchanger assembly may be modified according to the increased temperature of the coolant in the reservoir. The computer 4910 may also provide an alarm when the coolant temperature rises to a threshold level. For example, if the difference in the temperature between a heat source and the coolant in the reservoir is below a threshold level, then the computer 4910 may indicate that the coolant temperature is at a level where thermal collection may be relatively inefficient.

The instructions stored in the shutdown module 6322, when executed by the processor(s) 6300, may configure the computer 4910 to shutdown a thin heat exchanger assembly, when there is primarily coolant within the heat exchanger during steady state operation. This shutdown process may entail operating with a different pump speed than during steady state operation when there is air within the channels of the heat exchanger during shutdown. Additionally, values may be controlled to prevent coolant uptake into the heat exchanger.

The illustrated aspects of the claimed subject matter may also be practiced in distributed computing environments where certain tasks are performed by remote processing devices that are linked through a communications network. In a distributed computing environment, program modules can be located in both local and remote memory storage devices.

Figure 64:
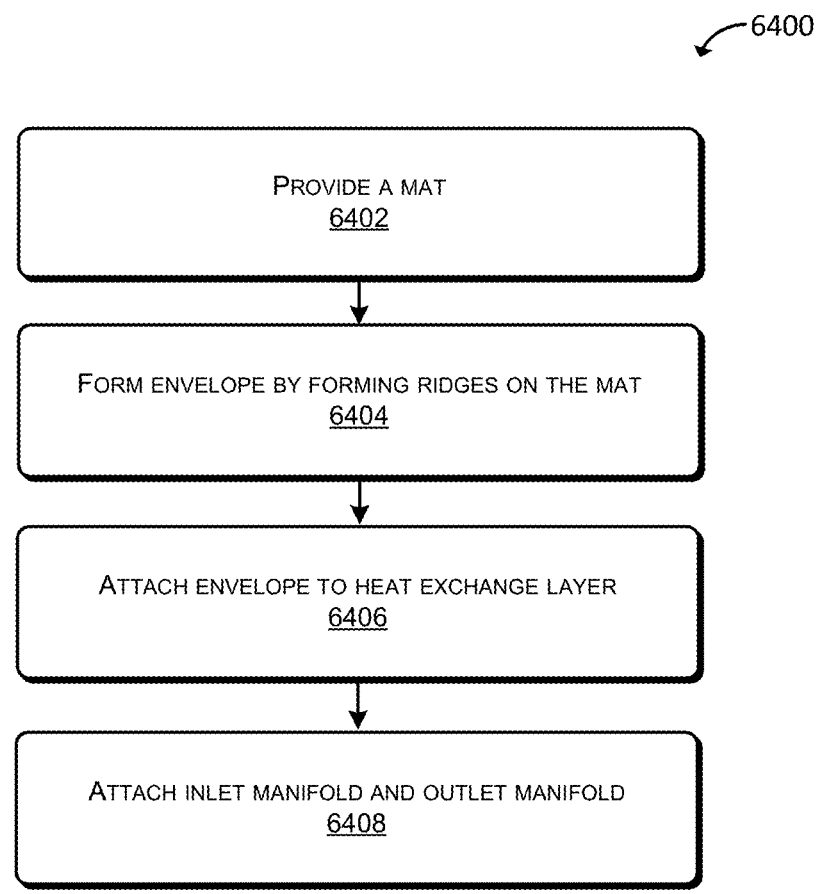
FIG. 64 is a flow diagram of an example method for forming the heat exchanger of FIG. 1, according to example embodiments of the disclosure.

FIG. 64 is a flow diagram of an example method 6400 for forming the heat exchanger 100 of FIG. 1, according to example embodiments of the disclosure.

At block 6402, a mat may be provided. This mat may be constructed of rubber or other relatively compliant materials. In other cases, the mat may be any suitable substrate, including, for example, plastic, glass, metals, or combinations thereof.

At block 6404, an envelope may be formed by forming ridges on the mat. In some cases, there may be two ridges on two edges of the mat. In other cases, there may be more than two ridges formed on the mat. The mat with the ridges thereon may form the envelope of the heat exchanger. The ridges may be formed by any suitable mechanism, including removal processes, such as embossing, cutting, grinding, chiseling, combination thereof, or the like, or by additive processing, such as attaching ridges by epoxy, glue, or stenciled deposition and cure of epoxy. The ridges may extend from one edge of the mat to another edge of the mat. The ridges may be substantially parallel to each other on the mat. In some alternative cases, the envelope may be formed in an integrated fashion, such as by an extrusion process, molding process, combination thereof, or the like.

In some optional cases, the ridges and/or the mat defining the channels of the heat exchanger may be coated with another material. In some cases, the ridges and/or mat may be coated with a material that is hydrophobic, such as PTFE, to reduce fluidic friction within the channels. In other cases, the ridges and/or mat may be coated with hydrophilic materials to increase residence time of coolant fluids within the channels. In yet other cases, the ridges and/or mat may be coated with relatively high thermal conductivity materials, such as metal, to provide improved and/or parallel thermal pathways between a heat source and the coolant within the channels.

At block 6406, the envelope may be attached to a heat exchange layer. This may involve aligning the heat exchange layer to the envelope, such as by a robot, or visually. The attachment may be performed by any suitable mechanism, including, but not limited to epoxy, glue, adhesive tape, welding, thermosonic welding, glass-frit, combinations thereof, or the like. The heat exchange layer may be formed as a flat piece of material that has substantially the same shape and area as the envelope. The heat exchange layer may be formed from any suitable material, such as a material with relatively high thermal conductivity, such as metal. In some cases, the heat exchange layer may itself be a thermal source, such as a backside of a solar cell, or the surface of an engine block.

At block 6406, the inlet manifold and outlet manifold may be attached to form the heat exchanger. The inlet manifold and outlet manifold may be attached by any suitable mechanism, such as epoxy, welding, glue, or the like. In some cases, the inlet manifold and the outlet manifold may be constructed of materials with relatively low thermal conductivity, such as plastics, so that thermal energy from the heat source can be efficiently transported to the coolant reservoir with relatively small thermal losses during coolant transport through the inlet manifold and/or the outlet manifold.

Figure 65:
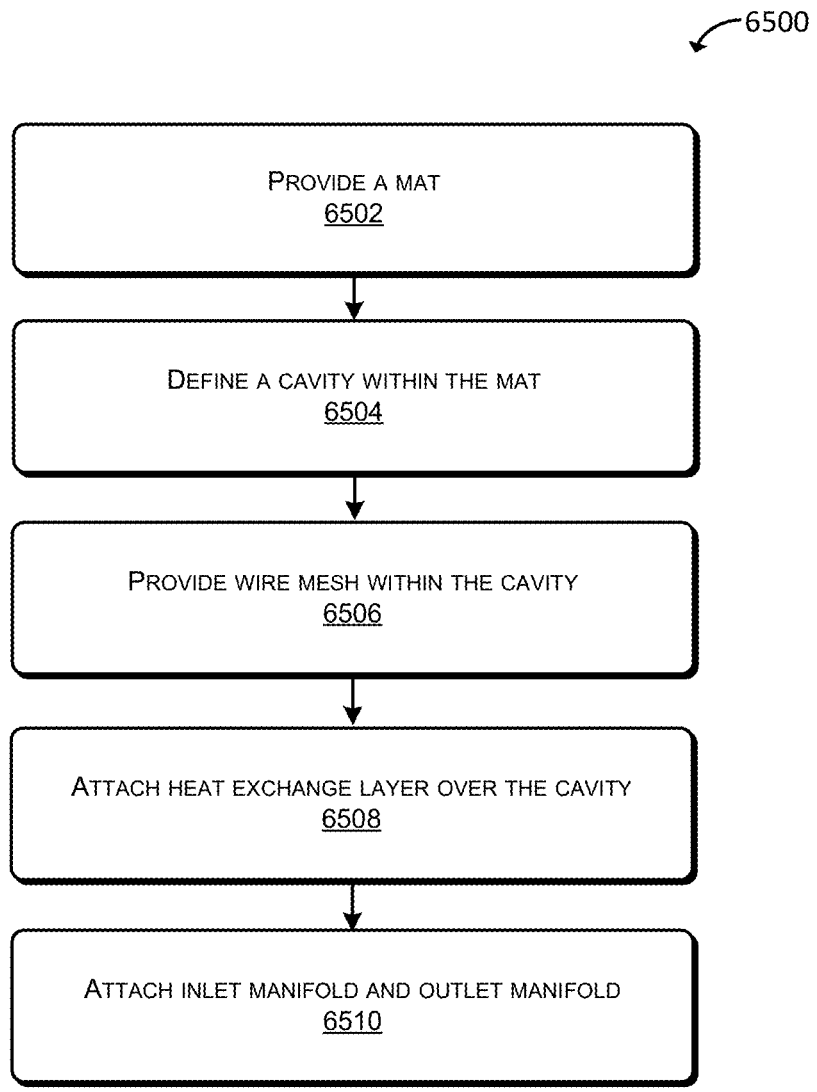
FIG. 65 is a flow diagram of an example method for forming the heat exchanger of FIG. 6, according to example embodiments of the disclosure.

FIG. 65 is a flow diagram of an example method 6500 for forming the heat exchanger 600 of FIG. 6, according to example embodiments of the disclosure.

At block 6502, a mat may be provided. This mat may be constructed of rubber or other relatively compliant materials. In other cases, the mat may be any suitable substrate, including, for example, plastic, glass, metals, or combinations thereof.

At block 6504, a cavity may be defined within the mat. In some cases, there may be two ridges proximal to two edges, but not along the other two edges, of the mat constructed to provide the cavity between the ridges. The ridges may be formed by any suitable mechanism, including removal processes, such as embossing, cutting, grinding, chiseling, combination thereof, or the like, or by additive processing, such as attaching ridges by epoxy, glue, or stenciled deposition and cure of epoxy. The ridges may extend from one edge of the mat to another edge of the mat. The ridges may be substantially parallel to each other on the mat. In some alternative cases, the cavity may be formed in an integrated fashion, such as by an extrusion process, molding process, combination thereof, or the like.

In some optional cases, the ridges and/or the mat defining the cavity of the heat exchanger may be coated with another material. In some cases, the ridges and/or mat may be coated with a material that is hydrophobic, such as PTFE, to reduce fluidic friction within the channels. In other cases, the ridges and/or mat may be coated with hydrophilic materials to increase residence time of coolant fluids within the channels. In yet other cases, the ridges and/or mat may be coated with relatively high thermal conductivity materials, such as metal, to provide improved and/or parallel thermal pathways between a heat source and the coolant within the channels.

At block 6506, the wire mesh may be provided within the cavity. The wire mesh may be of any suitable fineness and density within the cavity. For example, in some cases, the wire mesh may be of a fineness if chicken wire. In other cases, the fineness and density of the wire mesh may be that of steel wool. The wire mesh may be of any suitable material, such as, for example, steel, aluminum, copper, or the like.

At block 6508, a heat exchange layer may be attached. This may involve aligning the heat exchange layer to the envelope with the cavity, such as by a robot, or visually. The attachment may be performed by any suitable mechanism, including, but not limited to epoxy, glue, adhesive tape, welding, thermosonic welding, glass-frit, combinations thereof, or the like. The heat exchange layer may be formed as a flat piece of material that has substantially the same shape and area as the envelope. The heat exchange layer may be formed from any suitable material, such as a material with relatively high thermal conductivity, such as metal. In some cases, the heat exchange layer may itself be a thermal source, such as a backside of a solar cell, or the surface of an engine block.

At block 6510, the inlet manifold and outlet manifold may be attached to form the heat exchanger. The inlet manifold and outlet manifold may be attached by any suitable mechanism, such as epoxy, welding, glue, or the like. In some cases, the inlet manifold and the outlet manifold may be constructed of materials with relatively low thermal conductivity, such as plastics, so that thermal energy from the heat source can be efficiently transported to the coolant reservoir with relatively small thermal losses during coolant transport through the inlet manifold and/or the outlet manifold.

Figure 66:
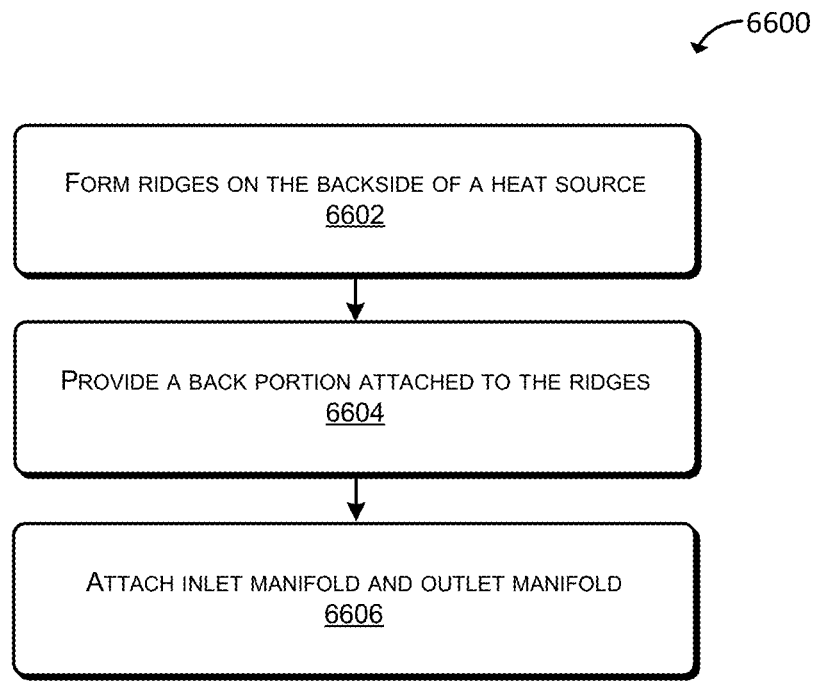
FIG. 66 is a flow diagram of an example method for forming an integrated heat exchanger on a heat source, according to example embodiments of the disclosure.

FIG. 66 is a flow diagram of an example method 6600 for forming an integrated heat exchanger on a heat source, according to example embodiments of the disclosure.

At block 6602, ridges may be formed on the backside of a heat source. The heat source may be any suitable heat source, such as a backside of a solar cell, or the surface of an engine block. The ridges may be formed by any suitable mechanism, such as attaching ridges by epoxy, glue, or stenciled deposition and cure of epoxy.

At block 6604, a back portion may be attached to the ridges. This back portion may be a mat or any other flat piece of material. The attachment may via any suitable mechanism, such as by use of glue or epoxy after aligning the mat onto the ridges.

At block 6606, the inlet manifold and outlet manifold may be attached to form the heat exchanger. The inlet manifold and outlet manifold may be attached by any suitable mechanism, such as epoxy, welding, glue, or the like. In some cases, the inlet manifold and the outlet manifold may be constructed of materials with relatively low thermal conductivity, such as plastics, so that thermal energy from the heat source can be efficiently transported to the coolant reservoir with relatively small thermal losses during coolant transport through the inlet manifold and/or the outlet manifold.

The subject matter described above is provided by way of illustration only and should not be construed as limiting. Various modifications and changes can be made to the subject matter described herein without following the example configurations and applications illustrated and described, and without departing from the true spirit and scope of the present invention.

What is claimed is:

1. A heat collection system, comprising:
   a rubber envelope comprising at least two ridges, defining one or more channels, the at least two ridges extending from a first edge of the rubber envelope to a second edge of the envelope;
   a photovoltaic panel disposed over the rubber envelope and contacting the at least two ridges, the rubber envelope joined to the photovoltaic panel using epoxy;
   an inlet manifold attached to the first edge of the rubber envelope and fluidically coupled to the one or more channels; and
   an outlet manifold attached to the second edge of the envelope and fluidically coupled to the one or more channels, wherein the outlet manifold is configured to be fluidically connected to a suction pump such that liquid is suctioned out of the outlet manifold.

2. The heat collection system of claim 1, further comprising:
   the suction pump fluidically coupled to the outlet manifold and configured to draw the liquid out of the one or more channels.

3. A heat collection system of claim 2, further comprising:
   a coolant reservoir, wherein the suction pump is configured to conduct the fluid liquid to the coolant reservoir.

4. A heat collection system of claim 2, further comprising:
   a computer configured to control a pump speed of the suction pump.

5. A heat collection system of claim 4, further comprising:
one or more sensors, wherein the computer is configured to control the pump speed of the suction pump based at least in part on data collected using the one or more sensors.

6. The heat collection system of claim 1, further comprising:
metal mesh disposed in the one or more channels.

7. The heat collection system of claim 1, wherein the photovoltaic panel comprises a photosensitive side and a substrate side opposing the photosensitive side, wherein the at least two ridges contact the substrate side.

8. The heat collection system of claim 1, wherein the envelope is coated with one or more hydrophobic materials.

9. A method, comprising:
providing a mat;
forming at least two ridges, the at least two ridges defining one or more channels, the at least two ridges extending from a first edge of a rubber envelope to a second edge of the envelope;
attaching a photovoltaic panel over the rubber envelope and contacting the at least two ridges using epoxy;
attaching an inlet manifold to the first edge of the envelope and fluidically coupled to the one or more channels; and
attaching an outlet manifold to the second edge of the envelope and fluidically coupled to the one or more channels, wherein the outlet manifold is configured to be fluidically connected to a suction pump such that fluid is suctioned out of the outlet manifold.

10. The method of claim 9, wherein the photovoltaic panel comprises a photosensitive side and a substrate side opposing the photosensitive side, wherein the at least two ridges contact the substrate side.

11. The method of claim 10, wherein the substrate side of the photovoltaic panel retains the fluid within the one or more channels.

12. The method of claim 9, further comprising:
depositing a hydrophobic layer over at least a portion of the one or more channels.

13. The method of claim 9, further comprising:
depositing a hydrophobic layer over at least a portion of the one or more channels.

14. The method of claim 9, further comprising:
fluidically attaching the outlet manifold to the suction pump; and
fluidically attaching the inlet manifold to a coolant reservoir.

15. The method of claim 14, further comprising:
providing a computer configured to control a pump speed of the suction pump.

16. The method of claim 9, further comprising:
providing a wire mesh between the at least two ridges.

17. A photovoltaic panel, comprising:
a first side and a second side opposing the first side;
one or more ridges protruding from the second side;
a mat attached to the one or more ridges to define one or more channels between the second side, the one or more ridges, and the mat, the mat having a first edge and a second edge, epoxy disposed between the mat and the one or more ridges;
an inlet manifold connected to the first edge; and
an outlet manifold connected to the second edge, wherein the outlet manifold is configured to be fluidically connected to a suction pump such that fluid is suctioned out of the outlet manifold.

18. The photovoltaic panel of claim 16, further comprising a hydrophobic layer provided over at least a portion of the one or more ridges.

19. The photovoltaic panel of claim 16, further comprising a wire mesh provided between a first ridge of the one or more ridges and a second ridge of the one or more ridges.

20. The photovoltaic panel of claim 16, further comprising the suction pump fluidically coupled to the outlet manifold.

* * * * *